United States Patent
Shinohara et al.

(10) Patent No.: US 9,166,041 B2
(45) Date of Patent: Oct. 20, 2015

(54) SEMICONDUCTOR DEVICE AND METHOD OF MANUFACTURING THE SAME

(71) Applicant: RENESAS ELECTRONICS CORPORATION, Kanagawa (JP)

(72) Inventors: Hirofumi Shinohara, Kanagawa (JP); Hidekazu Oda, Kanagawa (JP); Toshiaki Iwamatsu, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/459,999

(22) Filed: Aug. 14, 2014

(65) Prior Publication Data

US 2015/0061006 A1   Mar. 5, 2015

(30) Foreign Application Priority Data

Sep. 5, 2013   (JP) .................................. 2013-184502

(51) Int. Cl.
| | |
|---|---|
| H01L 29/78 | (2006.01) |
| H01L 29/66 | (2006.01) |
| H01L 29/06 | (2006.01) |
| H01L 21/762 | (2006.01) |
| H01L 27/12 | (2006.01) |
| H01L 21/84 | (2006.01) |

(52) U.S. Cl.
CPC ...... *H01L 29/7824* (2013.01); *H01L 21/76264* (2013.01); *H01L 21/84* (2013.01); *H01L 27/1203* (2013.01); *H01L 29/0653* (2013.01); *H01L 29/66598* (2013.01); *H01L 29/66681* (2013.01); *H01L 29/7835* (2013.01)

(58) Field of Classification Search
None
See application file for complete search history.

(56) References Cited

U.S. PATENT DOCUMENTS

| | | | |
|---|---|---|---|
| 6,215,155 B1 | 4/2001 | Wollesen | |
| 2009/0134468 A1 | 5/2009 | Tsuchiya et al. | |
| 2010/0258872 A1* | 10/2010 | Sugii et al. | 257/350 |
| 2011/0031552 A1 | 2/2011 | Iwamatsu et al. | |
| 2012/0261792 A1* | 10/2012 | Cheng et al. | 257/510 |

FOREIGN PATENT DOCUMENTS

| | | |
|---|---|---|
| JP | 2001-527293 A | 12/2001 |
| JP | 2009-135140 A | 6/2009 |
| JP | 2011-040458 A | 2/2011 |

* cited by examiner

*Primary Examiner* — Erik Kielin
(74) *Attorney, Agent, or Firm* — McDermott Will & Emery LLP

(57) ABSTRACT

In an SOI substrate having a semiconductor layer formed on the semiconductor substrate via an insulating layer, a MISFET is formed in each of the semiconductor layer in an nMIS formation region and a pMIS formation region. In power feeding regions, the semiconductor layer and the insulating layer are removed. In the semiconductor substrate, a p-type semiconductor region is formed so as to include the nMIS formation region and one of the power feeding regions, and an n-type semiconductor region is formed so as to include a pMIS formation region and the other one of the power feeding regions. In the semiconductor substrate, a p-type well having lower impurity concentration than the p-type semiconductor region is formed so as to contain the p-type semiconductor region, and an n-type well having lower impurity concentration than the n-type semiconductor region is formed so as to contain the n-type semiconductor region.

19 Claims, 46 Drawing Sheets

SEMICONDUCTOR DEVICE AND METHOD OF MANUFACTURING THE SAME

CROSS-REFERENCE TO RELATED APPLICATION

The present application claims priority from Japanese Patent Application No. 2013-184502 filed on Sep. 5, 2013, the content of which is hereby incorporated by reference into this application.

TECHNICAL FIELD

The present invention relates to a semiconductor device and a method of manufacturing the same. For example, the present invention can be suitably used for a semiconductor device having a MISFET and a method of using the same.

BACKGROUND

There is a technology of manufacturing a semiconductor device by using an SOI (Silicon On Insulator) substrate. In the SOI substrate, a semiconductor layer is formed on a supporting substrate via an insulating layer. In a semiconductor layer of this SOI substrate, a MISFET (Metal Insulator Semiconductor Field Effect Transistor) and others are formed.

Technologies regarding the semiconductor device using the SOI substrate are described in Japanese Patent Application Laid-Open Publication Nos. 2011-40458 (Patent Document 1) and 2009-135140 (Patent Document 2) and Japanese Patent Application Laid-Open Publication (Translation of International Patent Application) No. 2001-527293 (Patent Document 3).

SUMMARY

It is desired to improve the performance as much as possible also in a semiconductor device with a MISFET formed on an SOI substrate.

The other problems and novel characteristics of the present invention will be apparent from the description of the present specification and the accompanying drawings.

According to an embodiment, a semiconductor device includes: a first active region and a second active region formed of a semiconductor layer formed on the semiconductor substrate via an insulating layer, the first active region and the second active region each being surrounded when seen in a plan view by a device isolation region penetrating through the semiconductor layer and the insulating layer; and a first region and a second region each surrounded when seen in a plan view by the device isolation region and having the semiconductor layer and the insulating layer removed therefrom. A first MISFET is formed in the first active region. A second MISFET is formed in the second active region. A first semiconductor region of a first conductivity type is formed in the semiconductor substrate so as to include the first active region and the first region when seen in a plan view. A second semiconductor region of the first conductivity type is formed in the semiconductor substrate so as to include the first active region and the first region when seen in a plan view and having impurity concentration higher than that of the first semiconductor region. The second semiconductor region is contained in the first semiconductor region. The second semiconductor region has a bottom surface at a shallower level than a bottom surface of the first semiconductor region and at a deeper level than a bottom surface of a portion of the device isolation region interposed between the first active region and the first region when seen in a plan view. A third semiconductor region of a second conductivity type that is different from the first conductivity type is formed in the semiconductor substrate so as to include the second active region and the second region when seen in a plan view. A fourth semiconductor region of the second conductivity type is formed in the semiconductor substrate so as to include the second active region and the second region when seen in a plan view and having impurity concentration higher than that of the third semiconductor region. The fourth semiconductor region is contained in the third semiconductor region. The fourth semiconductor region has a bottom surface at a shallower level than a bottom surface of the third semiconductor region and at a deeper level than a bottom surface of a portion of the device isolation region interposed between the second active region and the second region when seen in a plan view.

In addition, according to an embodiment, in a method of manufacturing a semiconductor device, on a substrate on which a semiconductor layer formed on the insulating layer is formed, a device isolation region penetrating through the semiconductor layer and the insulating layer is formed. Accordingly, the first region, the second region, the third region, and the fourth region are each surrounded by the device isolation region when seen in a plan view. After forming the device isolation region, a first semiconductor region and a second semiconductor region of a first conductivity type and a third semiconductor region and a fourth semiconductor region of a second conductivity type are formed in the semiconductor substrate. Then, after forming the device isolation region, the semiconductor layer and the insulating layer on the semiconductor substrate in the first region and the second region are removed. Then, a first MISFET is formed in the semiconductor layer that is remaining via the insulating layer on the semiconductor substrate in the third region. A second MISFET is formed in the semiconductor layer that is remaining via the insulating layer on the semiconductor substrate in the fourth region. The second semiconductor region has impurity concentration higher than that of the first semiconductor region, is contained in the first semiconductor region, and has a bottom surface at a deeper level than a bottom surface of a portion of the device isolation region interposed between the first region and the third region when seen in a plan view. The fourth semiconductor region has impurity concentration higher than impurity concentration of the third semiconductor region, is contained in the third semiconductor region, and has a bottom surface at a deeper level than a bottom surface of a portion of the device isolation region interposed between the second region and the fourth region when seen in a plan view.

According to an embodiment, the performance of the semiconductor device can be improved.

BRIEF DESCRIPTIONS OF THE DRAWINGS

DETAILED DESCRIPTION

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, components having the same function are denoted by the same reference symbols throughout the drawings for describing the embodiments, and a repetitive description thereof is omitted. In addition, the description of the same or similar portions is not repeated in principle unless particularly required in the following embodiments.

Also, in some drawings used in the embodiments, hatching is used even in a cross-sectional view so as to make the drawings easy to see. Moreover, in some drawings used in the embodiments, hatching is used even in a plan view so as to make the drawings easy to see.

First Embodiment

<Regarding Structure of Semiconductor Device>

Figure 1:
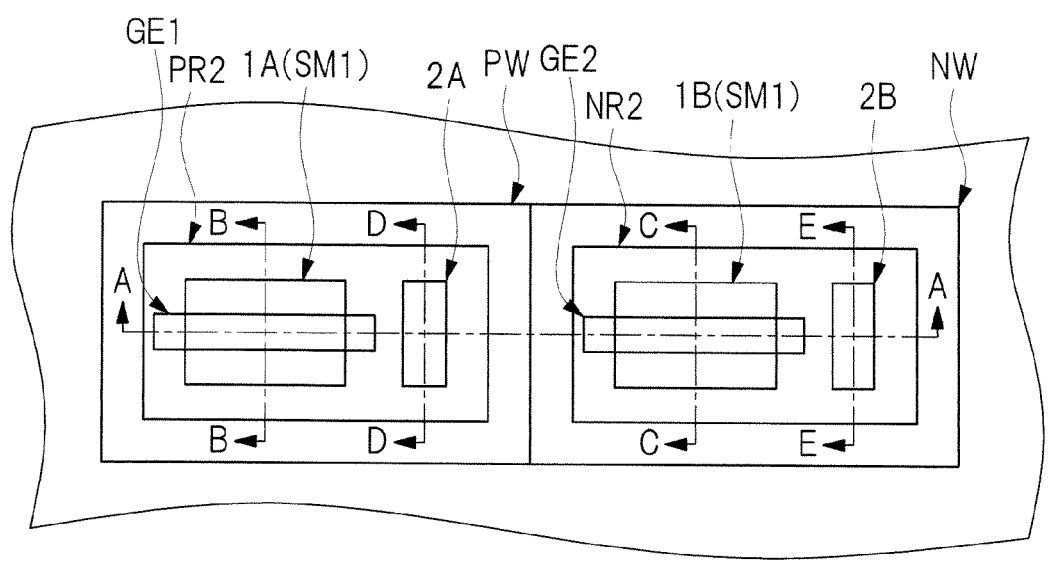
FIG. 1 is a plan view of main parts of a semiconductor device according to an embodiment.
Figure 2:
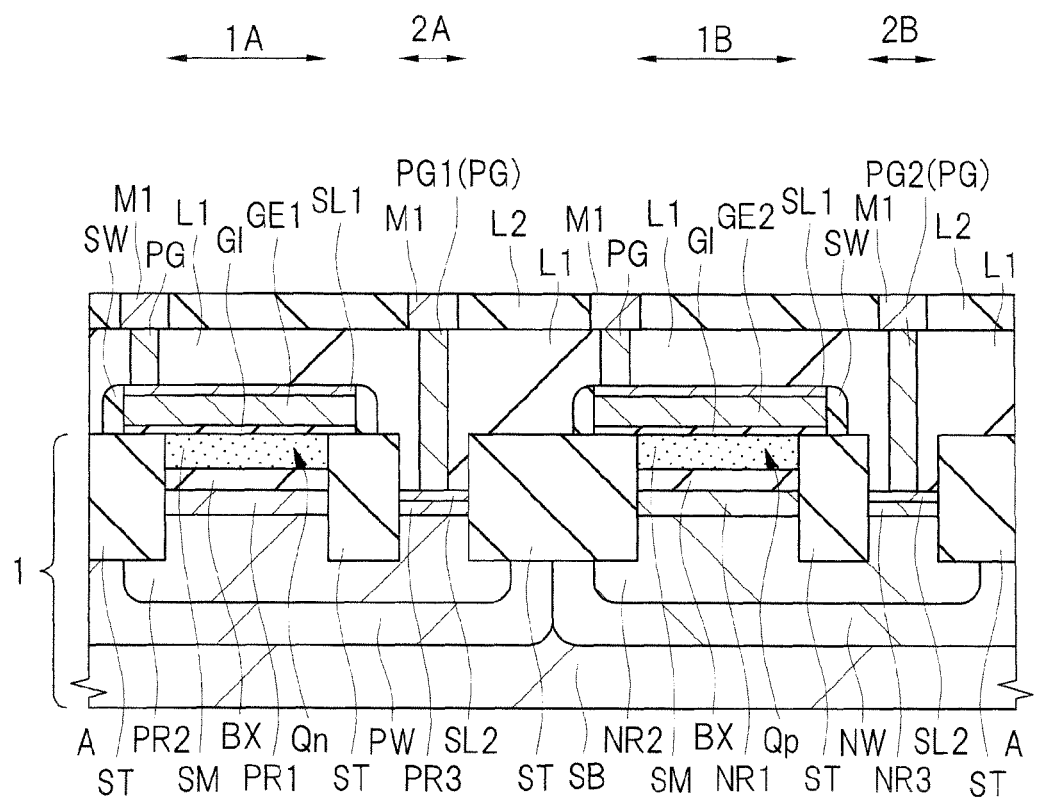
FIG. 2 is a cross-sectional view of main parts of the semiconductor device according to the embodiment.
Figure 3:
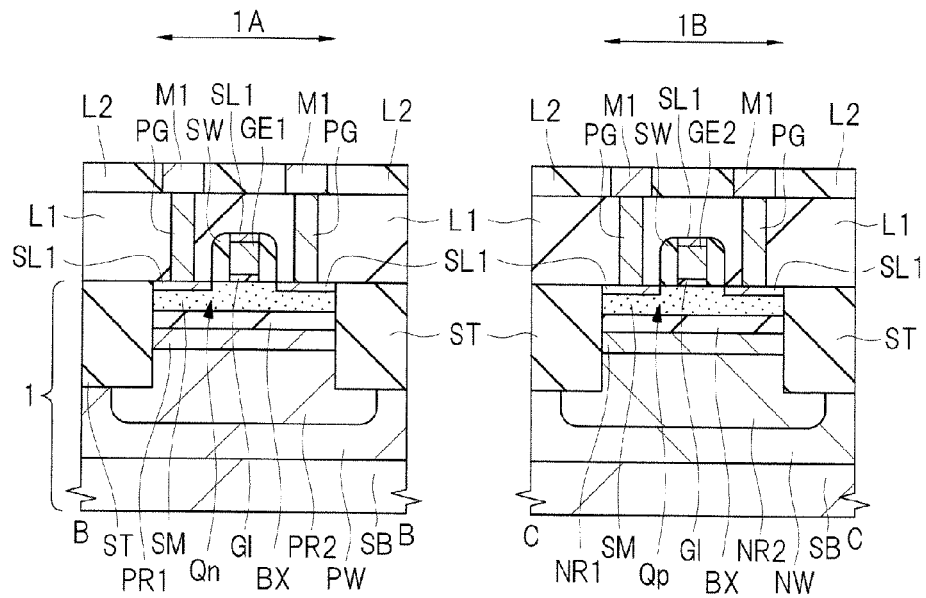
FIG. 3 is a cross-sectional view of main parts of the semiconductor device according to the embodiment.

A semiconductor device of the present embodiment is described with reference to the drawings. FIG. 1 is a plan view of main parts of a semiconductor device of the present embodiment, and FIG. 2 to FIG. 5 are cross-sectional views of main parts of the semiconductor device of the present embodiment. FIG. 2 roughly corresponds to a cross-sectional view along an A-A line of FIG. 1. FIG. 3 illustrates two cross-sectional views, the cross-sectional view on the left side of FIG. 3 roughly corresponding to a cross-sectional view along a B-B line of FIG. 1 and the cross-sectional view of the right side of FIG. 3 roughly corresponding to a cross-sectional view along a C-C line of FIG. 1. FIG. 5 illustrates two cross-sectional views, the cross-sectional view on the left side of FIG. 5 roughly corresponding to a cross-sectional view along a D-D line of FIG. 1 and the cross-sectional view on the right side of FIG. 5 roughly corresponding to a cross-sectional view along an E-E line of FIG. 1.

Figure 4:
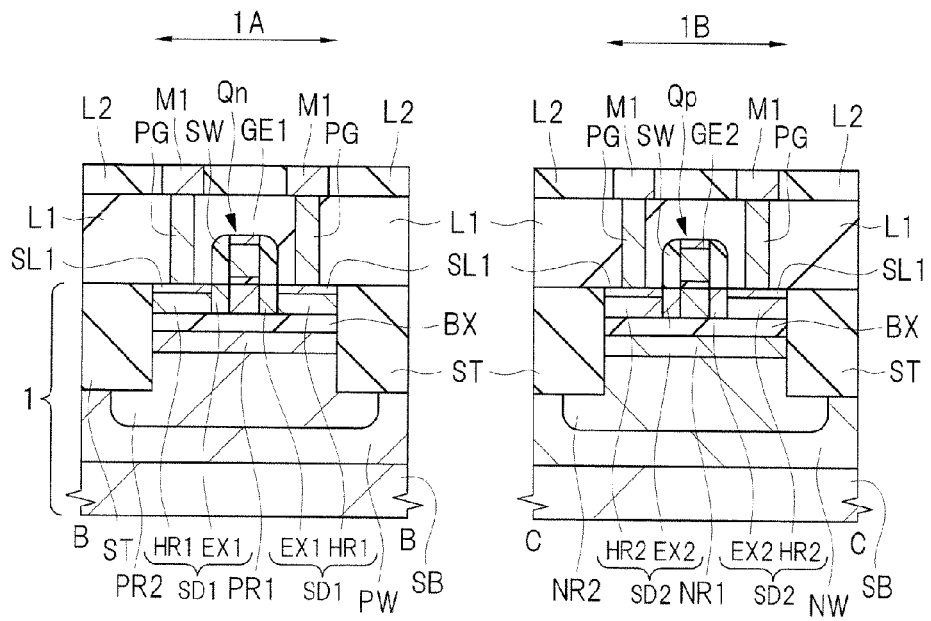
FIG. 4 is a cross-sectional view of main parts of the semiconductor device according to the embodiment.
Figure 5:
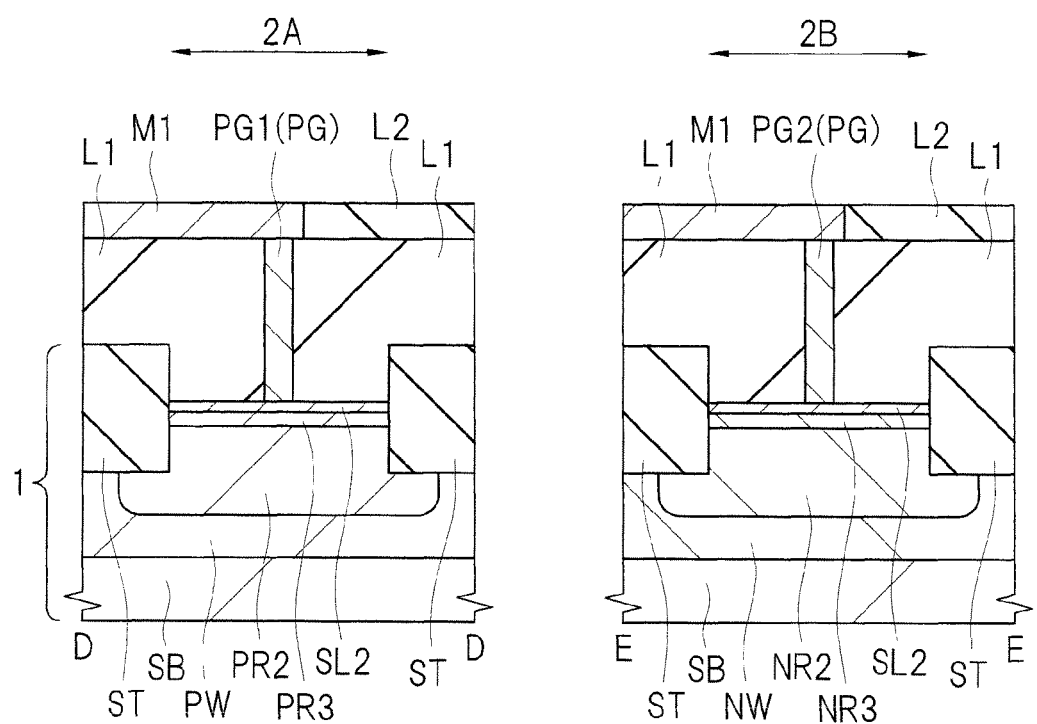
FIG. 5 is a cross-sectional view of main parts of the semiconductor device according to the embodiment.

Also, FIG. 4 illustrates cross-sectional views of regions identical to that of FIG. 3, the cross-sectional view on the left side of FIG. 4 roughly corresponding to the cross-sectional view along the B-B line of FIG. 1 and the cross-sectional view on the right side of FIG. 4 roughly corresponding to the cross-sectional view along the C-C line of FIG. 1. However, in FIG. 3, an entire semiconductor layer SM is hatched with dots for easy understanding in which region the semiconductor layer SM resides, and formation regions of an $n^-$-type semiconductor region EX1, an $n^+$-type semiconductor region HR1, a $p^-$-type semiconductor region EX2, and a $p^+$-type semiconductor region HR2 are not illustrated. Also in FIG. 4, the $n^-$-type semiconductor region EX1, the $n^+$-type semiconductor region HR1, the $p^-$-type semiconductor region EX2, and the $p^+$-type semiconductor region HR2 are diagonally hatched so as to easily understand which regions the $n^-$-type semiconductor region EX1, the $n^+$-type semiconductor region HR1, the $p^-$-type semiconductor region EX2, and the $p^+$-type semiconductor region HR2 respectively reside. Therefore, when FIG. 3 and FIG. 4 are viewed in combination, the structure of the semiconductor layer SM and the formation regions of the $n^-$-type semiconductor region EX1, the $n^+$-type semiconductor region HR1, the $p^-$-type semiconductor region EX2, and the $p^+$-type semiconductor region HR2 in the semiconductor layer SM can be easily understood.

The semiconductor device of the present embodiment illustrated in FIG. 1 to FIG. 5 is a semiconductor device including an n-channel-type MISFET Qn and a p-channel-type MISFET Qp as MISFETs (Metal Insulator Semiconductor Field Effect Transistors).

Also, the semiconductor device of the present embodiment illustrated in FIG. 1 to FIG. 5 is a semiconductor device using an SOI (Silicon On Insulator) substrate 1.

The SOI substrate 1 has a semiconductor substrate (supporting substrate) SB, an insulating layer (buried insulating film) BX formed on a main surface of the semiconductor substrate SB, and a semiconductor layer SM formed on an upper surface of the insulating layer BX. The semiconductor substrate SB is a supporting substrate supporting the insulating layer BX and structures thereabove. With the semiconductor substrate SB, insulating layer BX, and semiconductor layer SM, the SOI substrate 1 is formed. On a main surface of the SOI substrate 1, the MISFET Qn, which is an n-channel-type MISFET, and the MISFET Qp, which is a p-channel-type MISFET, are formed.

The semiconductor substrate SB is made of monocrystalline silicon or the like. The insulating layer BX is made of silicon oxide, for example. When the insulating layer BX is a silicon oxide film, the insulating layer BX can be regarded as a buried oxide film, that is, a BOX film. The semiconductor layer SM is made of monocrystalline silicon or the like. The semiconductor layer SM can be regarded as an SOI film.

In the SOI substrate 1, a device isolation region (device isolation structure) ST is formed. This device isolation region ST is formed of an insulating film (for example, a silicon oxide film) buried in a device isolation trench (a trench for device isolation). The device isolation trench and the device isolation region ST filling therein penetrate through the semiconductor layer and the insulating layer BX, with their bottom part reaching partway the thickness of the semiconductor substrate SB and a lower part of the device isolation region ST being positioned in the semiconductor substrate SB. That is, the device isolation region ST is in the state of being buried in the device isolation trench formed over the semiconductor layer SM, the insulating layer BX, and the semiconductor substrate SB. Therefore, the bottom surface (lower surface) of the device isolation region ST is positioned partway the thickness of the semiconductor substrate SB. That is, the device isolation region ST is positioned lower than a lower surface of the insulating layer BX.

The SOI substrate 1 of the present embodiment has an nMIS formation region 1A where the n-channel-type MISFET Qn is formed, a pMIS formation region 1B where the p-channel-type MISFET Qp is formed, a power feeding region 2A for feeding electric power to the semiconductor substrate SB in the nMIS formation region 1A, and a power feeding region 2B for feeding electric power to the semiconductor substrate SB in the pMIS formation region 1B. These 1A, 1B, 2A, and 2B are regions when seen in a plan view (planar regions). The nMIS formation region 1A, the pMIS formation region 1B, the power feeding region 2A, and the power feeding region 2B are each separated from each other by the device isolation region ST. That is, in the plan view, the nMIS formation region 1A, the pMIS formation region 1B, the power feeding region 2A, and the power feeding region 2B are each surrounded therearound by the device isolation region ST. Therefore, the nMIS formation region 1A, the pMIS formation region 1B, the power feeding region 2A, and the power feeding region 2B are each regarded as an active region surrounded by the device isolation region ST. Also, in the plan view, the power feeding region 2A and the nMIS formation region 1A are adjacent to each other via the device isolation region ST therebetween. Furthermore, in the plan view, the power feeding region 2B and the pMIS formation region 1B are adjacent to each other via the device isolation region ST therebetween.

The n-channel-type MISFET Qn is formed in the semiconductor layer SM of the nMIS formation region 1A, and the p-channel-type MISFET Qp is formed in the semiconductor layer SM of the pMIS formation region 1B. In the SOI substrate 1, the semiconductor layer SM of the nMIS formation region 1A and the semiconductor layer SM of the pMIS formation region 1B are separated from each other as being each surrounded by the device isolation region ST when seen in a plan view. That is, the semiconductor layer SM of the nMIS formation region 1A has its side surfaces in contact with the device isolation region ST and its bottom surface in contact with the insulating layer BX, thereby being in the state of being surrounded by the insulating layer BX and the device isolation region ST. Also, the semiconductor layer SM of the pMIS formation region 1B has its side surfaces in contact with the device isolation region ST and its bottom surface in contact with the insulating layer BX, thereby being in the state of being surrounded by the insulating layer BX and the device isolation region ST. Therefore, the semiconductor layer SM of the nMIS formation region 1A and the semiconductor layer SM of the pMIS formation region 1B are not connected to each other, and are separated by the device isolation region ST.

The n-channel-type MISFET Qn is fog led on a main front surface of the semiconductor layer SM of the nMIS formation region 1A. This n-channel-type MISFET Qn has a gate electrode GE1 formed via a gate insulating film GI on the semiconductor layer SM of the nMIS formation region 1A and a source-drain region SD1 formed in the semiconductor layer SM on both sides (both sides in a gate length direction) of the gate electrode GE1. The semiconductor layer SM straight under the gate electrode GE1 is a region where the channel of the n-channel-type MISFET Qn is formed (a channel formation region).

The p-channel-type MISFET Qp is formed on a main front surface of the semiconductor layer SM of the pMIS formation region 1B. This p-channel-type MISFET Qp has a gate electrode GE2 formed via the gate insulating film GI on the semiconductor layer SM of the pMIS formation region 1B and a source-drain region SD2 formed in the semiconductor layer SM on both sides (both sides in a gate length direction) of the gate electrode GE2. The semiconductor layer SM straight under the gate electrode GE2 is a region where the channel of the p-channel-type MISFET Qp is formed (a channel formation region).

The gate electrodes GE1 and GE2 are formed of a conductive film, and can be formed of a silicon film, for example, such as a polycrystalline silicon film (a polysilicon film or a doped polysilicon film). When the gate electrodes GE1 and GE2 are formed of a silicon film, impurities are introduced to the silicon film so that the silicon film has a low resistance. In another mode, the gate electrodes GE1 and GE2 can be formed of a metal film or a metal compound film showing metal conduction. In this case, the gate electrodes GE1 and GE2 are metal gate electrodes.

The gate electrode GE1 is formed on the semiconductor layer SM of the nMIS formation region 1A via the gate insulating film GI, and extends in a gate width direction (a gate width direction of the gate electrode GE1), and both ends of the gate electrode GE1 in the gate width direction are disposed on the device isolation region ST. Between the gate electrode GE1 and the semiconductor layer SM, the gate insulating film GI intervenes. Note that while FIG. 2 illustrates that the gate insulating film GI intervenes between the gate electrode GE1 and the device isolation film GI, the gate insulating film GI may not intervene between the gate electrode GE1 and the device isolation film GI.

The gate electrode GE2 is formed on the semiconductor layer SM of the pMIS formation region 1B via the gate insulating film GI, and extends in a gate width direction (a gate width direction of the gate electrode GE2), and both ends of the gate electrode GE2 in the gate width direction are disposed on the device isolation region ST. Between the gate electrode GE2 and the semiconductor layer SM, the gate insulating film GI intervenes. Note that while FIG. 2 illustrates that the gate insulating film GI intervenes between the gate electrode GE2 and the device isolation film GI, the gate insulating film GI may not intervene between the gate electrode GE2 and the device isolation film GI.

The gate insulating film GI is formed of, for example, a thin silicon oxide film, but a silicon oxynitride film can also be used. In another mode, a high-permittivity gate insulating film with a permittivity higher than that of silicon nitride (for example, a metal oxide film such as a hafnium oxide film or an aluminum oxide film) can also be used.

On each sidewall of the gate electrodes GE1 and GE2, a sidewall spacer (sidewall or sidewall insulating film) SW is formed. The sidewall spacer SW is formed of an insulating film, and can be regarded as a sidewall insulating film.

The source-drain region SD1 is a semiconductor region for the source or drain of the n-channel-type MISFET Qn. The source-drain regions SD1 are formed on both sides (both sides in a gate length direction) of the gate electrode GE1 in the semiconductor layer SM of the nMIS formation region 1A, one functioning as a source region and the other functioning as a drain region. The source-drain region SD2 is a semiconductor region for the source or drain of the p-channel-type MISFET Qp. The source-drain regions SD2 are formed on both sides (both sides in a gate length direction) of the gate electrode GE2 in the semiconductor layer SM of the pMIS formation region 1B, one functioning as a source region and the other functioning as a drain region.

Each source-drain region SD1 includes an LDD (Lightly Doped Drain) structure, and has an $n^-$-type semiconductor region (extension region or LDD region) EX1 with low impurity concentration and an $n^+$-type semiconductor region HR1 having impurity concentration higher than that of the $n^-$-type semiconductor region EX1. That is, in the semiconductor layer SM of the nMIS formation region 1A, the if-type semiconductor region EX1 is formed in regions separated apart from each other across the channel formation region, and the $n^+$-type semiconductor region HR1 having impurity concentration higher than that of the $n^-$-type semiconductor region EX1 is funned outside the $n^-$-type semiconductor region EX1 (on a side away from the channel formation region). Therefore, the $n^-$-type semiconductor region EX1 is adjacent to the channel formation region, and the $n^+$-type semiconductor region HR1 is formed away from the channel formation region by the $n^-$-type semiconductor region EX1 and at a position adjacent to the $n^-$-type semiconductor region EX1. The $n^-$-type semiconductor region EX1 is formed in a self-aligning manner with respect to the gate electrode GE1, and the $n^+$-type semiconductor region HR1 is formed in a self-aligning manner with respect to a compound formed of the gate electrode GE1 and its sidewall spacer SW on its sidewall.

Each source-drain region SD2 includes an LDD (Lightly Doped Drain) structure, and has a $p^-$-type semiconductor region (extension region or LDD region) EX2 with low impurity concentration and an $n^+$-type semiconductor region HR2 having impurity concentration higher than that of the $p^-$-type semiconductor region EX2. That is, in the semiconductor layer SM of the pMIS formation region 1B, the $p^-$-type semiconductor region EX2 is formed in regions separated apart from each other across the channel formation region, and the $p^+$-type semiconductor region HR2 having impurity concentration higher than that of the $p^-$-type semiconductor region EX2 is formed outside the $p^-$-type semiconductor region EX2 (on a side away from the channel formation region). Therefore, the $p^-$-type semiconductor region EX2 is adjacent to the channel formation region, and the $p^+$-type semiconductor region HR2 is formed away from the channel formation region by the $p^-$-type semiconductor region EX2 and at a position adjacent to the $p^-$-type semiconductor region EX2. The $p^-$-type semiconductor region EX2 is formed in a self-aligning manner with respect to the gate electrode GE2, and the $p^+$-type semiconductor region HR2 is formed in a self-aligning manner with respect to a compound formed of the gate electrode GE2 and its sidewall spacer SW on its sidewall.

On upper parts (surface layer parts of) the $n^+$-type semiconductor region HR1 and the $p^+$-semiconductor region HR2, a metal silicide layer SL1 is formed, which is a reactive layer (compound layer) of a metal and (the semiconductor layer SM configuring) the n$^+$-type semiconductor region HR1 or the p$^+$-type semiconductor region HR2. The metal silicide layer SL1 is, for example, a cobalt silicide layer, a nickel silicide layer, a nickel platinum silicide layer, or the like. Also, when the gate electrodes GE1 and GE2 are formed of a silicon film, the metal silicide layer SL1 is formed also on upper parts (surface layer parts) of the gate electrodes GE1 and GE2.

In the power feeding region 2A and the power feeding region 2B, the semiconductor layer SM and the insulating layer BX are removed. Therefore, the power feeding regions 2A and 2B are regions where the semiconductor layer SM and the insulating layer BX are removed. For this reason, in the power feeding regions 2A and 2B, the semiconductor substrate SB is exposed. On the front surface (surface layer part) of the semiconductor substrate SB exposed in the power feeding regions 2A and 2B, a metal silicide layer SL2 is formed, which is a reactive layer (compound layer) of metal and the semiconductor substrate SB. Specifically, a metal silicide layer SL2 is formed on an upper part (surface layer part) of a p-type semiconductor region PR3 in the power feeding region 2A, and the metal silicide layer SL2 is formed on an upper part (surface layer part) of an n-type semiconductor region NR3 in the power feeding region 2B. Each of the power feeding region 2A and the power feeding region 2B is surrounded therearound by the device isolation region ST. For this reason, when seen in a plan view, the metal silicide layer SL2 formed on the front surface of the semiconductor substrate SB exposed in the power feeding region 2A is surrounded therearound by the device isolation region ST, and the metal silicide layer SL2 formed on the front surface of the semiconductor substrate SB exposed in the power feeding region 2B is surrounded therearound by the device isolation region ST.

On the main surface side of the SOI substrate 1, an insulating film L1 is formed as an interlayer insulating film so as to cover the gate electrodes GE1 and GE2, the sidewall spacer SW, and the metal silicide layers SL1 and SL2. The insulating film L1 can be, for example, a multilayered film of a silicon nitride film and a silicon oxide film on the silicon nitride film (a silicon oxide film thicker than the silicon nitride film) or a single film of a silicon oxide film. As the silicon oxide film for the insulating film L1, the silicon oxide film can be mainly made of a silicon oxide and can further contain one or more types from out of carbon (C), fluorine (F), nitrogen (N), boron (B), and phosphorous (P).

In the insulating film L1, a contact hole (opening, hole, or through hole) is formed. Inside the contact hole, a conductive plug (contact plug) PG is formed. The contact hole is formed so as to penetrate through the insulating film L1, and the plug PG is formed so as to fill the contact hole.

The contact hole and the plug PG filling the contact hole are formed in the n$^-$-type semiconductor region HR1, the p$^+$-type semiconductor region HR2, and the gate electrodes GE1 and GE2. The plug PG formed in the n$^+$-type semiconductor region HR1 has its bottom part in contact with and electrically connected to the n$^+$-type semiconductor region HR1 or the metal silicide layer SL1 in the n$^+$-type semiconductor region HR1. For this reason, the plug PG formed in the p$^-$-type semiconductor region HR2 is electrically connected to that p$^+$-type semiconductor region HR2. Also, the plug PG formed in the p$^+$-type semiconductor region HR2 has its bottom part in contact with and electrically connected to the p$^+$-type semiconductor region HR2 or the metal silicide layer SL1 in the p$^+$-type semiconductor region HR2. For this reason, the plug PG formed in the n$^+$-type semiconductor region HR1 is electrically connected to that n$^+$-type semiconductor region HR1. Furthermore, the plug PG formed in the gate electrode GE1 has its bottom part in contact with and electrically connected to the gate electrode GE1 or the metal silicide layer SL1 on the gate electrode GE1. For this reason, the plug PG formed on the gate electrode GE1 is electrically connected to that gate electrode GE1. Also, the plug PG formed on the gate electrode GE2 has its bottom part in contact with and electrically connected to the gate electrode GE2 or the metal silicide layer SL1 on the gate electrode GE2. For this reason, the plug PG formed on the gate electrode GE2 is electrically connected to that gate electrode GE2.

Still further, the contact hole and the plug PG filling the contact hole are formed also in the power feeding region 2A and the power feeding region 2B. The plug PG disposed in the power feeding region 2A is hereinafter provided with a character PG1 and referred to as a plug PG1, and the plug PG disposed in the power feeding region 2B is hereinafter provided with a character PG2 and referred to as a plug PG2.

The plug PG disposed in the power feeding region 2A, that is, the plug PG1, has its bottom part in contact with and electrically connected to the metal silicide layer SL2 formed on the front surface of the semiconductor substrate SB in the power feeding region 2A. For this reason, the plug PG1 is electrically connected to the metal silicide layer SL2 in the power feeding region 2A and the p-type semiconductor region PR3 and the p-type semiconductor region PR2 thereunder. Also, the plug PG disposed in the power feeding region 2B, that is, the plug PG2, has its bottom part in contact with and electrically connected to the metal silicide layer SL2 formed on the front surface of the semiconductor substrate SB in the power feeding region 2B. For this reason, the plug PG2 is electrically connected to the metal silicide layer SL2 in the power feeding region 2B and the n-type semiconductor region NR3 and the n-type semiconductor region NR2 thereunder.

Still further, an insulating film L2 is formed on the insulating film L1, and a wiring M1 is buried in the insulating film L2. Each of the plugs PG (including the plugs PG1 and PG2) has its upper surface in contact with the wiring M1, thereby being electrically connected to that wiring M1.

In the semiconductor substrate SB, a p-type semiconductor region (back gate region) PR1, a p-type semiconductor region PR2, a p-type semiconductor region PR3, a p-type well (p-type semiconductor region) PW, an n-type semiconductor region (back gate region) NR1, an n-type semiconductor region NR2, an n-type semiconductor region NR3, and an n-type well (n-type semiconductor region) NW are formed.

Specifically, the p-type well (p-type semiconductor region) PW is formed in the semiconductor substrate SB, and the p-type semiconductor region PR2 is formed so as to be contained in the p-type well PW. Also, the n-type well (n-type semiconductor region) NW is formed in the semiconductor substrate SB, and the n-type semiconductor region NR2 is formed so as to be contained in the n-type well NW. While the p-type well PW and the n-type well NW are formed so as to be adjacent to each other, the p-type well PW is formed so as to include the nMIS formation region 1A and the power feeding region 2A when seen in a plan view and the n-type well NW is formed so as to include pMIS formation region 1B and the power feeding region 2B when seen in a plan view. That is, the nMIS formation region 1A and the power feeding region 2A are superposed on the p-type well PW when seen in a plan view, and the pMIS formation region 1B and the power feeding region 2B are superposed on the n-well well NW when seen in a plan view. The entire nMIS formation region 1A and the entire power feeding region 2A are preferably superposed on the p-type well PW when seen in a plan view, and the entire pMIS formation region 1B and the entire power feeding region 2B are preferably superposed on the n-well well NW when seen in a plan view.

The p-type semiconductor region PR2 is formed so as to be contained in the p-type well PW in the semiconductor substrate SB, and is also formed so as to include the nMIS formation region 1A and the power feeding region 2A when seen in a plan view. The n-type semiconductor region NR2 is formed so as to be contained in the n-type well NW in the semiconductor substrate SB, and is also formed so as to include pMIS formation region 1B and the power feeding region 2B when seen in a plan view. That is, the nMIS formation region 1A and the power feeding region 2A are superposed on the p-type semiconductor region PR2 when seen in a plan view, and the pMIS formation region 1B and the power feeding region 2B are superposed on the n-type semiconductor region NR2 when seen in a plan view. The entire nMIS formation region 1A and the entire power feeding region 2A are preferably superposed on the p-type semiconductor region PR2 when seen in a plan view; and the entire pMIS formation region 1B and the entire power feeding region 2B are preferably superposed on the n-type semiconductor region NR2 when seen in a plan view. The p-type well PW extends to under the p-type semiconductor region PR2, and convers a side surface (a side surface not in contact with the device isolation region ST) of the p-type semiconductor region PR2. The n-type well NW extends to under the n-type semiconductor region NR2, and convers a side surface (a side surface not in contact with the device isolation region ST) of the n-type semiconductor region NR2.

A p-type semiconductor region PR1 is formed on the semiconductor substrate SB under the insulating layer BX in the nMIS formation region 1A. That is, the p-type semiconductor region PR1 is formed on a surface layer portion of the semiconductor substrate SB under the insulating layer BX in the nMIS formation region 1A, and the p-type semiconductor region PR1 faces the semiconductor layer SM in the nMIS formation region 1A via the insulating layer BX. An n-type semiconductor region NR1 is formed on the semiconductor substrate SB under the insulating layer BX in the pMIS formation region 1B. That is, the n-type semiconductor region NR1 is formed on a surface layer portion of the semiconductor substrate SB under the insulating layer BX in the pMIS formation region 1B, and the n-type semiconductor region NR1 faces the semiconductor layer SM in the pMIS formation region 1B via the insulating layer BX.

The p-type semiconductor region PR3 is formed on an upper part (surface layer portion) of the semiconductor substrate SB in the power feeding region 2A, and the metal silicide layer SL2 is formed on a front surface (upper surface) of this p-type semiconductor region PR3. For this reason, the p-type semiconductor region PR3 is present in the power feeding region 2A and under the metal silicide layer SL2, and the p-type semiconductor region PR2 is present further thereunder. Also, the n-type semiconductor region NR3 is formed on an upper part (surface layer portion) of the semiconductor substrate SB in the power feeding region 2B, and the metal silicide layer SL2 is formed on a front surface (upper surface) of this n-type semiconductor region NR3. For this reason, the n-type semiconductor region NR3 is present in the power feeding region 2B and under the metal silicide layer SL2, and the n-type semiconductor region NR2 is present further thereunder.

Here, when the metal silicide layer SL2 is formed by reacting the entire p-type semiconductor region PR3 with a metal film (a metal film for forming the metal silicide layer SL2) in a process of forming the metal silicide layer SL2 (corresponding to step S13, which will be described further below), the p-type semiconductor region PR3 is not left under the metal silicide layer SL2 in the power feeding region 2A, and the p-type semiconductor region PR2 is directly present. Similarly, when the metal silicide layer SL2 is formed by reacting the entire n-type semiconductor region NR3 with the metal film (the metal film for forming the metal silicide layer SL2) in the process of forming the metal silicide layer SL2 (corresponding to step S13, which will be described further below), the n-type semiconductor region NR3 is not left under the metal silicide layer SL2 in the power feeding region 2B and the n-type semiconductor region NR2 is directly present.

The impurity concentration (p-type impurity concentration) of the p-type semiconductor region PR2 is higher than that (p-type impurity concentration) of the p-type well PW, the impurity concentration (p-type impurity concentration) of the p-type semiconductor region PR1 is higher than that (p-type impurity concentration) of the p-type semiconductor region PR2, and the impurity concentration (p-type impurity concentration) of the p-type semiconductor region PR3 is higher than that (p-type impurity concentration) of the p-type semiconductor region PR2. For this reason, the resistivity (specific resistance) of the p-type semiconductor region PR2 is lower than the resistivity of the p-type well PW, the resistivity of the p-type semiconductor region PR1 is lower than the resistivity of the p-type semiconductor region PR2, and the resistivity of the p-type semiconductor region PR3 is slower than the resistivity of the p-type semiconductor region PR2. The impurity concentration (p-type impurity concentration) of the p-type semiconductor region PR1 can be approximately equal to the impurity concentration (p-type impurity concentration) of the p-type semiconductor region PR3. The p-type well PW can be said as a p$^-$-type semiconductor region (low-concentration p-type semiconductor region), and the p-type semiconductor regions PR1 and PR3 can be said as p$^+$-type semiconductor regions (high-concentration p-type semiconductor regions).

Also, the impurity concentration (n-type impurity concentration) of the n-type semiconductor region NR2 is higher than that (n-type impurity concentration) of the n-type well NW, the impurity concentration (n-type impurity concentration) of the n-type semiconductor region NR1 is higher than that (n-type impurity concentration) of the n-type semiconductor region NR2, and the impurity concentration (n-type impurity concentration) of the n-type semiconductor region NR3 is higher than that (n-type impurity concentration) of the n-type semiconductor region NR2. For this reason, the resistivity (specific resistance) of the n-type semiconductor region NR2 is lower than the resistivity of the n-type well NW, the resistivity of the n-type semiconductor region NR1 is lower than the resistivity of the n-type semiconductor region NR2, and the resistivity of the n-type semiconductor region NR3 is lower than the resistivity of the n-type semiconductor region NR2. The impurity concentration (n-type impurity concentration) of the n-type semiconductor region NR1 can be approximately equal to the impurity concentration (n-type impurity concentration) of the n-type semiconductor region NR3. The n-type well NW can be said as an n$^-$-type semiconductor region (low-concentration n-type semiconductor region), and the n-type semiconductor regions NR1 and NR3 can be said as n$^+$-type semiconductor regions (high-concentration n-type semiconductor regions).

The depth of the p-type semiconductor region PR2 is shallower than the depth of the p-type well PW, and the depth of the p-type semiconductor region PR1 is shallower than the depth of the p-type semiconductor region PR2. In other words, the depth of the p-type semiconductor region PR2 is deeper than the depth of the p-type semiconductor region PR1, and the depth of the p-type well PW is deeper than the depth of the p-type semiconductor region PR2. For this reason, the depth position of the bottom surface (lower surface) of the p-type semiconductor region PR2 is at a shallower level than the depth position of the bottom surface (lower surface) of the p-type well PW, the bottom surface of the p-type semiconductor region PR2 is in contact with the p-type well PW, the depth position of the bottom surface (lower surface) of the p-type semiconductor region PR1 is at a shallower level than the depth position of the bottom surface (lower surface) of the p-type semiconductor region PR2, and the bottom surface of the p-type semiconductor region PR1 is in contact with the p-type semiconductor region PR2. Also, the depth of the bottom surface of the p-type semiconductor region PR1 is at a shallower level than the depth of the bottom surface of the device isolation region ST. For this reason, the p-type semiconductor region PR1 is not formed under the device isolation region ST, the p-type semiconductor region PR1 is surrounded therearound by the device isolation region ST when seen in a plan view, the bottom surface of the p-type semiconductor region PR1 is in contact with the p-type semiconductor region PR2, the upper surface of the p-type semiconductor region PR1 is in contact with the insulating layer BX, and the side surface of the p-type semiconductor region PR1 is in contact with the device isolation region ST.

Therefore, in the nMIS formation region 1A, the p-type semiconductor region PR1 is formed over a predetermined depth from the upper surface of the semiconductor substrate SB, the p-type semiconductor region PR2 is present under the p-type semiconductor region PR1, and the p-type well PW is present under the p-type semiconductor region PR2.

Here, the depth of each of the semiconductor regions (PW, PR1, PR1a, PR2, PR3, NW, NR1, NR1a, NR2, and NR3) formed in on the semiconductor substrate SB and the depth of the device isolation region (ST) refer to depths when viewed in a direction of the thickness of the semiconductor substrate SB, a side near the rear surface of the semiconductor substrate SB is taken as a deep side, and a side away from the rear surface of the semiconductor substrate SB is taken as a shallow side.

On the other hand, in the power feeding region 2A, the metal silicide layer SL2 is formed on the front surface of the semiconductor substrate SB, the p-type semiconductor region PR3 is present under the metal silicide layer SL2, the p-type semiconductor region PR2 is present under the p-type semiconductor region PR3, and the p-type well PW is present under the p-type semiconductor region PR2. The depth of the bottom surface of the p-type semiconductor region PR3 is at a shallower level than the depth of the bottom surface of the p-type semiconductor region PR2 and at a shallower level than the depth of the bottom surface of the device isolation region ST.

The depth of the p-type semiconductor region PR2 is deeper than the depth of the device isolation region ST. That is, the depth position of the bottom surface of the p-type semiconductor region PR2 is deeper than the depth position of the bottom surface of the device isolation region ST. That is, the p-type semiconductor region PR2 is formed so as to include the nMIS formation region 1A and the power feeding region 2A when seen in a plan view and be deeper than the bottom surface in the device isolation region ST. For this reason, the p-type semiconductor region PR2 is formed not only in the semiconductor substrate SB in the nMIS formation region 1A and the semiconductor substrate SB in the power feeding region 2A but also under the device isolation region ST present between the nMIS formation region 1A and the power feeding region 2A when seen in a plan view. Also, the depth of the bottom surface of the p-type well PW is deeper than the depth of the bottom surface of the p-type semiconductor region PR2, and therefore is inevitably deeper than the depth of the bottom surface of the device isolation region ST.

For this reason, in the nMIS formation region 1A, the p-type semiconductor region PR1 is present under the insulating layer BX, the p-type semiconductor region PR2 is present under the p-type semiconductor region PR1, and the p-type well PW is present under the p-type semiconductor region PR2. Also in the power feeding region 2A, the p-type semiconductor region PR3 is present under the metal silicide layer SL2, the p-type semiconductor region PR2 is present under the p-type semiconductor region PR3, and the p-type well PW is present under the p-type semiconductor region PR2. And, the p-type semiconductor region PR2 is present under the device isolation region ST present between the nMIS formation region 1A and the power feeding region 2A when seen in a plan view, and the p-type well PW is further present thereunder. For this reason, the p-type semiconductor region PR2 in the nMIS formation region 1A and the p-type semiconductor region PR2 in the power feeding region 2A are continuously connected via the p-type semiconductor region PR2 under the device isolation region ST. That is, the p-type semiconductor region PR2 is continuously formed from the semiconductor substrate SB in the nMIS formation region 1A over the semiconductor region SB in the power feeding region 2A. Therefore, the metal silicide layer SL2 in the power feeding region 2A is electrically connected to the p-type semiconductor region PR1 in the nMIS formation region 1A via the p-type semiconductor region PR2. Since the plug PG1 in the power feeding region 2A is in contact with the metal silicide layer SL2 in the power feeding region 2A, the plug PG1 is electrically connected to the p-type semiconductor region PR1 in the nMIS formation region 1A via the metal silicide layer SL2 (the metal silicide layer SL2 in the power feeding region 2A) and the p-type semiconductor region PR2. Here, when the p-type semiconductor region PR3 is interposed between the p-type semiconductor region PR2 and the metal silicide layer SL2, the plug PG1 is electrically connected to the p-type semiconductor region PR1 in the nMIS formation region 1A via the metal silicide layer SL2 (the metal silicide layer SL2 in the power feeding region 2A), the p-type semiconductor region PR3, and the p-type semiconductor region PR2.

The depth of the n-type semiconductor region NR2 is shallower than the depth of the n-type well NW, and the depth of the n-type semiconductor region NR1 is shallower than the depth of the n-type semiconductor region NR2. In other words, the depth of the n-type semiconductor region NR2 is deeper than the depth of the n-type semiconductor region NR1, and the depth of the n-type well NW is deeper than the depth of the n-type semiconductor region NR2. For this reason, the depth position of the bottom surface of the n-type semiconductor region NR2 is at a shallower level than the depth position of the bottom surface of the n-type well NW, the bottom surface of the n-type semiconductor region NR2 is in contact with the n-type well NW, the depth position of the bottom surface of the n-type semiconductor region NR1 is at a shallower level than the depth position of the bottom surface of the n-type semiconductor region NR2, and the bottom surface of the n-type semiconductor region NR1 is in contact with the n-type semiconductor region NR2. Also, the depth of the bottom surface of the n-type semiconductor region NR1 is shallower than the depth of the bottom surface of the device isolation region ST. For this reason, the n-type semiconductor region NR1 is not formed under the device isolation region ST, the n-type semiconductor region NR1 is surrounded therearound by the device isolation region ST when seen in a plan view, the bottom surface of the n-type semiconductor region NR1 is in contact with the n-type semiconductor region NR2, the upper surface of the n-type semiconductor region NR1 is in contact with the insulating layer BX, and the side surface of the n-type semiconductor region NR1 is in contact with the device isolation region ST.

Therefore, in the pMIS formation region 1B, the n-type semiconductor region NR1 is formed from the upper surface of the semiconductor substrate SB over a predetermined depth, the n-type semiconductor region NR2 is present under the n-type semiconductor region NR1, and the n-type well NW is present under the n-type semiconductor region NR2.

On the other hand, in the power feeding region 2B, the metal silicide layer SL2 is formed on the front surface of the semiconductor substrate SB, the n-type semiconductor region NR3 is present under the metal silicide layer SL2, the n-type semiconductor region NR2 is present under the n-type semiconductor region NR3, and the n-type well NW is present under the n-type semiconductor region NR2. The depth of the bottom surface of the n-type semiconductor region NR3 is at a shallower level than the depth of the bottom surface of the n-type semiconductor region NR2 and at a shallower level than the depth of the bottom surface of the device isolation region ST.

The depth of the n-type semiconductor region NR2 is deeper than the depth of the device isolation region ST. That is, the depth position of the bottom surface of the n-type semiconductor region NR2 is at a deeper level than the depth position of the bottom surface in the device isolation region ST. That is, the n-type semiconductor region NR2 is formed so as to include the pMIS formation region 1B and the power feeding region 2B when seen in a plan view and be deeper than the bottom surface of the device isolation region ST. For this reason, the n-type semiconductor region NR2 is formed not only in the semiconductor substrate SB in the pMIS formation region 1B and the semiconductor substrate SB in the power feeding region 2B but also under the device isolation region ST present between the pMIS formation region 1B and the power feeding region 2B when seen in a plan view. Also, the depth of the bottom surface of the n-type well NW is deeper than the depth of the bottom surface of the n-type semiconductor region NR2, and therefore is inevitably at a deeper level than the depth of the bottom surface of the device isolation region ST.

For this reason, in the pMIS formation region 1B, the n-type semiconductor region NR1 is present under the insulating layer BX, the n-type semiconductor region NR2 is present under the n-type semiconductor region NR1, and the n-type well NW is present under the n-type semiconductor region NR2. Also in the power feeding region 2B, the n-type semiconductor region NR3 is present under the metal silicide layer SL2, the n-type semiconductor region NR2 is present under the n-type semiconductor region NR3, and the n-type well NW is present under the n-type semiconductor region NR2. And, the n-type semiconductor region NR2 is present under the device isolation region ST present between the pMIS formation region 1B and the power feeding region 2B when seen in a plan view, and the n-type well NW is further present thereunder. For this reason, the n-type semiconductor region NR2 in the pMIS formation region 1B and the n-type semiconductor region NR2 in the power feeding region 2B are continuously connected via the n-type semiconductor region NR2 under the device isolation region ST. That is, the n-type semiconductor region NR2 is continuously formed from the semiconductor substrate SB in the pMIS formation region 1B over the semiconductor region SB in the power feeding region 2B. Therefore, the metal silicide layer SL2 in the power feeding region 2B is electrically connected to the n-type semiconductor region NR1 in the pMIS formation region 1B via the n-type semiconductor region NR2. Since the plug PG2 in the power feeding region 2B is in contact with the metal silicide layer SL2 in the power feeding region 2B, the plug PG2 is electrically connected to the n-type semiconductor region NR1 in the pMIS formation region 1B via the metal silicide layer SL2 (the metal silicide layer SL2 in the power feeding region 2B) and the n-type semiconductor region NR2. Here, when the n-type semiconductor region NR3 is interposed between the n-type semiconductor region NR2 and the metal silicide layer SL2, the plug PG2 is electrically connected to the n-type semiconductor region NR1 in the pMIS formation region 1B via the metal silicide layer SL2 (the metal silicide layer SL2 in the power feeding region 2B), the n-type semiconductor region NR3, and the n-type semiconductor region NR2.

The p-type semiconductor region PR2 is formed so as to be contained in the p-type well PW, and the p-type semiconductor region PR1 is formed so as to be contained in the p-type semiconductor region PR2. For this reason, the p-type semiconductor region PR2 is interposed between the p-type well PW and the p-type semiconductor region PR1. Also, the n-type semiconductor region NR2 is formed so as to be contained in the n-type well NW, and the n-type semiconductor region NR1 is formed so as to be contained in the n-type semiconductor region NR2. For this reason, the n-type semiconductor region NR2 is interposed between the n-type well NW and the n-type semiconductor region NR1. The p-type semiconductor regions PR1, PR2, and PR3 are not in contact with any of the n-type well NW, the n-type semiconductor region NR1, the n-type semiconductor region NR2, and the n-type semiconductor region NR3. Also, the n-type semiconductor regions NR1, NR2, and NR3 are not in contact with any of the p-type well PW, the p-type semiconductor region PR1, the p-type semiconductor region PR2, and the p-type semiconductor region PR3.

On the other hand, the p-type well PW and the n-type well NW are adjacent to each other. That is, the p-type well PW and the n-type well NW are in contact with each other to form a pn junction (pn junction plane) between the p-type well PW and the n-type well NW. The pn junction plane formed by making the p-type well PW and the n-type well NW in contact with each other is present under the device isolation region ST.

The p-type semiconductor region PR1 is provided so as to adjust (control) a threshold voltage of the n-channel-type MISFET Qn formed in the semiconductor layer SM in the nMIS formation region 1A. For this reason, the p-type semiconductor region PR1 is disposed via the insulating layer BX under an active region where the n-channel-type MISFET Qn is disposed (that is, under the semiconductor layer SM in the nMIS formation region 1A). Also, the n-type semiconductor region NR1 is provided so as to adjust (control) a threshold voltage of the p-channel-type MISFET Qp formed in the semiconductor layer SM in the pMIS formation region 1B. For this reason, the n-type semiconductor region NR1 is disposed via the insulating layer BX under an active region where the p-channel-type MISFET Qp is disposed (that is, under the semiconductor layer SM in the pMIS formation region 1B). The p-type semiconductor region PR1 and the n-type semiconductor region NR1 can be each regarded as a back gate region. The p-type semiconductor region PR1 can function as a back gate of the n-channel-type MISFET Qn, and the n-type semiconductor region NR1 can function as a back gate of the p-channel-type MISFET Qp.

The power feeding region 2A is a region with the semiconductor layer SM and the insulating layer BX removed in order to supply a desired potential (voltage) to the semiconductor substrate SB in the nMIS formation region 1A (in particular, the p-type semiconductor region PR1). In the power feeding region 2A, the desired potential (voltage) can be supplied from the plug PG1 via the metal silicide layer SL2 (and the p-type semiconductor region PR3) to the p-type semiconductor region PR2. For this reason, the desired potential (voltage) can be supplied from the plug PG1 in the power feeding region 2A via the metal silicide layer SL2 (the metal silicide layer SL2 in the power feeding region 2A), the p-type semiconductor region PR3 and the p-type semiconductor region PR2 to the p-type semiconductor region PR1 in the nMIS formation region 1A. By controlling the potential (voltage) of the p-type semiconductor region PR1, the threshold voltage of the n-channel-type MISFET Qn formed in the semiconductor layer SM in the nMIS formation region 1A can be adjusted (controlled).

Also, the power feeding region 2B is a region with the semiconductor layer SM and the insulating layer BX removed in order to supply a desired potential (voltage) to the semiconductor substrate SB in the pMIS formation region 1B (in particular, the n-type semiconductor region NR1). In the power feeding region 2B, the desired potential (voltage) can be supplied from the plug PG2 via the metal silicide layer SL2 (and the n-type semiconductor region NR3) to the n-type semiconductor region NR2. For this reason, the desired potential (voltage) can be supplied from the plug PG2 in the power feeding region 2B via the metal silicide layer SL2 (the metal silicide layer SL2 in the power feeding region 2B), the n-type semiconductor region NR3, and the n-type semiconductor region NR2 to the n-type semiconductor region NR1 in the pMIS formation region 1B. By controlling the potential (voltage) of the n-type semiconductor region NR1, the threshold voltage of the p-channel-type MISFET Qp formed in the semiconductor layer SM in the pMIS formation region 1B can be adjusted (controlled).

<Regarding Semiconductor Device Manufacturing Process>

Figure 6:
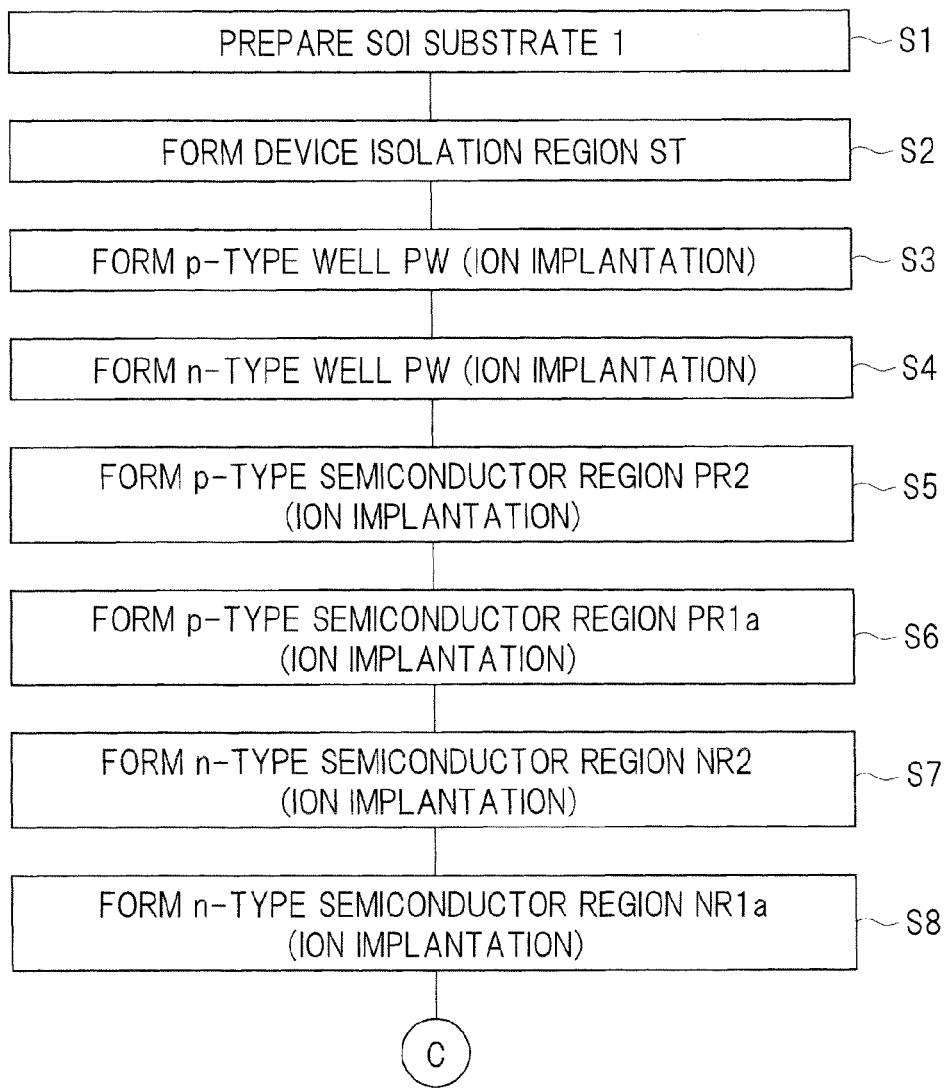
FIG. 6 is a process flow diagram illustrating a manufacturing process of the semiconductor device of the embodiment.
Figure 7:
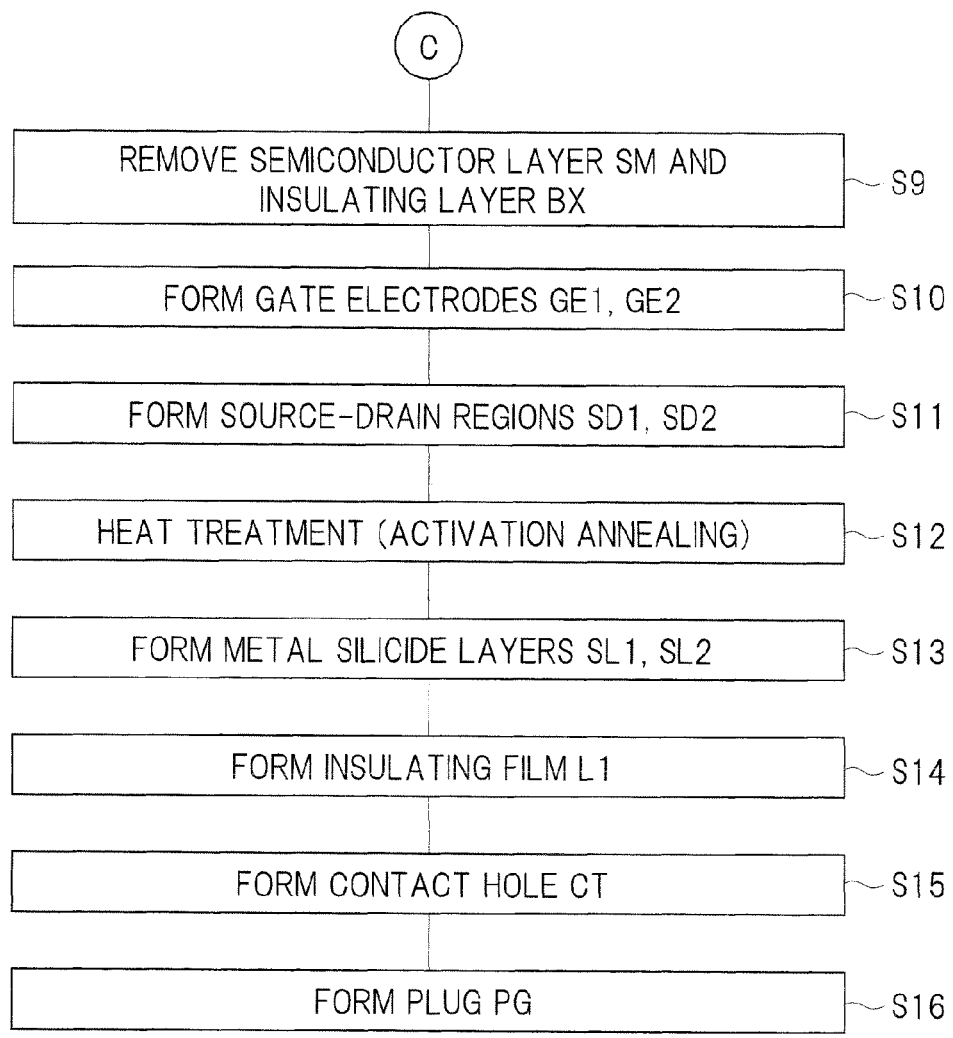
FIG. 7 is a process flow diagram illustrating a manufacturing process of the semiconductor device of the embodiment continued from FIG. 6.

Next, the semiconductor device manufacturing process of the present embodiment is described with reference to the drawings. FIG. 6 and FIG. 7 are process flow diagrams illustrating a semiconductor device manufacturing process of the present embodiment. FIG. 8 to FIG. 45 are each a plan view or cross-sectional view of main parts during the semiconductor device manufacturing process of the present embodiment.

Among FIG. 8 to FIG. 45, FIG. 9, FIG. 11, FIG. 13, FIG. 15, FIG. 17, FIG. 19, FIG. 21, FIG. 25, FIG. 29, FIG. 32, FIG. 38, and FIG. 42 are plan views of a region corresponding to FIG. 1, and the members are partially hatched for easy understanding. Also, among FIG. 8 to FIG. 45, FIG. 8, FIG. 10, FIG. 12, FIG. 14, FIG. 16, FIG. 18, FIG. 20, FIG. 22, FIG. 26, FIG. 30, FIG. 33, FIG. 35, FIG. 39, and FIG. 43 are cross-sectional views of a region corresponding to FIG. 2, and roughly correspond to cross-sectional views along an A-A line of the corresponding plan views. Furthermore, among FIG. 8 to FIG. 45, FIG. 23, FIG. 27, FIG. 31, FIG. 34, FIG. 36, FIG. 40, and FIG. 44 are cross-sectional views of a region corresponding to FIG. 3, and roughly correspond to cross-sectional views along a B-B line and a C-C line of the corresponding plan views. Still further, among FIG. 8 to FIG. 45, FIG. 24, FIG. 28, FIG. 37, FIG. 41, and FIG. 45 are cross-sectional views of a region corresponding to FIG. 5, and roughly correspond to cross-sectional views along a D-D line and an E-E line of the corresponding plan views.

Figure 8:
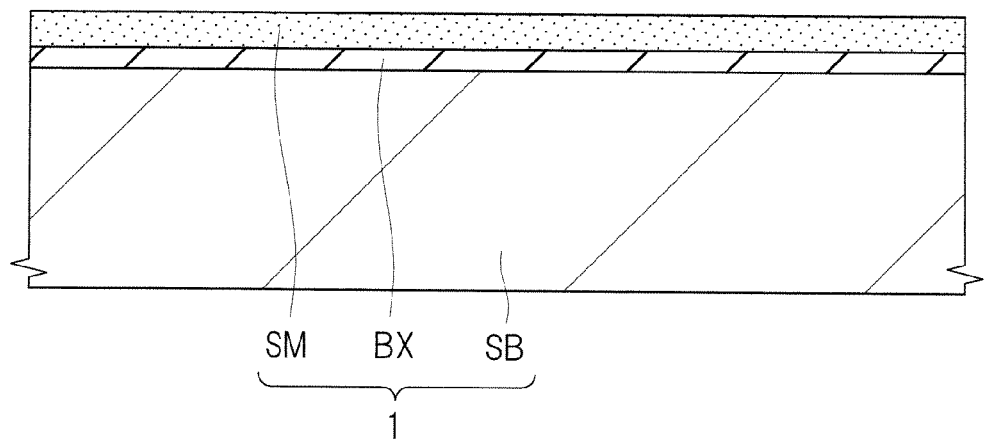
FIG. 8 is a cross-sectional view of main parts of the semiconductor device during a manufacturing process according to an embodiment.

First, as illustrated in FIG. 8, the SOI substrate 1 is prepared (step S1 of FIG. 6).

The SOI substrate 1 has the semiconductor substrate (supporting substrate) SB as a supporting substrate, the insulating layer (buried insulating film) BX formed on the main surface of the semiconductor substrate SB, and the semiconductor layer SM formed on the upper surface of the insulating layer BX.

The semiconductor substrate SB is a supporting substrate supporting the insulating layer BX and the structures above the insulating layer BX, and is also a semiconductor substrate. The semiconductor substrate SB is preferably a monocrystalline silicon substrate, and is made of, for example, p-type monocrystalline silicon. For example, by using monocrystalline silicon with a specific resistance on the order of 1 Ωcm to 10 Ωcm, the semiconductor substrate SB can be formed. The thickness of the semiconductor substrate SB can be, for example, on the order of 700 µm to 750 µm. The insulating layer BX is, for example, a silicon oxide film, and the film thickness of the insulating layer BX can be, for example, on the order of 10 nm to 50 nm. When the insulating layer BX is a silicon oxide film, the insulating layer BX can be regarded as a buried oxide film, that is, a BOX (Buried Oxide) layer. The semiconductor layer SM is made of monocrystalline silicon or the like. For example, by using monocrystalline silicon with a specific resistance on the order of 1 Ωcm to 10 Ωcm, the semiconductor layer SM can be formed. The thickness of the semiconductor layer SM is thinner than the thickness of the semiconductor substrate SB as a supporting substrate, and can be, for example, on the order of 5 nm to 20 nm.

While the method of manufacturing the SOI substrate 1 is not restrictive, the SIMOX (Silicon Implanted Oxide) method can be used for manufacturing, for example. In the SIMOX method, $O_2$ (oxygen) is ion-implanted with high energy to the main surface of the semiconductor substrate made of silicon (Si), and Si (silicon) and oxygen are coupled together in the subsequent heat treatment, thereby forming the insulating layer BX made of silicon oxide at a position slightly deeper than the front surface of the semiconductor substrate. In this case, a silicon (Si) thin film left on the insulating layer BX becomes the semiconductor layer SM, and the semiconductor substrate under the insulating layer BX becomes the semiconductor substrate SB. Also, the SOI substrate 1 may be formed by using a lamination method. In the lamination method, for example, the front surface of a first semiconductor substrate made of silicon (Si) is oxidized to form the insulating layer BX, and then a second semiconductor substrate made of silicon (Si) is crimped onto the first semiconductor substrate under high temperatures for lamination, and then the film thickness of the second semiconductor substrate is made thinner. In this case, the thin film of the second semiconductor substrate left on the insulating layer BX becomes the semiconductor layer SM, and the first semiconductor substrate under the insulating layer BX becomes the semiconductor substrate SB. Furthermore, the SOI substrate 1 can be manufactured by using another scheme, for example, a smart cut process.

In the SOI substrate 1, of main surfaces of the semiconductor substrate SB, a main surface in contact with the insulating layer is referred to as an upper surface of the semiconductor substrate SB, and a main surface opposite to the upper surface of the semiconductor substrate SB is referred to as a rear surface of the semiconductor substrate SB. Also, in the SOI substrate 1, of main surfaces of the insulating layer BX, a main surface in contact with the semiconductor substrate SB is referred to as a lower surface of the insulating layer BX, a main surface in contact with the semiconductor layer SM is referred to as an upper surface of the insulating layer BX, and the upper surface and the lower surface of the insulating layer BX are surfaces opposite to each other. Also, of the main surfaces of the semiconductor layer SM, a main surface in contact with the insulating layer BX is referred to as a lower surface of the semiconductor layer SM, and a main surface opposite to the lower surface of the semiconductor layer SM is referred to as an upper surface of the semiconductor layer SM.

Figure 9:
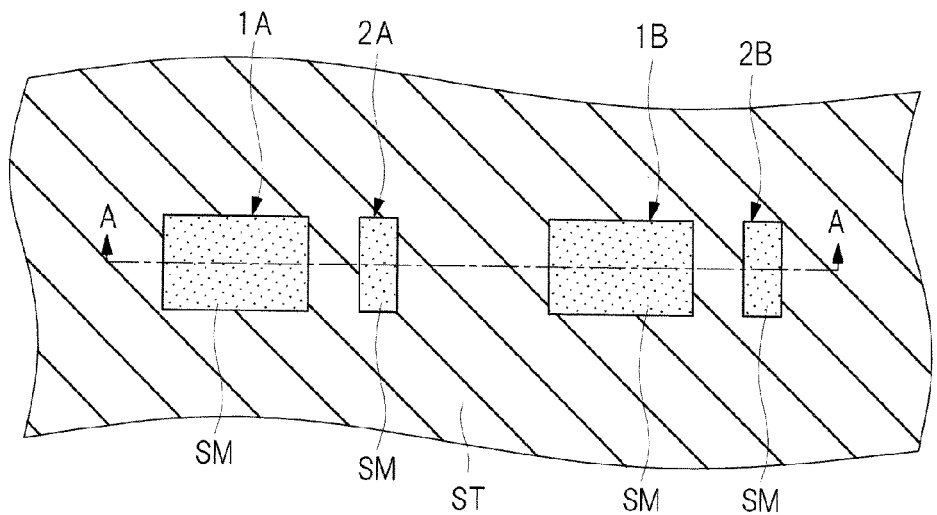
FIG. 9 is a plan view of main parts of the semiconductor device during the manufacturing process continued from FIG. 8.
Figure 10:
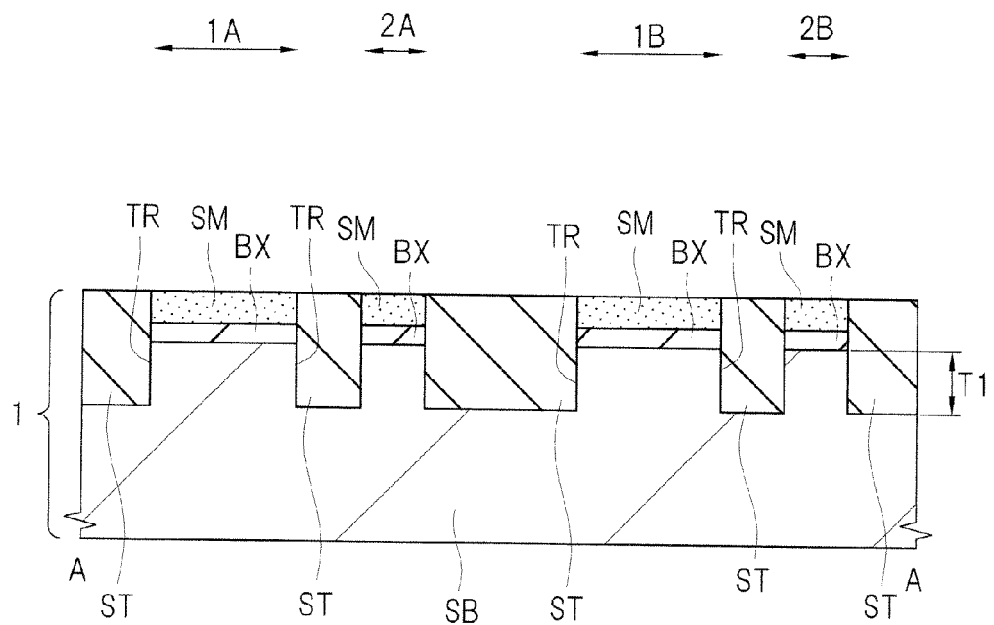
FIG. 10 is a cross-sectional view of main parts of the semiconductor device during the manufacturing process same as FIG. 8.

Next, as illustrated in FIG. 9 and FIG. 10, the device isolation region ST is formed on the SOI substrate 1 (step S2 of FIG. 6).

While FIG. 9 is a plan view, the device isolation region ST is hatched with bold diagonal lines, and the semiconductor layer SM is hatched with dots. FIG. 10 roughly corresponds to a cross-sectional view along the A-A line of FIG. 9.

In the stage of preparing the SOI substrate 1 at step S1, the semiconductor layer SM is formed via the insulating layer BX over the entire upper surface of the semiconductor substrate SB. When the device isolation region ST is formed at step S2, the semiconductor layer SM is partitioned into a plurality of regions (active regions) each surrounded by the device isolation region ST.

The device isolation region ST can be formed by using the STI (shallow trench isolation) method. Specifically, the device isolation region ST can be formed as follows.

That is, first, an insulating film (for example, a silicon nitride film) is formed on the SOI substrate 1, that is, on the semiconductor layer SM of the SOI substrate 1, and then patterning (processing) is performed on the insulating film by using photolithography and dry etching. With this, a hard mask layer (not illustrated) formed of a silicon nitride film or the like is formed. Then, with the hard mask layer as an etching mask, etching (preferably, dry etching) is performed on the SOI substrate 1, thereby forming a device isolation trench TR. The device isolation trench TR is a trench for the device isolation region ST. The device isolation trench TR penetrates through the semiconductor layer SM and the insulating layer BX, with the bottom part of the device isolation trench TR reaching the semiconductor substrate SB (that is, the bottom part of the device isolation trench TR is positioned in the course of the thickness of the semiconductor substrate SB). Therefore, on the bottom part of the device isolation trench TR, the semiconductor substrate SB is exposed. Then, an insulating film for the device isolation region ST (for example, a silicon oxide film) is formed on the main surface of the SOI substrate 1 so as to fill the device isolation trench TR, and then the insulating film outside the device isolation trench TR is removed by using CMP (Chemical Mechanical Polishing). Then, the hard mask layer is removed. With this, the device isolation region ST formed of the insulating film buried in the device isolation trench TR can be formed.

The device isolation region ST is formed to prevent interference between elements, here, between the n-channel-type MISFET (Qn) and the p-channel-type MISFET (Qp). The device isolation region ST is an inactive region for isolating a plurality of active regions of the SOI substrate 1. A MISFET is formed on the semiconductor layer SM configuring an active region surrounded by the device isolation region ST in a plan view, which will be described further under. The shape of the active region when seen in a plan view is defined by being surrounded by the device isolation region ST.

Of the device isolation region ST, a length T1 (dimension) of a portion projecting from the lower surface of the insulating layer BX can be set, for example, on the order of 250 nm to 350 nm. That is, the bottom surface of the device isolation region ST is at a position deeper than the lower surface of the insulating layer BX by the length T1. Therefore, the length T1 can be regarded as the depth of the bottom surface of the device isolation region ST from the lower surface of the insulating layer BX. The length T1 is illustrated in FIG. 10.

In this stage, the semiconductor layer SM sectioned as being surrounded by the element insolating region ST is present in each of the nMIS formation region 1A, the pMIS formation region 1B, the power feeding region 2A, and the power feeding region 2B. The semiconductor layer SM in the nMIS formation region 1A is an active region for forming the n-channel-type MISFET Qn, and the semiconductor layer SM in the pMIS formation region 1B is an active region for forming the n-channel-type MISFET Qn. The semiconductor layer SM in the nMIS formation region 1A, the semiconductor layer SM in the pMIS formation region, the semiconductor layer SM in the in the power feeding region 2A, and the semiconductor layer SM in the power feeding region 2B has a flat shape formed in, for example, a rectangle. Here, the semiconductor layer SM and the insulating layer BX in the power feeding region 2A and the semiconductor layer SM and the insulating layer BX in the power feeding region 2B are removed at step S9, which will be described further below.

Figure 11:
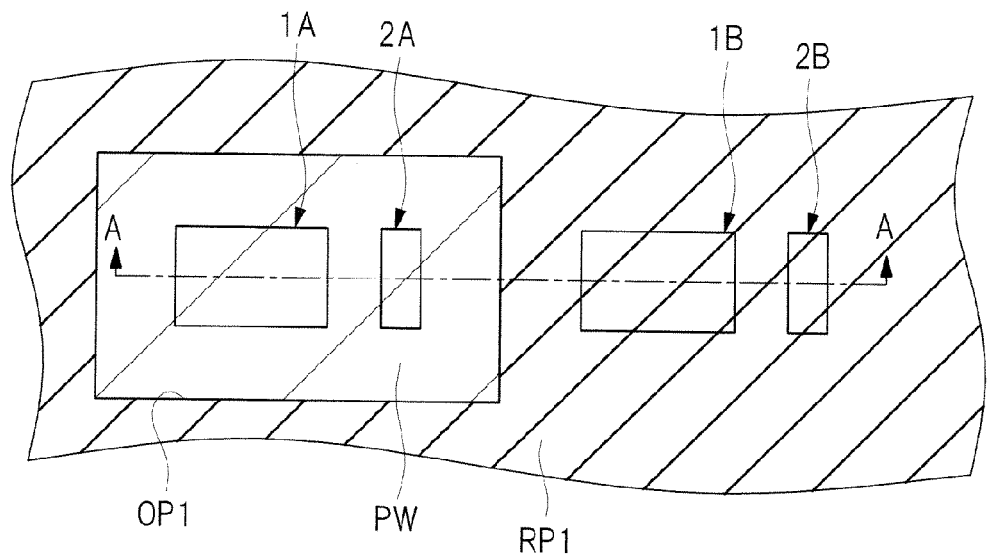
FIG. 11 is a plan view of main parts of the semiconductor device during the manufacturing process continued from FIG. 9 and FIG. 10.
Figure 12:
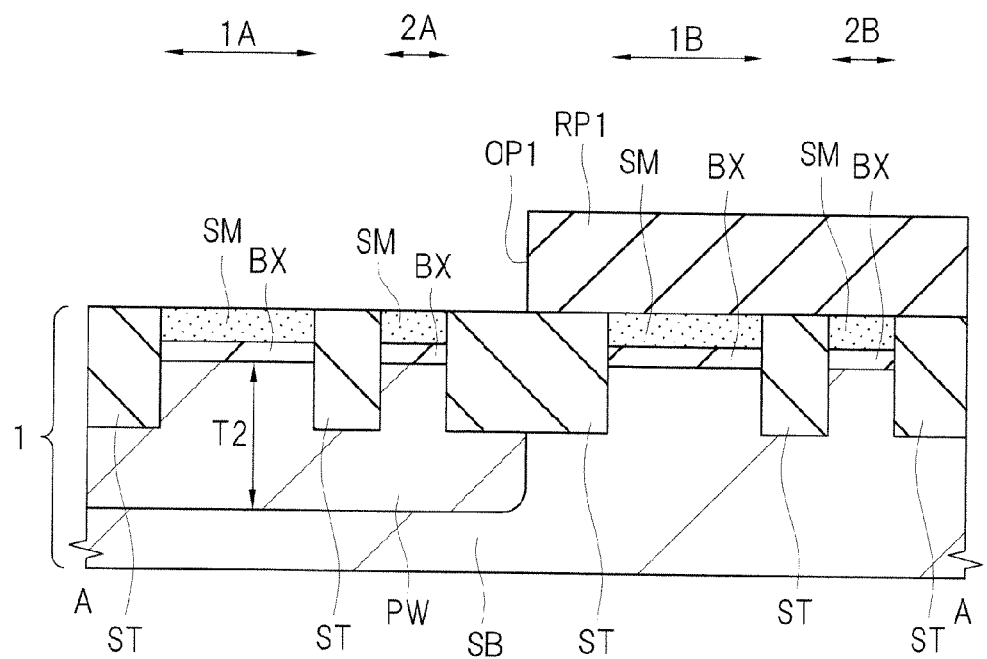
FIG. 12 is a cross-sectional view of main parts of the semiconductor device during the manufacturing process same as FIG. 11.

Next, as illustrated in FIG. 11 and FIG. 12, the p-type well PW is formed by ion implantation on the semiconductor substrate SB of the SOI substrate 1 (step S3 of FIG. 6)

While FIG. 11 is a plan view, a photoresist pattern RP1 is hatched with bold diagonal lines, and a planar region where the p-type well PW is formed is hatched with thin diagonal lines. FIG. 12 roughly corresponds to the cross-sectional view along the A-A line of FIG. 11.

At step S3, the p-type well PW is formed by ion implantation of p-type impurities (for example, boron) in the semiconductor substrate SB of the SOI substrate 1. Specifically, first, as illustrated in FIG. 11 and FIG. 12, the photoresist pattern (mask layer) RP1 is formed as a mask layer on the main surface of the SOI substrate 1 by using photolithography. The photoresist pattern RP1 is formed so as to expose a p-type well PW formation scheduled region and cover other regions (including an n-type well NW formation scheduled region). That is, the photoresist pattern RP1 has an opening OP1 for exposing the p-type well PW formation scheduled region. The opening OP1 contains the nMIS formation region 1A and the power feeding region 2A when seen in a plan view. Then, with the photoresist pattern RP1 being used as a mask (ion implantation blocking mask), p-type impurities (for example, boron) are ion-implanted in the semiconductor substrate SB of the SOI substrate 1 to form the p-type well PW. The p-type well PW is formed so as to be aligned with the opening OP1 of the photoresist pattern RP1. Then, the photoresist pattern RP1 is removed. In this manner, the p-type well PW is formed at step S3. The p-type well PW can be regarded as a p-type semiconductor region.

Also, when ion implantation for forming the p-type well PW is performed at step S3, p-type impurities can also be ion-implanted in the semiconductor layers SM in the nMIS formation region 1A and the power feeding region 2A. With this, the entire semiconductor layer SM in the nMIS formation region 1A can become a p-type well region.

A depth T2 of the bottom surface of the p-type well PW from the lower surface of the insulating layer BX (that is, the upper surface of the semiconductor substrate SB) can be set, for example, on the order to 2000 nm to 2500 nm. The depth T2 is illustrated in FIG. 12. Here, the depth T2 is larger than the length T2 (T2>T1). Also, the impurity concentration (p-type impurity concentration) of the p-type well PW can be set, for example, on the order of $1 \times 10^{16}/cm^3$ to $5 \times 10^{17}/cm^3$.

Figure 13:
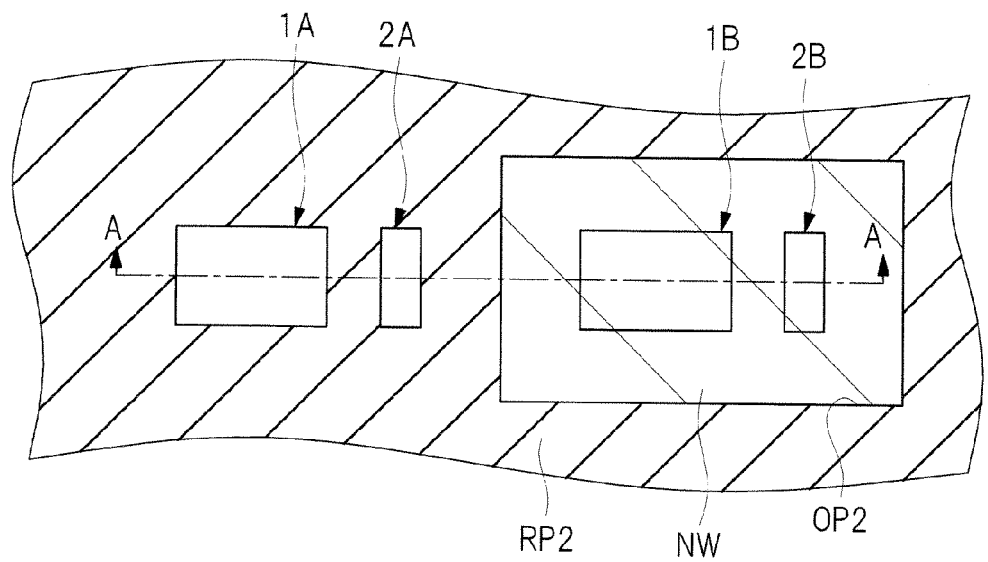
FIG. 13 is a plan view of main parts of the semiconductor device during the manufacturing process continued from FIG. 11 and FIG. 12.
Figure 14:
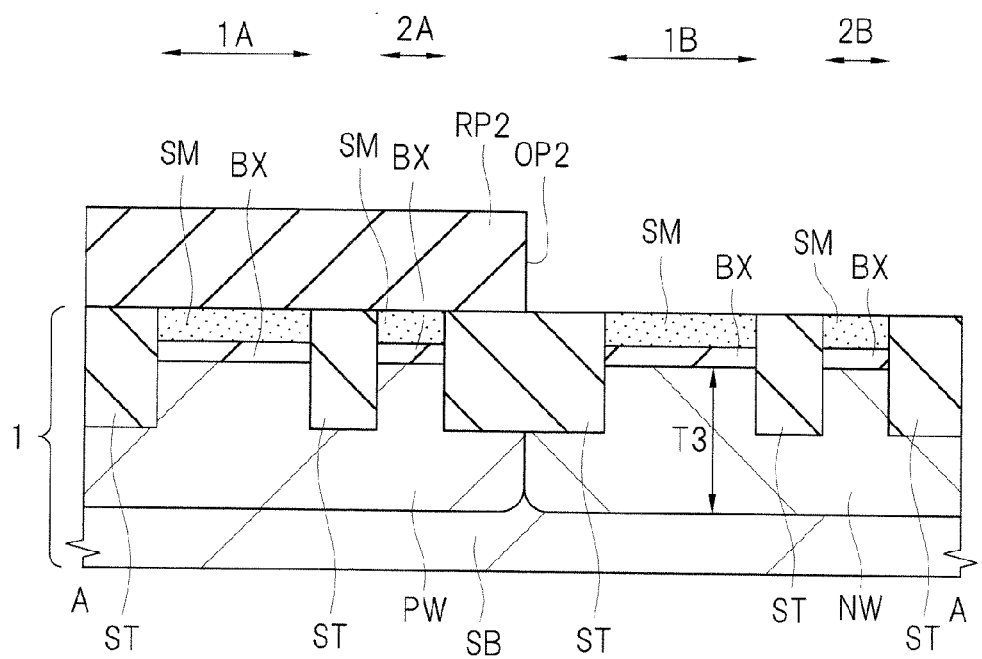
FIG. 14 is a cross-sectional view of main parts of the semiconductor device during the manufacturing process same as FIG. 13.

Next, as illustrated in FIG. 13 and FIG. 14, the n-type well NW is formed on the semiconductor substrate SB of the SOI substrate 1 by ion implantation (step S4 of FIG. 6).

While FIG. 13 is a plan view, a photoresist pattern RP2 is hatched with bold diagonal lines, and the planar region where the n-type well NW is formed is hatched with thin diagonal lines. FIG. 14 roughly corresponds to a cross-sectional view along the A-A line of FIG. 13.

At step S4, the n-type well NW is formed by ion implantation of n-type impurities (for example, phosphorous or arsenic) in the semiconductor substrate SB of the SOI substrate 1. Specifically, first, as illustrated in FIG. 13 and FIG. 14, the photoresist pattern (mask layer) RP2 is formed as a mask layer on the main surface of the SOI substrate 1 by using photolithography. The photoresist pattern RP2 is formed so as to expose an n-type well NW formation scheduled region and cover other regions (including a p-type well PW formation region). That is, the photoresist pattern RP2 has an opening OP2 for exposing the n-type well NW formation scheduled region. The opening OP2 contains the pMIS formation region 1B and the power feeding region 2B when seen in a plan view. Then, with the photoresist pattern RP2 being used as a mask (ion implantation blocking mask), n-type impurities (for example, phosphorous or arsenic) are ion-implanted in the semiconductor substrate SB of the SOI substrate 1 to form the n-type well NW. The n-type well NW is formed so as to be aligned with the opening OP2 of the photoresist pattern RP2. Then, the photoresist pattern RP2 is removed. In this manner, the n-type well NW is formed at step S4. The n-type well NW can be regarded as an n-type semiconductor region.

Also, when ion implantation for forming the n-type well NW is performed at step S4, n-type impurities can also be ion-implanted in the semiconductor layers SM in the pMIS formation region 1B and the power feeding region 2B. With this, the entire semiconductor layer SM in the pMIS formation region 1B can become an n-type well region.

A depth T3 of the bottom surface of the n-type well NW from the lower surface of the insulating layer BX (that is, the upper surface of the semiconductor substrate SB) can be set, for example, on the order to 2000 nm to 2500 nm. The depth T3 is illustrated in FIG. 14. Here, the depth T3 is larger than the length T1 (T3>T1). Also, the impurity concentration (n-type impurity concentration) of the n-type well NW can be set, for example, on the order of $1 \times 10^{16}/cm^3$ to $5 \times 10^{17}/cm^3$.

Here, the case has been described in which the p-type well PW is formed by ion implantation at step S3 first and then the n-type well NW is formed by ion implantation at step S4. In another mode, the p-type well PW may be formed by ion implantation at step S3 after the n-type well NW is formed by ion implantation at step S4.

The p-type well PW and the n-type well NW are each formed in the semiconductor substrate SB of the SOI substrate 1 over a predetermined depth from the upper surface of the semiconductor substrate SB. The depth of each of the p-type well PW and the n-type well NW is deeper than the depth of the device isolation region ST. That is, the depth position of the bottom surface of each of the p-type well PW and the n-type well NW is at a deeper level than the depth position of the bottom surface of the device isolation region ST. The p-type well PW is formed so as to include the nMIS formation region 1A and the power feeding region 2A when seen in a plan view, and the n-type well NW is formed so as to include the pMIS formation region 1B and the power feeding region 2B when seen in a plan view. In the semiconductor substrate SB, the p-type well PW and the n-type well NW are formed so as to be adjacent to each other, and the boundary between the p-type well PW and the n-type well NW (that is, a pn junction plane formed between the p-type well PW and the n-type well NW) is disposed under the device isolation region ST. The depth of the p-type well PW and the depth of the n-type well NW can be set approximately equal to each other. That is, the depth position of the bottom surface of the p-type well PW and the depth position of the bottom surface of the n-type well NW can be set approximately equal to each other.

Since the depth of the p-type well PW is deeper than the depth of the device isolation region ST, the p-type well PW is formed not only in the semiconductor substrate SB in the nMIS formation region 1A and the power feeding region 2A but also in the semiconductor substrate SB under the device isolation region ST. For this reason, in the semiconductor substrate SB, the p-type well PW is formed also under the device isolation region ST present between the nMIS formation region 1A and the power feeding region 2A when seen in a plan view.

Also, since the depth of the n-type well NW is deeper than the depth of the device isolation region ST, the n-type well NW is formed not only in the semiconductor substrate SB in the pMIS formation region 1B and the power feeding region 2B but also in the semiconductor substrate SB under the device isolation region ST. For this reason, in the semiconductor substrate SB, the n-type well NW is formed also under the device isolation region ST present between the pMIS formation region 1B and the power feeding region 2B when seen in a plan view.

Figure 15:
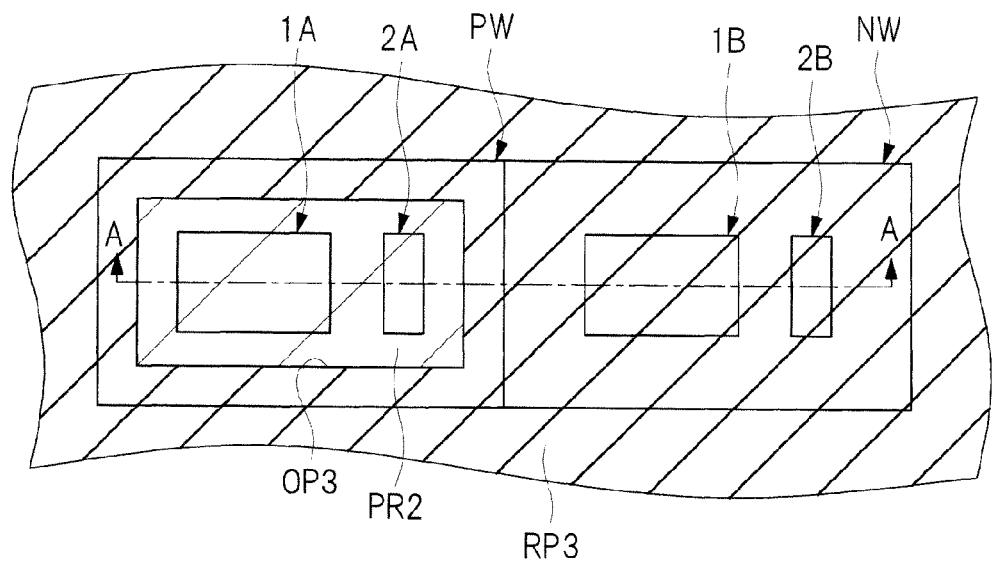
FIG. 15 is a plan view of main parts of the semiconductor device during the manufacturing process continued from FIG. 13 and FIG. 14.
Figure 16:
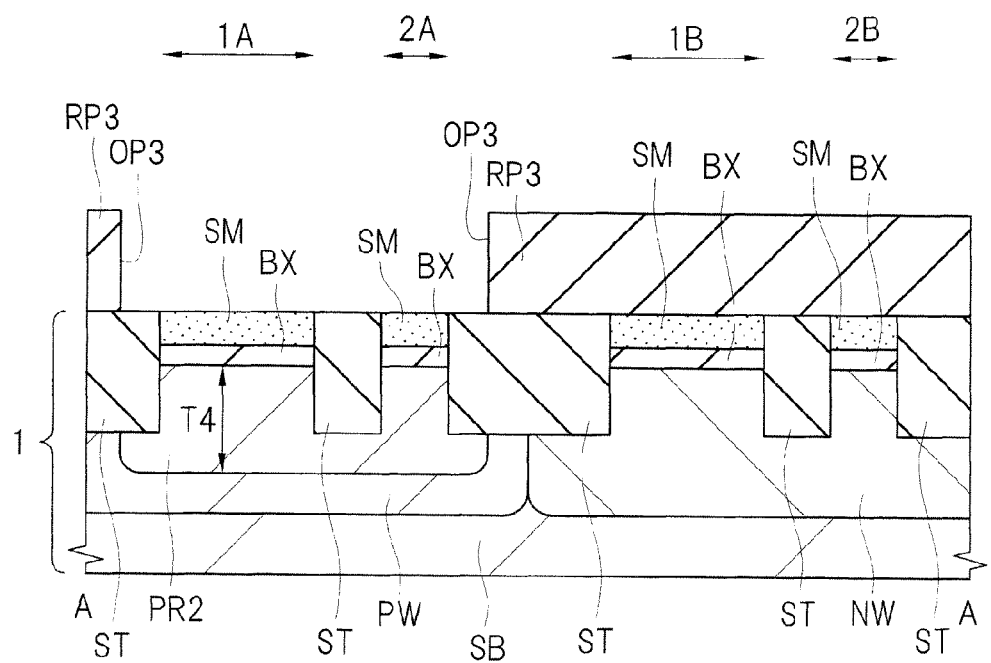
FIG. 16 is a cross-sectional view of main parts of the semiconductor device during the manufacturing process same as FIG. 15.

Next, as illustrated in FIG. 15 and FIG. 16, the p-type semiconductor region PR2 is formed by ion implantation in the semiconductor substrate SB of the SOI substrate 1 (step S5 of FIG. 6).

While FIG. 15 is a plan view, a photoresist pattern RP3 is hatched with bold diagonal lines, and a planar region where the p-type semiconductor region PR2 is formed is hatched with thin diagonal lines. FIG. 16 roughly corresponds to the cross-sectional view along the A-A line of FIG. 15.

At step S5, the p-type semiconductor region PR2 is formed by ion implantation of p-type impurities (for example, boron) in the semiconductor substrate SB of the SOI substrate 1. Specifically, first, as illustrated in FIG. 15 and FIG. 16, the photoresist pattern (mask layer) RP3 is formed as a mask layer on the main surface of the SOI substrate 1 by using photolithography. The photoresist pattern RP3 is formed so as to expose a p-type semiconductor region PR2 formation scheduled region and cover other regions (including the pMIS formation region 1B and the power feeding region 2B). That is, the photoresist pattern RP3 has an opening OP3 for exposing the p-type semiconductor region PR2 formation scheduled region. The opening OP3 contains the nMIS formation region 1A and the power feeding region 2A when seen in a plan view. Then, with the photoresist pattern RP3 being used as a mask (ion implantation blocking mask), p-type impurities (for example, boron) are ion-implanted in the semiconductor substrate SB of the SOI substrate 1 to form the p-type semiconductor region PR2. The p-type semiconductor region PR2 is formed so as to be aligned with the opening OP3 of the photoresist pattern RP3.

The impurity concentration (p-type impurity concentration) of the p-type semiconductor region PR2 is higher than that (p-type impurity concentration) of the p-type well PW. For this reason, the resistivity (specific resistance) of the p-type semiconductor region PR2 is lower than the resistivity of the p-type well PW.

The p-type semiconductor region PR2 is formed in the semiconductor substrate SB of the SOI substrate 1 over a predetermined depth from the upper surface of the semiconductor substrate SB. The depth of the p-type semiconductor region PR2 is shallower than the depth of the p-type well PW, and is deeper than the depth of the device isolation region ST. That is, the depth position of the bottom surface of the p-type semiconductor region PR2 is at a shallower level than the depth position of the bottom surface of the p-type well PW, and is at a deeper level than the depth position of the bottom surface of the device isolation region ST.

A depth T4 of the bottom surface of the p-type semiconductor region PR2 from the lower surface of the insulating layer BX (that is, the upper surface of the semiconductor substrate SB) can be set, for example, on the order of 1000 nm to 1500 nm. The depth T4 is illustrated in FIG. 16. Here, the depth T4 is larger than the length T1 and smaller than the length T2 (T1<T4<T2). Also, the impurity concentration (p-type impurity concentration) of the p-type semiconductor region PR2 is higher than that (p-type impurity concentration) of the p-type well PW, and can be set, for example, on the order of $5 \times 10^{17}/cm^3$ to $1 \times 10^{18}/cm^3$.

To make the depth of the p-type semiconductor region PR2 shallower than the depth of the p-type well PW, it is required in ion implantation at step S5 to set the implantation depth shallower than that at step S3. This can be achieved by, for example, making implantation energy for ion implantation at step S5 smaller than implantation energy for ion implantation at step S3.

Since the depth of the p-type semiconductor region PR2 is shallower than the depth of the p-type well PW and deeper than the depth of the device isolation region ST, the p-type semiconductor region PR2 is formed not only in the semiconductor substrate SB in the nMIS formation region 1A and the power feeding region 2A but also in the semiconductor substrate SB under the device isolation region ST. For this reason, in the semiconductor substrate SB, the p-type semiconductor region PR2 is formed also under the device isolation region ST present between the nMIS formation region 1A and the power feeding region 2A when seen in a plan view, and the p-type well PW is present under the p-type semiconductor region PR2.

The p-type semiconductor region PR2 is formed so as to be contained in the p-type well PW. For this reason, the entire bottom surface of the p-type semiconductor region PR2 is in contact with the p-type well PW, and the side surface of the p-type semiconductor region PR2 is in contact with the p-type well PW except a portion in contact with the device isolation region ST. That is, the bottom surface and the side surface of the p-type semiconductor region PR2 are surrounded by the p-type well PW except the portion in contact with the device isolation region ST. Since the p-type semiconductor region PR2 is formed so as to be contained in the p-type well PW the p-type semiconductor region PR2 is contained in the p-type well PW when seen in a plan view, and the bottom surface of the p-type semiconductor region PR2 is at a position at a shallower level than the bottom surface of the p-type well PW. However, the p-type semiconductor region PR2 is formed so as to include the nMIS formation region 1A and the power feeding region 2A when seen in a plan view.

In the semiconductor substrate SB of the SOI substrate 1, a planar region where p-type impurities are ion-implanted at step S5 to form the p-type semiconductor region PR2 is contained in a planar region where p-type impurities are ion-implanted at step S3 to form the p-type well PW. To achieve this, the planar dimension (planar area) of the opening OP3 of the photoresist pattern RP3 is smaller than the planar dimension (planar area) of the opening OP1 of the photoresist pattern RP1. When it is assumed that the photoresist pattern RP1 and the photoresist pattern RP3 are superposed each other, the opening OP3 of the photoresist pattern RP3 is contained in the opening OP1 of the photoresist pattern RP1 when seen in a plan view. Furthermore, as described above, by forming the p-type semiconductor region PR2 shallower than the p-type well PW, the p-type semiconductor region PR2 is contained in the p-type well PW.

Figure 17:
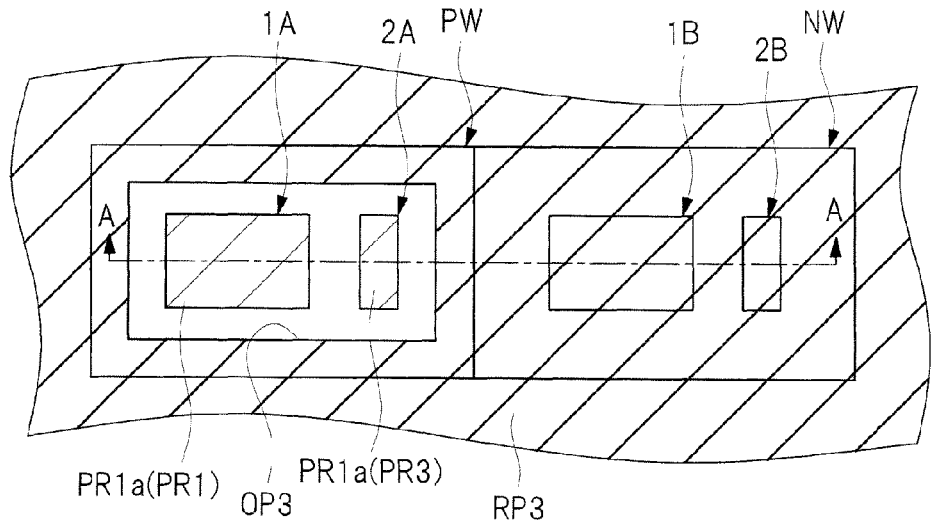
FIG. 17 is a plan view of main parts of the semiconductor device during the manufacturing process continued from FIG. 15 and FIG. 16.
Figure 18:
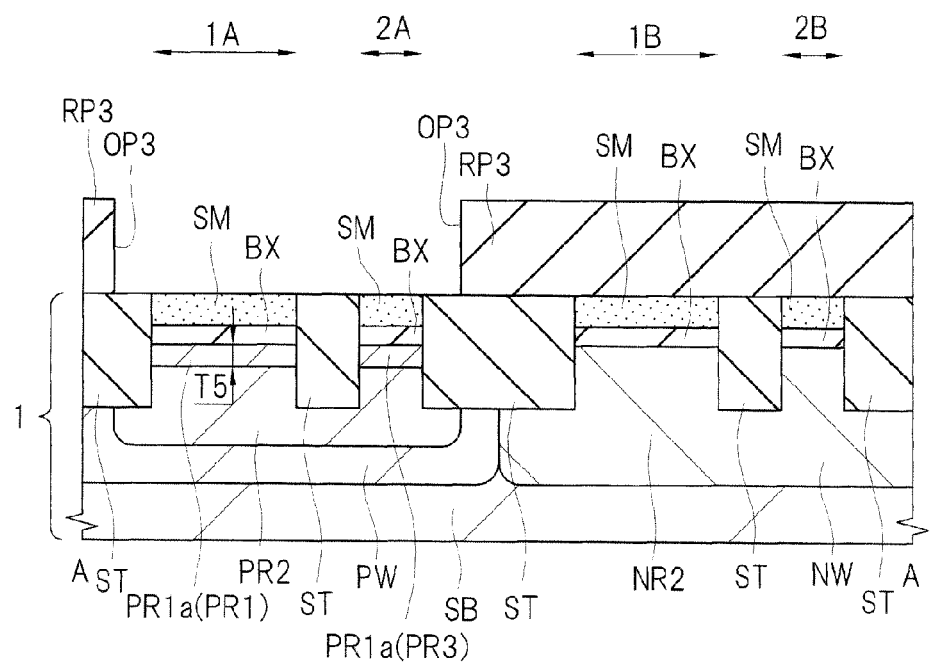
FIG. 18 is a cross-sectional view of main parts of the semiconductor device during the manufacturing process same as FIG. 17.

Next, as illustrated in FIG. 17 and FIG. 18, the p-type semiconductor region PR1a is formed by ion implantation in the semiconductor substrate SB of the SOI substrate 1 (step S6 of FIG. 6).

While FIG. 17 is a plan view, a photoresist pattern RP3 is hatched with bold diagonal lines, and a planar region where the p-type semiconductor region PR1 a is formed is hatched with thin diagonal lines. FIG. 18 roughly corresponds to the cross-sectional view along the A-A line of FIG. 17.

While the depth of the p-type semiconductor region PR2 is deeper than the depth of the device isolation region ST, the depth of the p-type semiconductor region PR1a is made shallower than the depth of the device isolation region ST. That is, while the depth position of the bottom surface of the p-type semiconductor region PR2 is at a deeper level than the depth position of the bottom surface of the device isolation region ST, the depth position of the bottom surface of the p-type semiconductor region PR1a is made at a shallower level than the depth position of the bottom surface of the device isolation region ST. For this reason, in ion implantation at step S6, it is required to set an implantation depth shallower than that in ion implantation at step S5. This can be achieved by, for example, making implantation energy for ion implantation at step S6 smaller than implantation energy for ion implantation at step S5.

A depth T5 of the bottom surface of the p-type semiconductor region PR1a from the lower surface of the insulating layer BX (that is, the upper surface of the semiconductor substrate SB) can be set, for example, on the order of 50 nm to 150 nm. The depth T5 is illustrated in FIG. 18. Here, the depth T5 is smaller than the length T1, smaller than the length T2, and smaller than the depth T4 (T5<T1, T5<T2, and T5<T4). Also, the impurity concentration (p-type impurity concentration) of the p-type semiconductor region PR1a is higher than that (p-type impurity concentration) of the p-type semiconductor region PR2, and can be set, for example, on the order of $2 \times 10^{18}/cm^3$ to $1 \times 10^{20}/cm^3$.

At step S6, the p-type semiconductor region PR1a is formed by ion implantation of p-type impurities (for example, boron) in the semiconductor substrate SB of the SOI substrate 1. Specifically, as illustrated in FIG. 17 and FIG. 18, with the photoresist pattern RP3 used at step S5 formed on the main surface of the SOI substrate 1, the photoresist pattern RP3 is used as a mask (ion implantation blocking mask) for ion implantation of p-type impurities (for example, boron) in the semiconductor substrate SB of the SOI substrate 1, thereby forming the p-type semiconductor region PR1a. That is, ion implantation at step S5 and ion implantation at step S6 can be performed by using the same photoresist pattern RP3 as a mask (ion implantation blocking mask). After the ion implantation at step S5 and the ion implantation at step S6, the photoresist pattern RP3 is removed.

As described above, the p-type semiconductor region PR1a and the p-type semiconductor region PR2 are formed by different ion implantation by using the same photoresist pattern RP3 as a mask, and the p-type semiconductor region PR2 is formed so as to be deeper than the device isolation region ST and the p-type semiconductor region PR1a is formed so as to be shallower than the device isolation region ST. For this reason, the p-type semiconductor region PR1a is formed in a region where the device isolation region ST is not formed in the region where the p-type semiconductor region PR2 is formed, when seen in a plan view. Since opening OP3 of the photoresist pattern RP3 contains the nMIS formation region 1A and the power feeding region 2A in plan view, the p-type semiconductor region PR1a is formed on a front surface layer portion of the semiconductor substrate SB in the nMIS formation region 1A and the power feeding region 2A.

Since the p-type semiconductor region PR1a is formed on the front surface layer portion of the semiconductor substrate SB in the nMIS formation region 1A and the power feeding region 2A, the p-type semiconductor region PR1a is formed on an upper part (front surface layer part) of the p-type semiconductor region PR2 in the nMIS formation region 1A and the p-type semiconductor region PR1a is formed on an upper part (front surface layer part) of the p-type semiconductor region PR2 in the power feeding region 2A. Since the p-type semiconductor region PR1a is formed so as to be shallower than the device isolation region ST, the p-type semiconductor region PR1a is not formed under the device isolation region ST. For this reason, the p-type semiconductor region PR1a formed in the nMIS formation region 1A and the p-type semiconductor region PR1a formed in the power feeding region 2A are not linked to each other, and are separated by the device isolation region ST.

Here, the p-type semiconductor region PR1a formed in the semiconductor substrate SB in the nMIS formation region 1A is provided with a reference character PR1 and is referred to as the p-type semiconductor region PR1, and the p-type semiconductor region PR1a formed in the semiconductor substrate SB in the power feeding region 2A is provided with a reference character PR3 and is referred to as the p-type semiconductor region PR3. That is, at step S6, with the same ion implantation process, the p-type semiconductor region PR1 is formed in the semiconductor substrate SB in the nMIS formation region 1A, and the p-type semiconductor region PR3 is formed in the semiconductor substrate SB in the power feeding region 2A.

The impurity concentration (p-type impurity concentration) of the p-type semiconductor region PR1a (that is, the p-type semiconductor regions PR1 and PR3) is higher than that (p-type impurity concentration) of the p-type semiconductor region PR2. For this reason, the resistivity (specific resistance) of the p-type semiconductor region PR1a (that is, the p-type semiconductor regions PR1 and PR3) is lower than the resistivity of the p-type semiconductor region PR2. The impurity concentration (p-type impurity concentration) of the p-type semiconductor region PR1 and the impurity concentration (p-type impurity concentration) of the p-type semiconductor region PR3 are approximately similar to each other.

The p-type semiconductor region PR1 is surrounded therearound by device isolation region ST when seen in a plan view, the side surface of the p-type semiconductor region PR1 is in contact with the device isolation region ST, the upper surface of the p-type semiconductor region PR1 is in contact with the insulating layer BX, and the bottom surface of the p-type semiconductor region PR1 is in contact with the p-type semiconductor region PR2. That is, the side surface of the p-type semiconductor region PR1 is surrounded by the device isolation region ST, and the bottom surface of the p-type semiconductor region PR1 is covered with the p-type semiconductor region PR2. Also, the p-type semiconductor region PR3 is surrounded therearound by the device isolation region ST, the side surface of the p-type semiconductor region PR3 is in contact with the device isolation region ST, the upper surface of the p-type semiconductor region PR3 is in contact with the insulating layer BX, and the bottom surface of the p-type semiconductor region PR3 is in contact with the p-type semiconductor region PR2. That is, the side surface of the p-type semiconductor region PR3 is surrounded by the device isolation region ST, and the bottom surface of the p-type semiconductor region PR3 is covered with the p-type semiconductor region PR2. While the depth position of the bottom surface of the p-type semiconductor region PR1 and the depth position of the bottom surface of the p-type semiconductor region PR3 are approximately equal to each other, they are at a shallower level than the depth position of the bottom surface of the device isolation region ST, as described above.

When the p-type well PW, the p-type semiconductor region PR2, and the p-type semiconductor region PR1a (PR1 and PR3) are formed at steps S3, S5, and S6, the p-type semiconductor region PR1 is formed on the front surface layer portion of the semiconductor substrate SB, the p-type semiconductor region PR2 is present under the p-type semiconductor region PR1, and the p-type well PW is present under the p-type semiconductor region PR2, in the nMIS formation region 1A. In the power feeding region 2A, the p-type semiconductor region PR3 is formed on the front surface layer portion of the semiconductor substrate SB, the p-type semiconductor region PR2 is present under the p-type semiconductor region PR3, and the p-type well PW is present under the p-type semiconductor region PR2. Also, when seen in a plan view, the p-type semiconductor region PR2 is present under the device isolation region ST present between the nMIS formation region 1A and the power feeding region 2A, and the p-type well PW is present under the p-type semiconductor region PR2.

Figure 19:
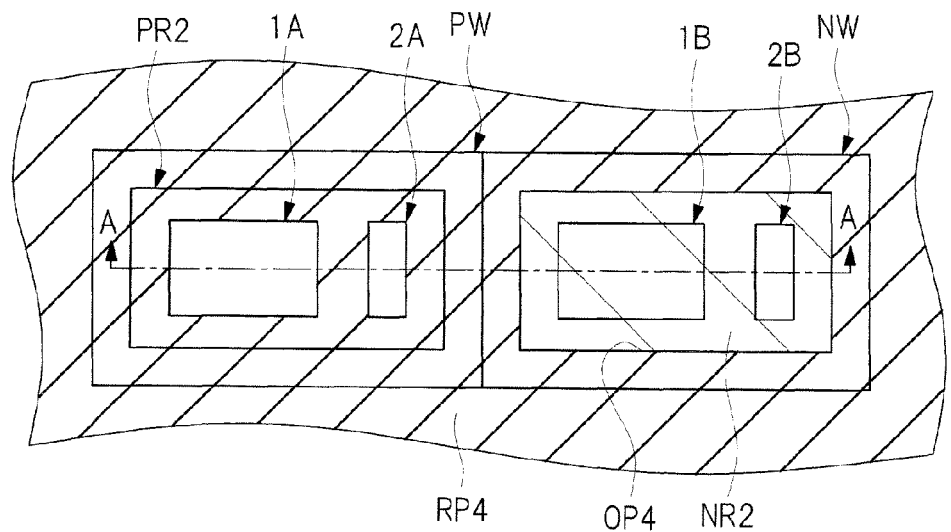
FIG. 19 is a plan view of main parts of the semiconductor device during the manufacturing process continued from FIG. 17 and FIG. 18.
Figure 20:
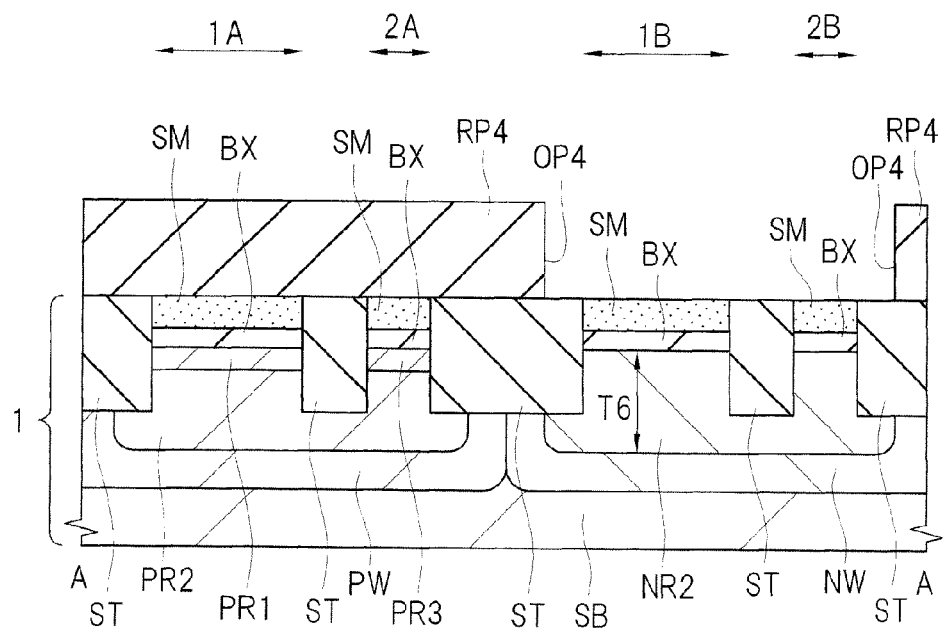
FIG. 20 is a cross-sectional view of main parts of the semiconductor device during the manufacturing process same as FIG. 19.

Next, as illustrated in FIG. 19 and FIG. 20, the n-type semiconductor region NR2 is formed by ion implantation in the semiconductor substrate SB of the SOI substrate 1 (step S7 of FIG. 6).

While FIG. 19 is a plan view, a photoresist pattern RP4 is hatched with bold diagonal lines, and a planar region where the n-type semiconductor region NR2 is formed is hatched with thin diagonal lines. FIG. 20 roughly corresponds to the cross-sectional view along the A-A line of FIG. 19.

At step S7, the n-type semiconductor region NR2 is formed by ion implantation of n-type impurities (for example, phosphorous or arsenic) in the semiconductor substrate SB of the SOI substrate 1. Specifically, first, as illustrated in FIG. 19 and FIG. 20, the photoresist pattern (mask layer) RP4 is formed as a mask layer on the main surface of the SOI substrate 1 by using photolithography. The photoresist pattern RP4 is formed so as to expose an n-type semiconductor region NR2 formation scheduled region and cover other regions (including the nMIS formation region 1A and the power feeding region 2A). That is, the photoresist pattern RP4 has an opening OP4 for exposing the n-type semiconductor region NR2 formation scheduled region. The opening OP4 contains the pMIS formation region 1B and the power feeding region 2B when seen in a plan view. Then, with the photoresist pattern RP4 being used as a mask (ion implantation blocking mask), n-type impurities (for example, phosphorous or arsenic) are ion-implanted in the semiconductor substrate SB of the SOI substrate 1 to form the n-type semiconductor region NR2. The n-type semiconductor region NR2 is formed so as to be aligned with the opening OP4 of the photoresist pattern RP4.

The impurity concentration (n-type impurity concentration) of the n-type semiconductor region NR2 is higher than that (n-type impurity concentration) of the n-type well NW.

For this reason, the resistivity (specific resistance) of the n-type semiconductor region NR2 is lower than the resistivity of the n-type well NW, The n-type semiconductor region NR2 is formed in the semiconductor substrate SB of the SOI substrate 1 over a predetermined depth from the upper surface of the semiconductor substrate SB. The depth of the n-type semiconductor region NR2 is shallower than the depth of the n-type NW, and is deeper than the depth of the device isolation region ST. That is, the depth position of the bottom surface of the n-type semiconductor region NR2 is at a shallower level than the depth position of the bottom surface of the n-type well NW, and is at a deeper level than the depth position of the bottom surface of the device isolation region ST.

A depth T6 of the bottom surface of the n-type semiconductor region NR2 from the lower surface of the insulating layer BX (that is, the upper surface of the semiconductor substrate SB) can be set, for example, on the order of 1000 nm to 1500 nm. The depth T6 is illustrated in FIG. 20. Here, the depth T6 is larger than the length T1 and is smaller than the length T3 (T1<T6<T3). Also, the impurity concentration (n-type impurity concentration) of the n-type semiconductor region NR2 is higher than that (n-type impurity concentration) of the n-type well NW, and can be set, for example, on the order of $5\times10^{17}/cm^3$ to $1\times10^{18}/cm^3$.

To make the depth of the n-type semiconductor region NR2 shallower than the depth of the n-type well NW, it is required in ion implantation at step S7 to set the implantation depth shallower than that at step S4. This can be achieved by, for example, making implantation energy for ion implantation at step S7 smaller than implantation energy for ion implantation at step S4.

Since the depth of the n-type semiconductor region NR2 is shallower than the depth of the n-type well NW and deeper than the depth of the device isolation region ST, the n-type semiconductor region NR2 is formed not only in the semiconductor substrate SB in the pMIS formation region 1B and the power feeding region 2B but also in the semiconductor substrate SB under the device isolation region ST. For this reason, in the semiconductor substrate SB, the n-type semiconductor region NR2 is formed also under the device isolation region ST present between the pMIS formation region 1B and the power feeding region 2B when seen in a plan view, and the n-type well NW is present under the n-type semiconductor region NR2.

The n-type semiconductor region NR2 is formed so as to be contained in the n-type well NW. For this reason, the entire bottom surface of the n-type semiconductor region NR2 is in contact with the n-type well NW, and the side surface of the n-type semiconductor region NR2 is in contact with the n-type well NW except a portion in contact with the device isolation region ST. That is, the bottom surface and the side surface of the n-type semiconductor region NR2 are surrounded by the n-type well NW except the portion in contact with the device isolation region ST. Since the n-type semiconductor region NR2 is formed so as to be contained in the n-type well NW, the n-type semiconductor region NR2 is contained in the n-type well NW when seen in a plan view, and the bottom surface of the n-type semiconductor region NR2 is at a position shallower than the bottom surface of the n-type well NW. However, the n-type semiconductor region NR2 is formed so as to include the pMIS formation region 1B and the power feeding region 2B when seen in a plan view.

In the semiconductor substrate SB of the SOI substrate 1, a planar region where n-type impurities are ion-implanted at step S7 to form the n-type semiconductor region NR2 is contained in a planar region where n-type impurities are ion-implanted at step S4 to form the n-type well NW. To achieve this, the planar dimension (planar area) of the opening OP4 of the photoresist pattern RP4 is smaller than the planar dimension (planar area) of the opening OP2 of the photoresist pattern RP2. When it is assumed that the photoresist pattern RP4 and the photoresist pattern RP2 are superposed each other, the opening OP4 of the photoresist pattern RP4 is contained in the opening OP2 of the photoresist pattern RP2 when seen in a plan view. Furthermore, as described above, by forming the n-type semiconductor region NR2 shallower than the n-type well NW, the n-type semiconductor region NR2 is contained in the n-type well NW.

Next, as illustrated in FIG. 21 to FIG. 24, the n-type semiconductor region NR1a is formed by ion implantation in the semiconductor substrate SB of the SOI substrate 1 (step S8 of FIG. 6).

Figure 21:
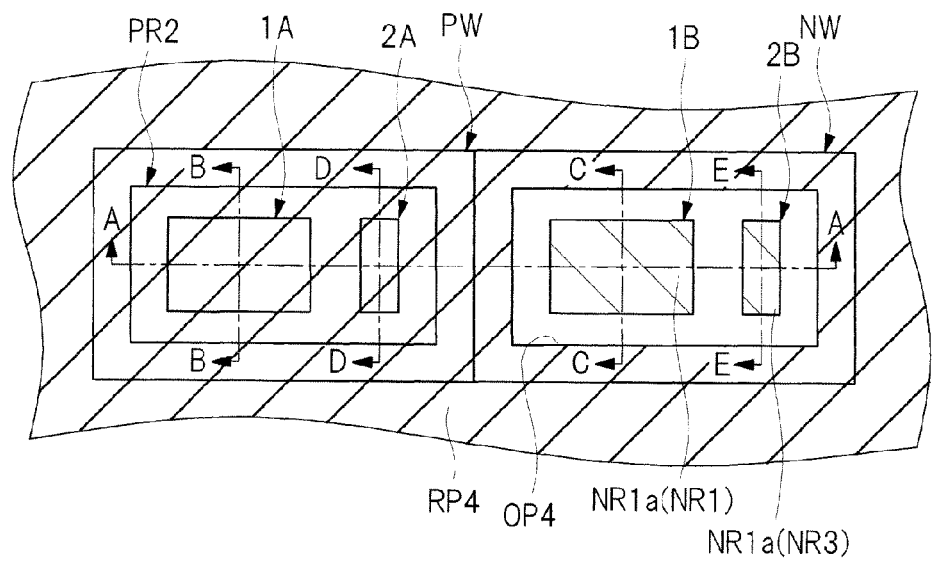
FIG. 21 is a plan view of main parts of the semiconductor device during the manufacturing process continued from FIG. 19 and FIG. 20.

While FIG. 21 is a plan view, a photoresist pattern RP4 is hatched with bold diagonal lines, and a planar region where the n-type semiconductor region NR1a is formed is hatched with thin diagonal lines. Also, FIG. 22 roughly corresponds to the cross-sectional view along the A-A line of FIG. 21, FIG. 23 roughly corresponds to the cross-sectional view along the B-B line of FIG. 21 (at left in FIG. 23) and the cross-sectional view along the C-C line of FIG. 21 (at right in FIG. 23), and FIG. 24 roughly corresponds to the cross-sectional view along the D-D line of FIG. 21 (at left in FIG. 24) and the cross-sectional view along the E-E line of FIG. 21 (at right in FIG. 24).

While the depth of the n-type semiconductor region NR2 is deeper than the depth of the device isolation region ST, the depth of the n-type semiconductor region NR1a is made shallower than the depth of the device isolation region ST. That is, while the depth position of the bottom surface of the n-type semiconductor region NR2 is at a deeper level than the depth position of the bottom surface of the device isolation region ST, the depth position of the bottom surface of the n-type semiconductor region NR1a is made at a shallower level than the depth position of the bottom surface of the device isolation region ST. For this reason, in ion implantation at step S8, it is required to set an implantation depth shallower than that in ion implantation at step S7. This can be achieved by, for example, making implantation energy for ion implantation at step S8 smaller than implantation energy for ion implantation at step S7.

Figure 22:
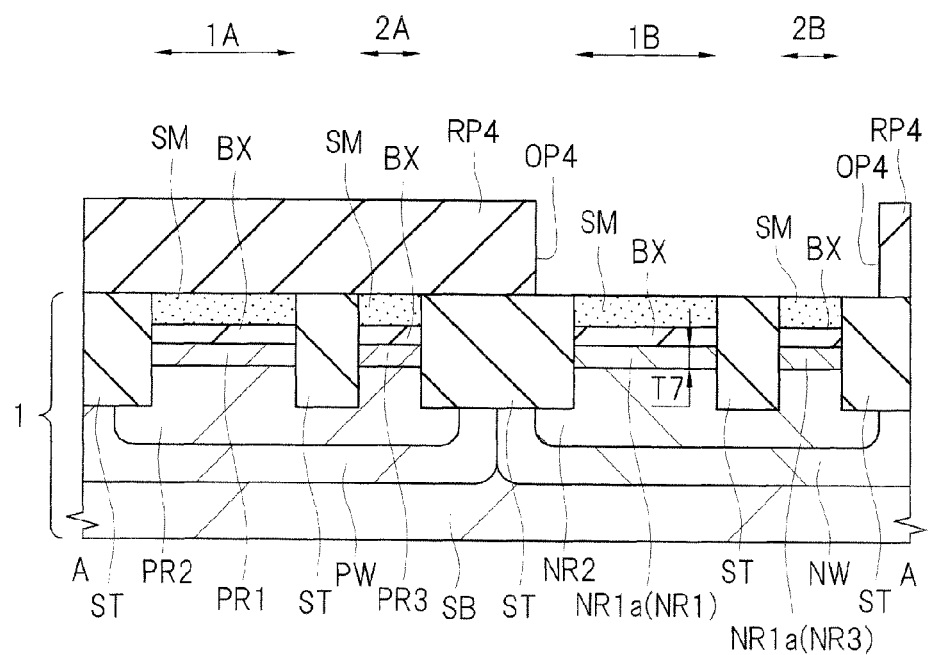
FIG. 22 is a cross-sectional view of main parts of the semiconductor device during the manufacturing process same as FIG. 21.
Figure 23:
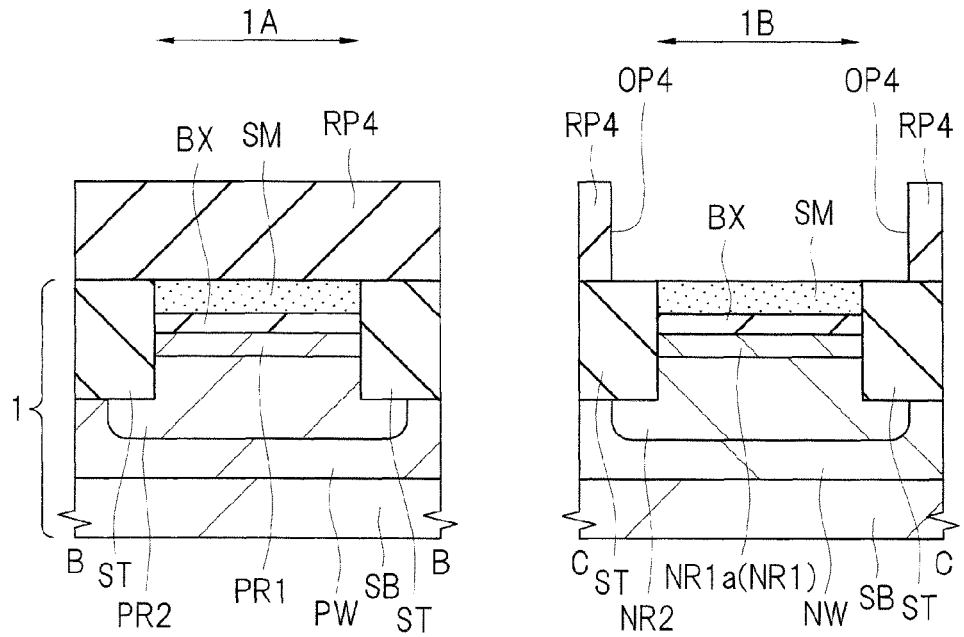
FIG. 23 is a cross-sectional view of main parts of the semiconductor device during the manufacturing process same as FIG. 21.
Figure 24:
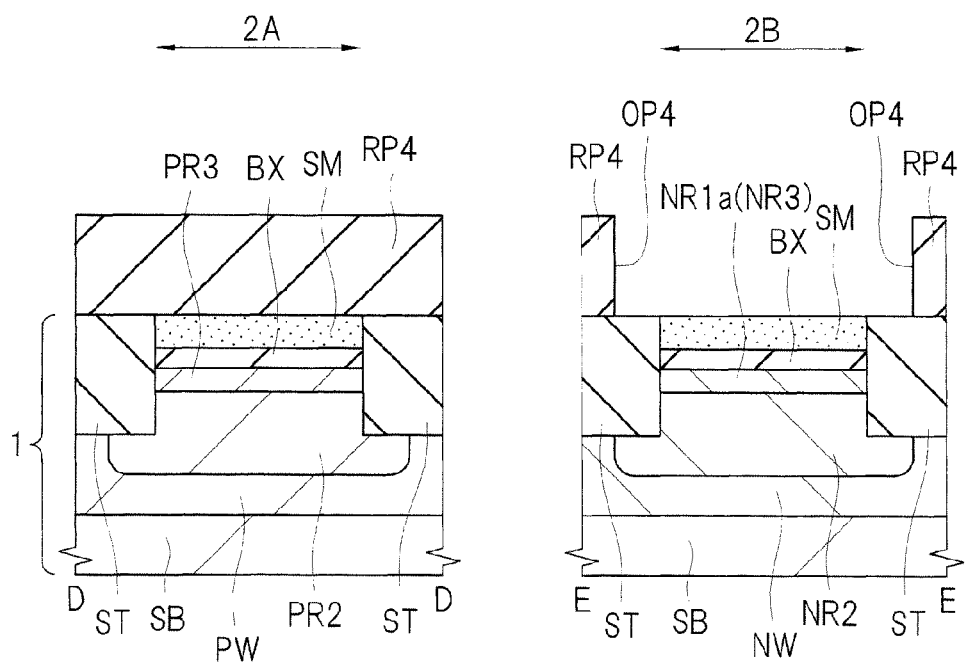
FIG. 24 is a cross-sectional view of main parts of the semiconductor device during the manufacturing process same as FIG. 21.

A depth T7 of the bottom surface of the n-type semiconductor region NR1a from the lower surface of the insulating layer BX (that is, the upper surface of the semiconductor substrate SB) can be set, for example, on the order of 50 nm to 150 nm. The depth T7 is illustrated in FIG. 22. Here, the depth T7 is smaller than the length T1, smaller than the length T3, and smaller than the depth T6 (T7<T1, T7<T3, and T7<T6). Also, the impurity concentration (n-type impurity concentration) of the n-type semiconductor region NR1a is higher than that (n-type impurity concentration) of the n-type semiconductor region NR2, and can be set, for example, on the order of $2\times10^{18}/cm^3$ to $1\times10^{20}/cm^3$.

At step S8, the n-type semiconductor region NR1a is formed by ion implantation of n-type impurities (for example, phosphorous or arsenic) in the semiconductor substrate SB of the SOI substrate 1. Specifically, as illustrated in FIG. 21 to FIG. 24, with the photoresist pattern RP4 used at step S7 formed on the main surface of the SOI substrate 1, the photoresist pattern RP4 is used as a mask (ion implantation blocking mask) for ion implantation of n-type impurities (for example, phosphorous or arsenic) in the semiconductor substrate SB of the SOI substrate 1, thereby forming the n-type semiconductor region NR1a. That is, ion implantation at step S7 and ion implantation at step S8 can be performed by using the same photoresist pattern RP4 as a mask (ion implantation blocking mask). After the ion implantation at step S7 and the ion implantation at step S8, the photoresist pattern RP4 is removed.

As described above, the n-type semiconductor region NR1a and the n-type semiconductor region NR2 are formed by different ion implantation by using the same photoresist pattern RP4 as a mask, and the n-type semiconductor region NR2 is formed so as to be deeper than the device isolation region ST and the n-type semiconductor region NR1a is formed so as to be shallower than the device isolation region ST. For this reason, the n-type semiconductor region NR1a is formed in a region where the device isolation region ST is not formed in the region where the n-type semiconductor region NR2 is formed, when seen in a plan view. Since opening OP4 of the photoresist pattern RP4 contains the pMIS formation region 1B and the power feeding region 2B in plan view, the n-type semiconductor region NR1a is formed on a front surface layer portion of the semiconductor substrate SB in the pMIS formation region 1B and the power feeding region 2B.

Since the n-type semiconductor region NR1a is formed on the front surface layer portion of the semiconductor substrate SB in the pMIS formation region 1B and the power feeding region 2B, the n-type semiconductor region NR1a is formed on an upper part (front surface layer part) of the n-type semiconductor region NR2 in the nMIS formation region 1B and the n-type semiconductor region NR1a is formed on an upper part (front surface layer part) of the n-type semiconductor region NR2 in the power feeding region 2B. Since the n-type semiconductor region NR1a is formed so as to be shallower than the device isolation region ST, the n-type semiconductor region NR1a is not formed under the device isolation region ST. For this reason, the n-type semiconductor region NR1a formed in the pMIS formation region 1B and the n-type semiconductor region NR1a formed in the power feeding region 2B are not linked to each other, and are separated by the device isolation region ST.

Here, the n-type semiconductor region NR1a formed in the semiconductor substrate SB in the pMIS Formation region 1B is provided with a reference character NR1 and is referred to as the n-type semiconductor region NR1, and the n-type semiconductor region NR1a formed in the semiconductor substrate SB in the power feeding region 2B is provided with a reference character NR3 and is referred to as the n-type semiconductor region NR3. That is, at step S8, with the same ion implantation process, the n-type semiconductor region NR1 is formed in the semiconductor substrate SB in the pMIS formation region 1B, and the n-type semiconductor region NR3 is formed in the semiconductor substrate SB in the power feeding region 2B.

The impurity concentration (n-type impurity concentration) of the n-type semiconductor region NR1a (that is, the n-type semiconductor regions NR1 and NR3) is higher than that (n-type impurity concentration) of the n-type semiconductor region NR2. For this reason, the resistivity of the n-type semiconductor region NR1a (that is, the n-type semiconductor regions NR1 and NR3) is lower than the resistivity of the n-type semiconductor region NR2. The impurity concentration (n-type impurity concentration) of the n-type semiconductor region NR1 and the impurity concentration (n-type impurity concentration) of the n-type semiconductor region NR3 are approximately similar to each other.

The n-type semiconductor region NR1 is surrounded therearound by device isolation region ST when seen in a plan view, the side surface of the n-type semiconductor region NR1 is in contact with the device isolation region ST, the upper surface of the n-type semiconductor region NR1 is in contact with the insulating layer BX, and the bottom surface of the n-type semiconductor region NR1 is in contact with the n-type semiconductor region NR2. That is, the side surface of the n-type semiconductor region NR1 is surrounded by the device isolation region ST, and the bottom surface of the n-type semiconductor region NR1 is covered with the n-type semiconductor region NR2. Also, the n-type semiconductor region NR3 is surrounded therearound by the device isolation region ST, the side surface of the n-type semiconductor region NR3 is in contact with the device isolation region ST, the upper surface of the n-type semiconductor region NR3 is in contact with the insulating layer BX, and the bottom surface of the n-type semiconductor region NR3 is in contact with the n-type semiconductor region NR2. That is, the side surface of the n-type semiconductor region NR3 is surrounded by the device isolation region ST, and the bottom surface of the n-type semiconductor region NR3 is covered with the n-type semiconductor region NR2. While the depth position of the bottom surface of the n-type semiconductor region NR1 and the depth position of the bottom surface of the n-type semiconductor region NR3 are approximately equal to each other, they are at a shallower level than the depth position of the bottom surface of the device isolation region ST, as described above.

When the n-type well NW, the n-type semiconductor region NR2, and the n-type semiconductor region NR1a (NR1 and NR3) are formed at steps S4, S7, and S8, the n-type semiconductor region NR1 is formed on the front surface layer portion of the semiconductor substrate SB, the n-type semiconductor region NR2 is present under the n-type semiconductor region NR1, and the n-type well NW is present under the n-type semiconductor region NR2, in the pMIS formation region 1B. In the power feeding region 2B, the n-type semiconductor region NR3 is formed on the front surface layer portion of the semiconductor substrate SB, the n-type semiconductor region NR2 is present under the n-type semiconductor region NR3, and the n-type well NW is present under the n-type semiconductor region NR2. Also, when seen in a plan view, the n-type semiconductor region NR2 is present under the device isolation region ST present between the pMIS formation region 1B and the power feeding region 2B, and the n-type well NW is present under the n-type semiconductor region NR2.

Here, the case has been described in which the p-type semiconductor region PR2 and the p-type semiconductor region PR1a are formed at steps S5 and S6 first and then the n-type semiconductor region NR2 and the n-type semiconductor region NR1a are formed at steps S7 and S8. In another mode, the p-type semiconductor region PR2 and the p-type semiconductor region PR1a may be formed at steps S5 and S6 after the n-type semiconductor region NR2 and the n-type semiconductor region NR1a are formed at steps S7 and S8.

Next, as illustrated in FIG. 25 to FIG. 28, the semiconductor layer SM and the insulating layer BX in the power feeding regions 2A and 2B are removed (step S9 of FIG. 7).

Figure 25:
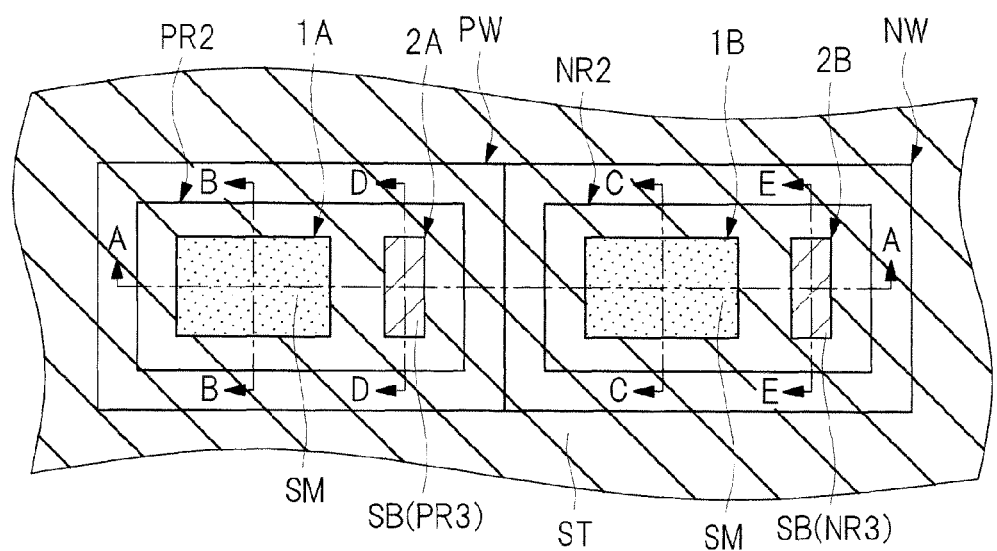
FIG. 25 is a plan view of maid parts of the semiconductor device during the manufacturing process continued from FIG. 21 to FIG. 24.
Figure 26:
FIG. 26 is a cross-sectional view of main parts of the semiconductor device during the manufacturing process same as FIG. 25.
Figure 26:
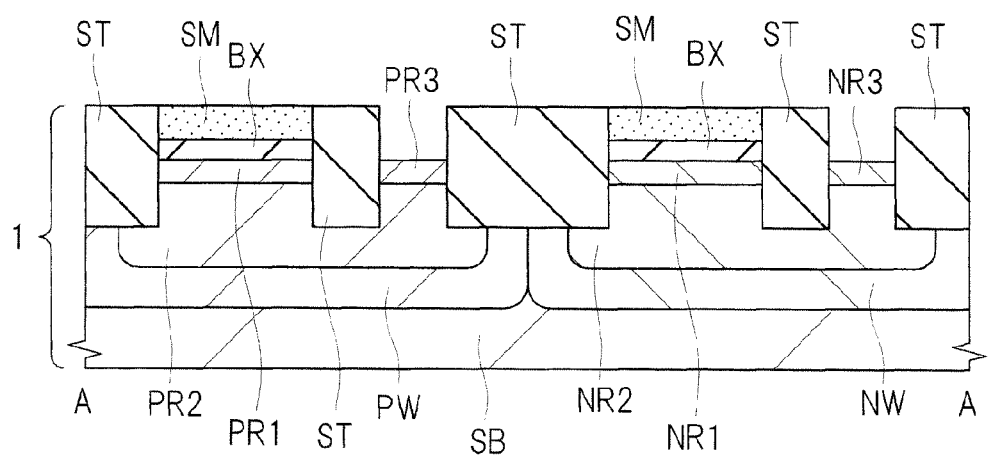
Figure 27:
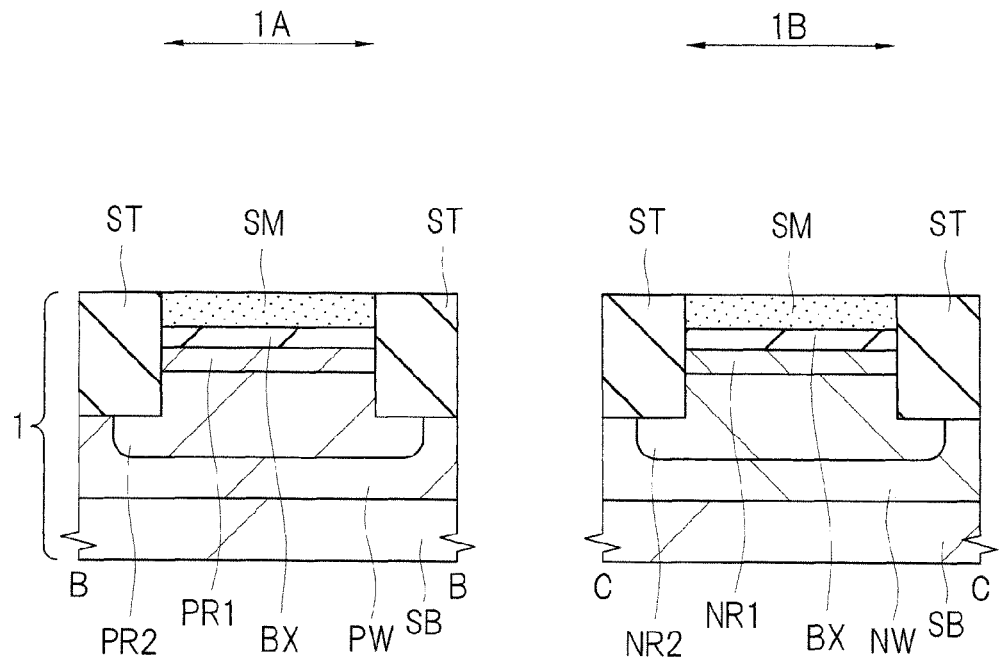
FIG. 27 is a cross-sectional view of main parts of the semiconductor device during the manufacturing process same as FIG. 25.
Figure 28:
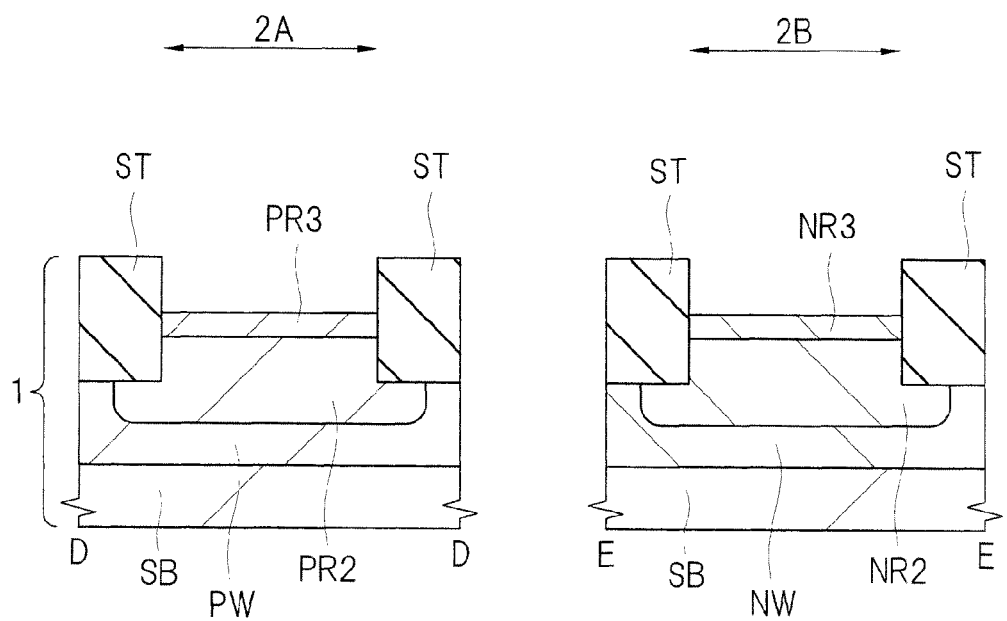
FIG. 28 is a cross-sectional view of main parts of the semiconductor device during the manufacturing process same as FIG. 25.

While FIG. 25 is a plan view, the device isolation region ST is hatched with bold diagonal lines, the semiconductor layer SM is hatched with dots, and an exposure region of the semiconductor substrate SB is hatched with thin diagonal lines. Also, FIG. 26 roughly corresponds to the cross-sectional view along the A-A line of FIG. 25, FIG. 27 roughly corresponds to the cross-sectional view along the B-B line of FIG. 25 (at left in FIG. 27) and the cross-sectional view along the C-C line of FIG. 25 (at right in FIG. 27), and FIG. 28 roughly corresponds to the cross-sectional view along the D-D line of FIG. 25 (at left in FIG. 28) and the cross-sectional view along the E-E line of FIG. 25 (at right in FIG. 28).

Step S9 can be performed as follows, for example. That is, the power feeding regions 2A and 2B are exposed, and a photoresist layer (not illustrated) to cover the other regions is formed on the main surface of the SOI substrate 1 by using photolithography. Then, by using the photoresist layer an etching mask, the semiconductor layer SM and the insulating layer BX in each of the power feeding regions 2A and 2B are etched for removal. Then, the photoresist layer is removed. With this, as illustrated in FIG. 25 to FIG. 28, in the SOI substrate 1, the semiconductor layer SM and the insulating layer BX in each of the power feeding regions 2A and 2B can be selectively removed. In the power feeding regions 2A and 2B, with the semiconductor layer SM and the insulating layer BX removed therefrom, the (upper surface of) semiconductor substrate SB is exposed. Specifically the front surface (upper surface) of the p-type semiconductor region PR3 is exposed in the power feeding region 2A, and the front surface (upper surface) of the n-type semiconductor region NR3 is exposed in the power feeding region 2B.

In the present embodiment, the p-type well PW, the n-type well NW, the p-type semiconductor region PR2, the p-type semiconductor region PR1a (PR1 and PR3), the n-type semiconductor region NR2, and the n-type semiconductor region NR1a (NR1 and NR3) are each formed by ion implantation, and then the semiconductor layer SM and the insulating layer BX in each of the power feeding regions 2A and 2B are removed at step S9. In another mode, the following procedure can be performed. That is, after the device isolation region ST is formed at step S2, step S9 is performed to remove the semiconductor layer SM and the insulating layer BX in each of the power feeding regions 2A and 2B, and then the p-type well PW, the n-type well NW, the p-type semiconductor region PR2, the p-type semiconductor region PR1a (PR1 and PR3), the n-type semiconductor region NR2, and the n-type semiconductor region NR1a (NR1 and NR3) are each formed by ion implantation.

Also, it is required to perform ion implantation for forming the p-type well PW, the n-type well NW, the p-type semiconductor region PR2, the p-type semiconductor region PR1a, the n-type semiconductor region NR2, and the n-type semiconductor region NR1a after the device isolation region ST is formed at step S2 and before the MISFETs (Qn and Qp) are formed at steps S10 and S11, which will be described further below. Also, it is required to perform step S9 after the device isolation region ST is formed at step S2 and before the MISFETs (Qn and Qp) are formed at steps S10 and S11, which will be described further below.

Figure 29:
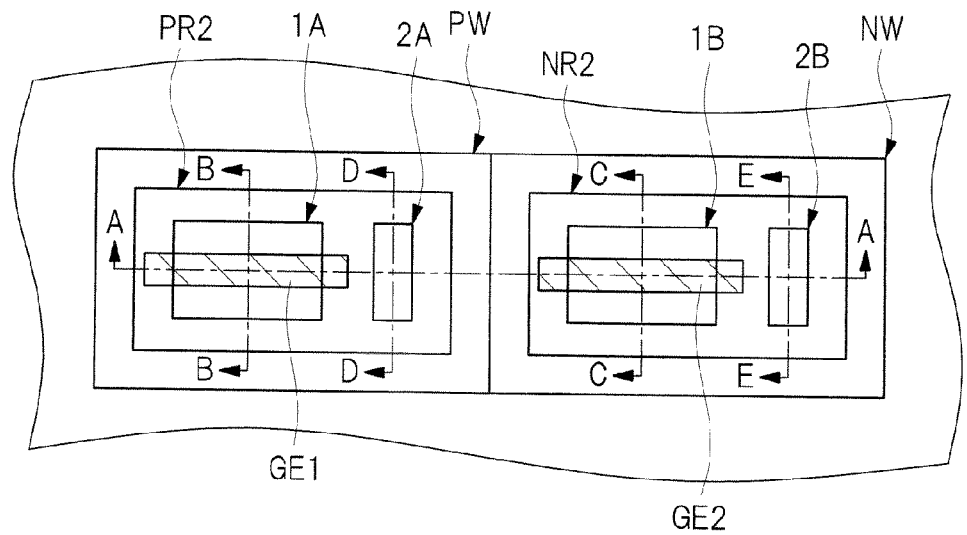
FIG. 29 is a plan view of main parts of the semiconductor device during the manufacturing process continued from FIG. 25 to FIG. 28.
Figure 30:
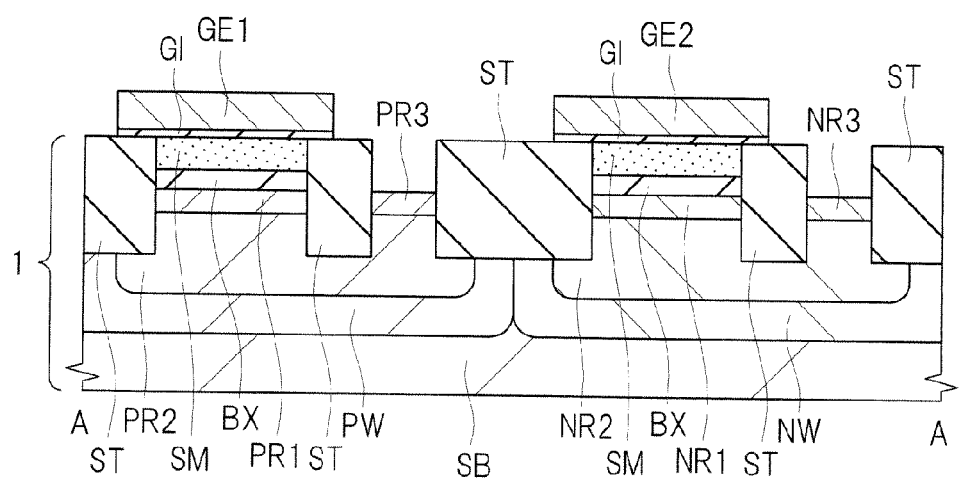
FIG. 30 is a cross-sectional view of main parts of the semiconductor device during the manufacturing process same as FIG. 29.
Figure 31:
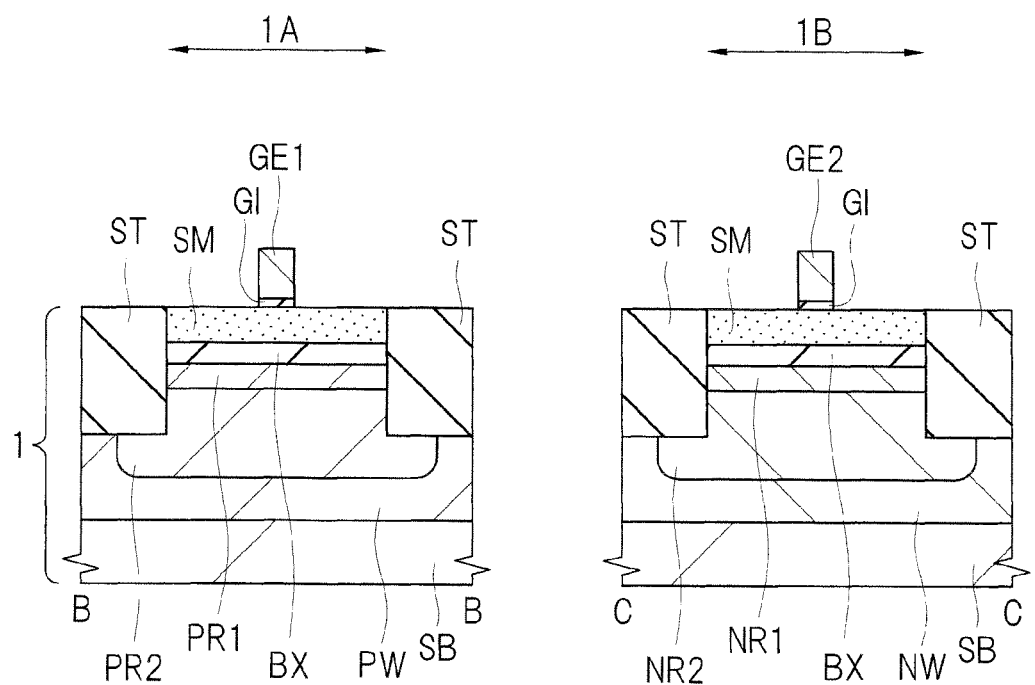
FIG. 31 is a cross-sectional view of main parts of the semiconductor device during the manufacturing process same as FIG. 29.

Next, as illustrated in FIG. 29 to FIG. 31, the gate electrode GE1 is formed on the semiconductor layer SM in the nMIS formation region 1A via the gate insulating film GI, and the gate electrode GE2 is formed on the semiconductor layer SM in the pMIS formation region 1B via the gate insulating film GI (step S10 of FIG. 7).

While FIG. 29 is a plan view, the gate electrodes GE1 and GE2 are hatched with thin diagonal lines. FIG. 30 roughly corresponds to the cross-sectional view along the A-A line of FIG. 29, and FIG. 31 roughly corresponds to the cross-sectional view along the B-B line of FIG. 29 (at left in FIG. 31) and the cross-sectional view along the C-C line of FIG. 29 (at right in FIG. 31).

Specifically, step S10 can be performed as follows, for example.

That is, after the front surface (main surface) of the SOI substrate 1 is cleaned by, for example, wet etching using hydrofluoric acid (HF), an insulating film for the gate insulating film GI is formed on the front surface of the semiconductor layer SM in each of the nMIS formation region 1A and the pMIS formation region 1B. Here, an insulating film corresponding to the insulating film for the gate insulating film GI formed in each of the nMIS formation region 1A and the pMIS formation region 1B can be formed on the front surface of the semiconductor substrate SB exposed in each of the power feeding regions 2A and 2B. As the insulating film for the gate insulating film GI, a silicon oxide film can be used, for example. The insulating film can be formed by thermal oxidation or the like. Also, the insulating film for the gate insulating film GI can be formed by depositing a silicon oxide film by using CVD or the like. Also, in place of the silicon oxide film, a silicon oxynitride film can be used. Alternatively, as the insulating film for the gate insulating film GI, a high-permittivity film (high-k film) with a permittivity higher than that of silicon nitride may be used.

Then, a conductive film for the gate electrodes (for example, a polysilicon film) is formed on the main surface of the SOI substrate 1, that is, on the insulating film for the gate insulating film GI. Then, the conductive film for the gate electrodes is patterned by using photolithography and etching, thereby forming the gate electrodes GE1 and GE2 each formed of the patterned conductive film (conductive film for the gate electrodes). The gate electrode GE1 is formed in the nMIS formation region 1A, and the gate electrode GE2 is formed in the pMIS formation region 1B. Between the gate electrode GE1 and the semiconductor layer SM, the insulating film for the gate insulating film GI is left, which becomes the gate insulating film GI for the n-channel-type MISFET Qn. Between the gate electrode GE2 and the semiconductor layer SM, the insulating film for the gate insulating film GI is left, which becomes the gate insulating film GI for the p-channel-type MISFET Qp. For this reason, the gate electrode GE1 is formed on the semiconductor layer SM via the gate insulating film GI, and the gate electrode GE2 is formed on the semiconductor layer SM via the gate insulating film GI. IN this manner, the gate electrodes GE1 and GE2 are formed at step S10.

In the insulating film for the gate insulating film GI, a portion covered with the gate electrodes (GE1 and GE2) is left to become the gate insulating film GI. Portions other than the portion covered with the gate electrodes (GE1 and GE2) can be removed by dry etching to be performed in a process of patterning the conductive film for the gate electrodes or by wet etching after that dry etching.

When the gate electrodes GE1 and GE2 are formed by patterning the conductive film for the gate electrodes, the conductive film for the gate electrodes and the insulating film for the gate insulating film GI formed in the power feeding regions 2A and 2B can be removed.

Figure 32:
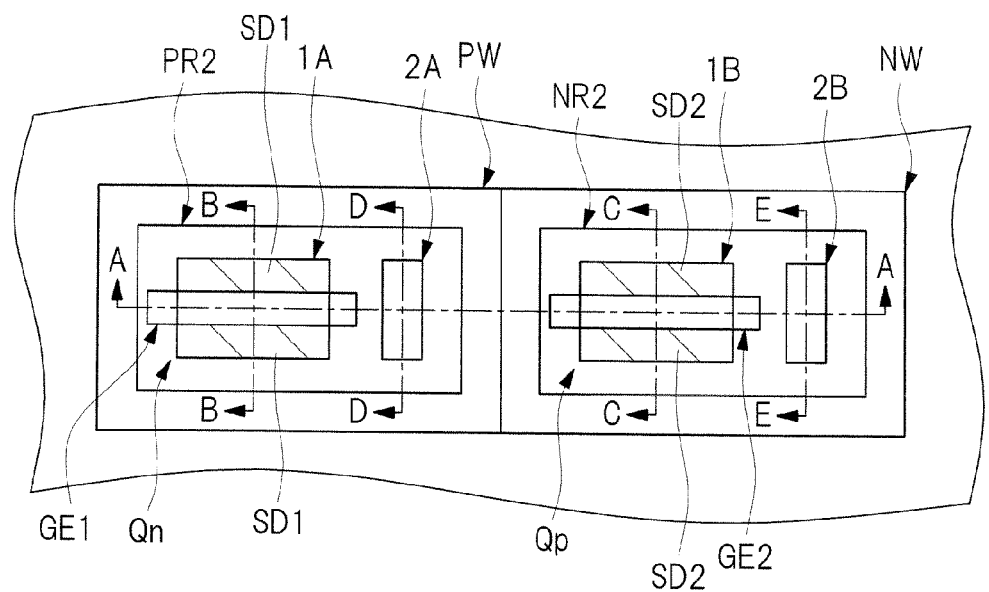
FIG. 32 is a plan view of main parts of the semiconductor device during the manufacturing process continued from FIG. 29 to FIG. 31.
Figure 33:
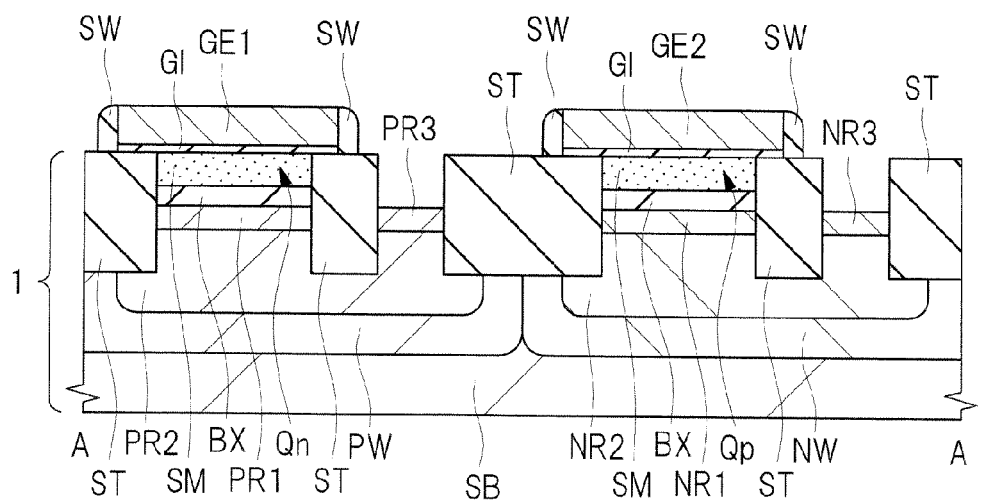
FIG. 33 is a cross-sectional view of main parts of the semiconductor device during the manufacturing process same as FIG. 32.
Figure 34:
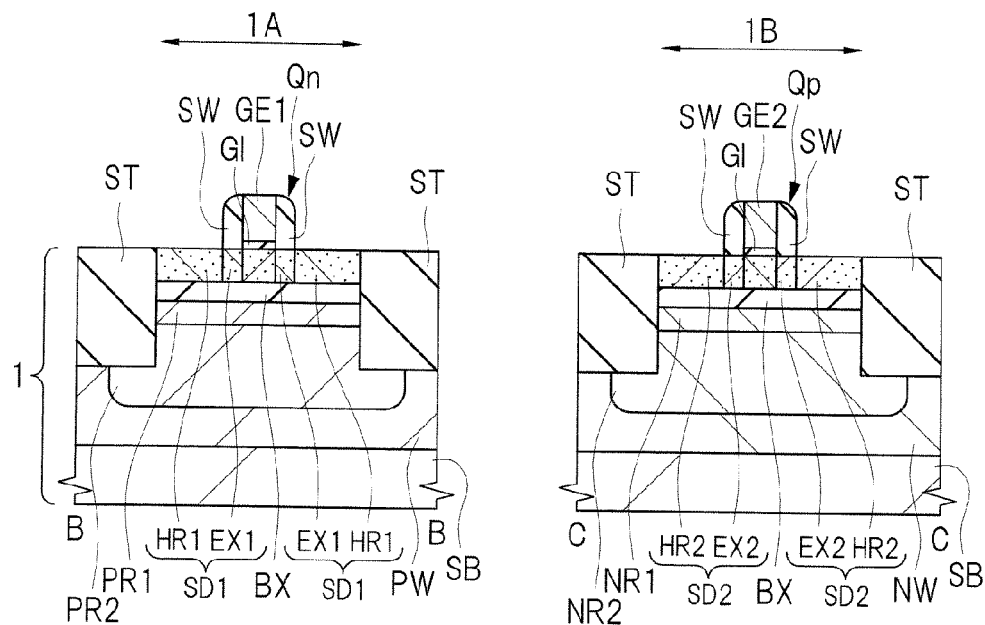
FIG. 34 is a cross-sectional view of main parts of the semiconductor device during the manufacturing process same as FIG. 32.

Next, as illustrated in FIG. 32 to FIG. 34, the source-drain region SD1 for the n-channel-type MISFET Qn is formed in the semiconductor layer SM in the nMIS formation region 1A, and the source-drain region SD2 for the p-channel-type MISFET Qp is formed in the semiconductor layer SM in the pMIS formation region 1B (step S11 of FIG. 7).

While FIG. 32 is a plan view, planar regions where the source-drain regions SD1 and SD2 are formed are hatched with thin diagonal lines. FIG. 33 roughly corresponds to the cross-sectional view along the A-A line of FIG. 32, and FIG. 34 roughly corresponds to the cross-sectional view along the B-B line of FIG. 32 (at left in FIG. 34) and the cross-sectional view along the C-C line of FIG. 32 (at right in FIG. 34).

Specifically, step S11 can be performed as follows, for example.

That is, ion implantation is performed to the semiconductor layer SM in the nMIS formation region 1A, thereby forming the n⁻-type semiconductor region EX1 in the semiconductor layer SM in the nMIS formation region 1A. In the nMIS formation region 1A, the n⁻-type semiconductor region EX1 is formed in the semiconductor layer SM on both sides of the gate electrode GE1. At ion implantation for forming the n⁻-type semiconductor region EX1, the gate electrode GE1 can function as a mask which blocks impurity ions from being implanted to the semiconductor layer SM (ion implantation blocking mask). Therefore, the n-type semiconductor region EX1 is formed so as to be aligned with the (sidewall of) the gate electrode GE1. Straight under the gate electrode GE1, no impurities are implanted. At ion implantation for forming the n⁻-type semiconductor region EX1, the pMIS formation region 1B and the power feeding regions 2A and 2B are covered with a photoresist pattern (not illustrated) to prevent ion implantation.

Then, ion implantation is performed to the semiconductor layer SM in the pMIS formation region 1B, thereby forming the p⁻-type semiconductor region EX2 in the semiconductor layer SM in the pMIS formation region 1B. In the pMIS formation region 1B, the p⁻-type semiconductor region EX2 is formed in the semiconductor layer SM on both sides of the gate electrode GE2. At ion implantation for forming the p⁻-type semiconductor region EX2, the gate electrode GE2 can function as a mask which blocks impurity ions from being implanted to the semiconductor layer SM (ion implantation blocking mask). Therefore, the p⁻-type semiconductor region EX2 is formed so as to be aligned with the (sidewall of) the gate electrode GE2. Straight under the gate electrode GE2, no impurities are implanted. At ion implantation for forming the p⁻-type semiconductor region EX2, the nMIS formation region 1A and the power feeding regions 2A and 2B are covered with a photoresist pattern (not illustrated) to prevent ion implantation.

The n⁻-type semiconductor region EX1 may be formed by ion implantation first, and then the p⁻-type semiconductor region EX2 may be formed by ion implantation. Alternatively, the p⁻-type semiconductor region EX2 may be formed by ion implantation first, and then the n⁻-type semiconductor region EX1 may be formed by ion implantation.

Then, on each sidewall of the gate electrodes GE1 and GE2, the sidewall spacer SW is formed as a sidewall insulating film. The sidewall spacer SW can be formed by, for example, depositing an insulating film (for example, a silicon oxide film or silicon nitride film, or a multilayered film thereof) on the main surface of the SOI substrate 1 so as to cover the gate electrodes GE1 and GE2 and performing anisotropic etching on the insulating film by RIE (Reactive Ion Etching) or the like.

Then, ion implantation is performed on the semiconductor layer SM in the nMIS formation region 1A, thereby forming the n⁺-type semiconductor region HR1 in the semiconductor layer SM in the nMIS formation region 1A. In the nMIS formation region 1A, the n⁺-type semiconductor region HR1 is formed in the semiconductor layer SM on both sides of a composite of the gate electrode GE1 and the sidewall spacer SW on the sidewall thereof. At ion implantation for forming the n⁺-type semiconductor region HR1, the gate electrode GE1 and the sidewall spacer SW on the sidewall thereof can function as a mask which blocks impurity ions from being implanted to the semiconductor layer SM (ion implantation blocking mask). Therefore, the n⁺-type semiconductor region HR1 is formed so as to be aligned with the (sidewall of) the sidewall spacer SW on the sidewall of the gate electrode GE1. Straight under the composite of the gate electrode GE1 and the sidewall spacer SW on the sidewall thereof; no impurities are implanted. At ion implantation for forming the n⁺-type semiconductor region HR1, the pMIS formation region 1B and the power feeding regions 2A and 2B are covered with a photoresist pattern (not illustrated) to prevent ion implantation.

Then, ion implantation is performed on the semiconductor layer SM in the pMIS formation region 1B, thereby forming the p⁻-type semiconductor region HR2 in the semiconductor layer SM in the pMIS formation region 1B. In the pMIS formation region 1B, the p⁺-type semiconductor region HR2 is formed in the semiconductor layer SM on both sides of a composite of the gate electrode GE2 and the sidewall spacer SW on the sidewall thereof. At ion implantation for forming the p⁺-type semiconductor region HR2, the gate electrode GE2 and the sidewall spacer SW on the sidewall thereof can function as a mask which blocks impurity ions from being implanted to the semiconductor layer SM (ion implantation blocking mask). Therefore, the p-type semiconductor region HR2 is formed so as to be aligned with the (sidewall of) the sidewall spacer SW on the sidewall of the gate electrode GE2. Straight under the composite of the gate electrode GE1 and the sidewall spacer SW on the sidewall thereof, no impurities are implanted. At ion implantation for forming the p⁺-type semiconductor region HR2, the nMIS formation region 1A and the power feeding regions 2A and 2B are covered with a photoresist pattern (not illustrated) to prevent ion implantation.

The n⁺-type semiconductor region HR1 may be formed by ion implantation first, and then the p⁺-type semiconductor region HR2 may be formed by ion implantation. Alternatively, the p⁺-type semiconductor region HR2 may be formed by ion implantation first, and then the n⁺-type semiconductor region HR1 may be formed by ion implantation.

In this manner, step S11 is performed. By step S11, the source-drain region SD1 in an LDD structure formed of the n⁻-type semiconductor region EX1 and the n⁺-type semiconductor region HR1 having impurity concentration higher than that of the n⁻-type semiconductor region EX1 is formed in the semiconductor layer SM in the nMIS formation region 1A. Also, the source-drain region SD2 in an LDD structure formed of the p⁻-type semiconductor region EX2 and the p⁺-type semiconductor region HR2 having impurity concentration higher than that of the p-type semiconductor region EX2 is formed in the semiconductor layer SM in the pMIS formation region 1B.

Another mode is possible as follows. That is, after the sidewall spacer SW is formed, an epitaxial layer not illustrated, for example, a silicon epitaxial layer, is formed on the semiconductor layer SM not covered with the gate electrodes GE1 and GE2 and the sidewall spacer SW and exposed (that is, on the n⁺-type semiconductor region HR1 and the p⁺-type semiconductor region HR2). In this case, the n⁺-type semiconductor region HR1 is formed over the semiconductor layer SM in the nMIS formation region 1A and the epitaxial layer thereon, and the p⁺-type semiconductor region HR2 is formed over the semiconductor layer SM in the pMIS formation region 1B and the epitaxial layer thereon. When an epitaxial layer is not formed, the thickness of each of the n⁺-type semiconductor region HR1 and the p⁺-type semiconductor region HR2 is limited to the thickness of the semiconductor layer SM. When an epitaxial layer is formed, the thickness of each of the n⁻-type semiconductor region HR1 and the p⁺-type semiconductor region HR2 can be made thicker than the thickness of the semiconductor layer SM by the thickness of the epitaxial layer.

Next, an annealing process (heat treatment) for activating the impurities introduced by ion implantation so far is performed (step S12 of FIG. 7). This annealing process (heat treatment) can be performed by, for example, a spike annealing process at approximately 1050 degrees Celsius.

In this manner, the n-channel-type MISFET Qn is formed in the semiconductor layer SM in the nMIS formation region 1A, and the p-channel-type MISFET Qp is formed in the semiconductor layer SM in the pMIS formation region 1B. At steps S10 and S11 can be regarded as a process of forming MISFETs (Qn and Qp) in the semiconductor layer SM in the nMIS formation region 1A and the semiconductor layer SM in the pMIS formation region 1B.

Next, by Salicide (Self Aligned Silicide) technology, the metal silicide layers SL1 and SL2 are formed (step S13 of FIG. 7).

The metal silicide layer SL1 is formed on the upper part (surface layer part) of the gate electrodes GE1 and GE2, the n$^+$-type semiconductor region HR1, and the p$^-$-type semiconductor region HR2, and the metal silicide layer SL2 is formed on the front surface (surface layer part) of the semiconductor substrate SB exposed in the power feeding regions 2A and 2B.

Specifically, the process of forming the metal silicide layers SL1 and SL2 at step S13 can be performed as follows.

Figure 35:
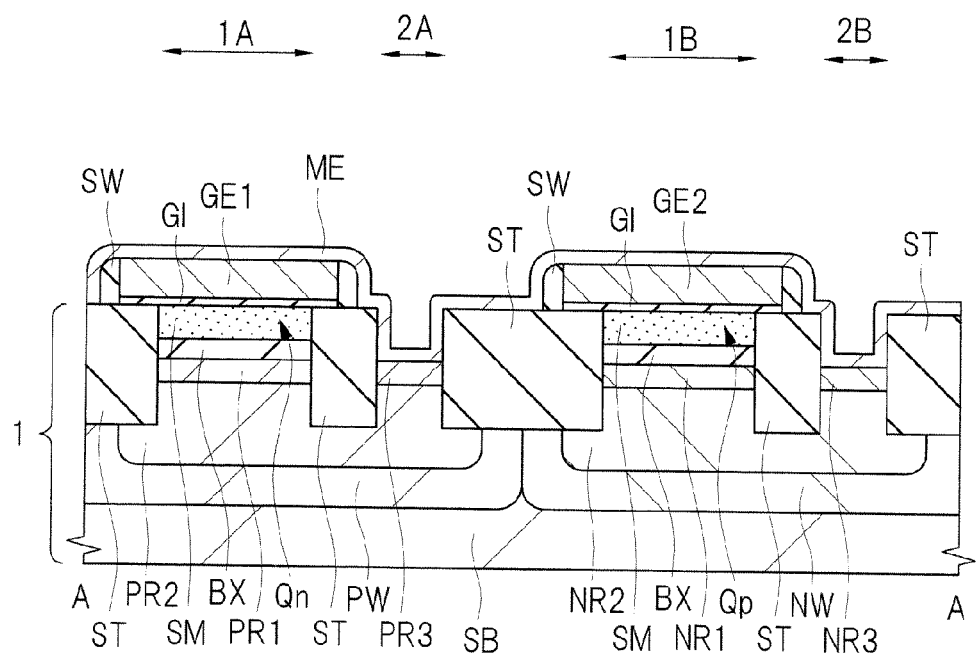
FIG. 35 is a plan view of main parts of the semiconductor device during the manufacturing process continued from FIG. 32 to FIG. 34.
Figure 36:
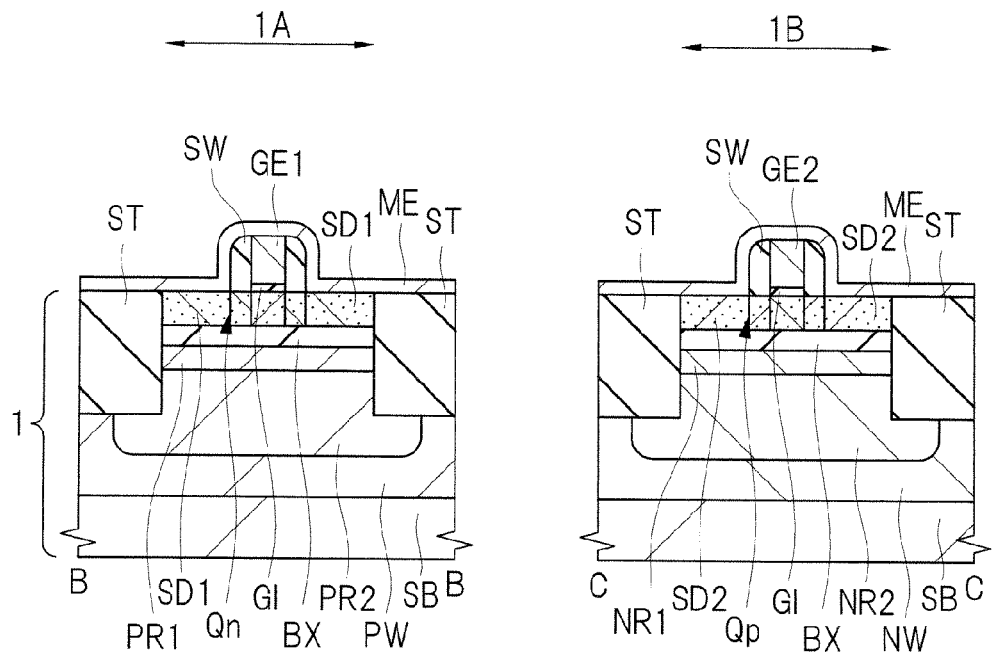
FIG. 36 is a cross-sectional view of main parts of the semiconductor device during the manufacturing process same as FIG. 35.
Figure 37:
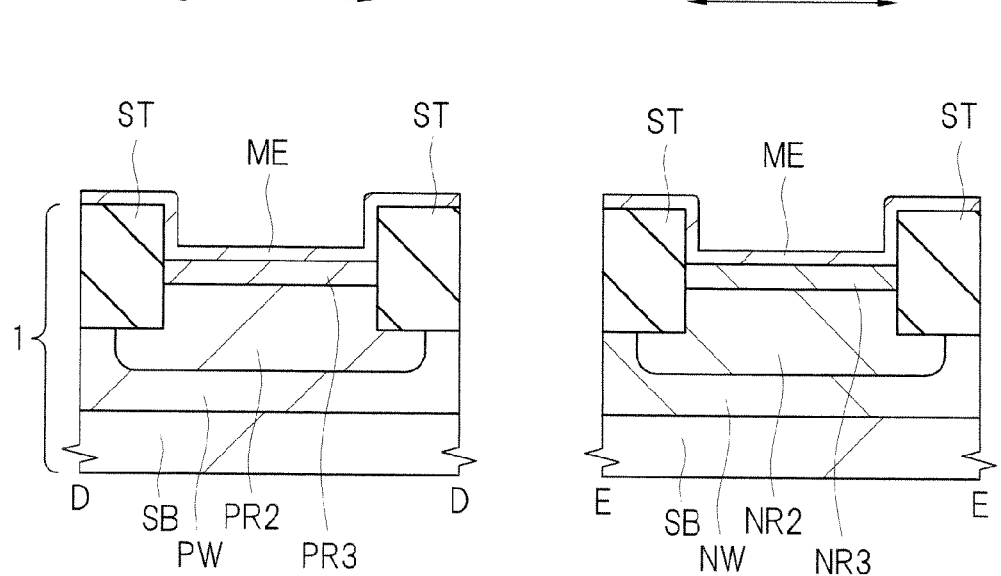
FIG. 37 is a cross-sectional view of main parts of the semiconductor device during the manufacturing process same as FIG. 35.

That is, first, the front surfaces of the gate electrodes GE1 and GE2, the n$^+$-type semiconductor region HR1, and the p$^+$-type semiconductor region HR2 and the front surfaces of the semiconductor substrate SB in the power feeding regions 2A and 2B (specifically, the front surfaces of the p-type semiconductor region PR3 and the n-type semiconductor region NR3) are exposed. Then, as illustrated in FIG. 35 to FIG. 37, a metal film ME is formed over the main surface (entire surface) of the SOI substrate 1 so as to cover the gate electrodes GE1 and GE2, the sidewall spacer SW, the n$^+$-type semiconductor region HR1, and the p$^+$-type semiconductor region HR2. This metal film ME is in contact with the front surfaces of the gate electrodes GE1 and GE2, the front surface of the n$^+$-type semiconductor region HR1, and the front surface of the p$^-$-type semiconductor region HR2, and also in contact with the front surface of the semiconductor substrate SB in the power feeding regions 2A and 2B (specifically, the front surfaces of the p-type semiconductor region PR3 and the n-type semiconductor region NR3). The metal film ME is formed of, for example, a cobalt (Co) film, a nickel (Ni) film, a nickel-platinum alloy film, or the like, and can be formed by using sputtering.

Then, a heat treatment is performed. With this heat treatment, the metal film ME and (silicon that forms) the n$^+$-type semiconductor region HR1 react together to form the metal silicide layer SL1, which is a reactive layer, on the upper part (surface layer part) of the n$^+$-type semiconductor region HR1, and the metal film ME and (silicon that forms) the p$^+$-type semiconductor region HR2 react together to form the metal silicide layer SL1, which is a reactive layer, on the upper part (surface layer part) of the p$^+$-type semiconductor region HR2. Also, with this heat treatment, the metal film ME and (silicon that forms) the gate electrodes GE1 and GE2 react together to form the metal silicide layer SL1, which is a reactive layer, on the upper part (surface layer part) of the gate electrodes GE1 and GE2. Furthermore, with this heat treatment, the metal film ME and (silicon that forms) the semiconductor substrate SB in the power feeding regions 2A and 2B react together to form the metal silicide layer SL2, which is a reactive layer, on the upper part (surface layer part) of the semiconductor substrate SB in the power feeding regions 2A and 2B. Then, a non-reactive portion of the metal film ME is removed. This stage is illustrated in FIG. 38 to FIG. 41. By forming the metal silicide layers SL1 and SL2, diffusion resistance, contact resistance, and the like can be reduced.

Figure 38:
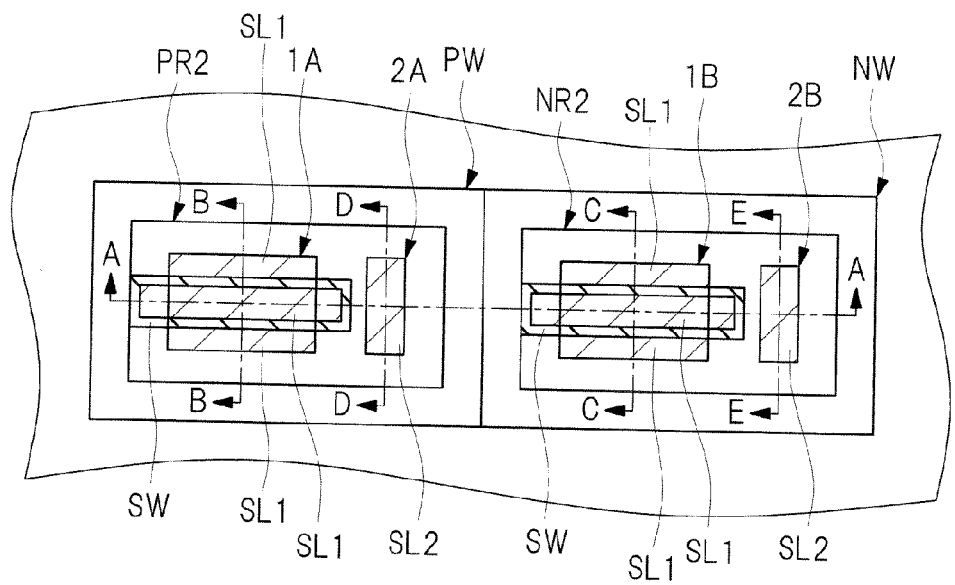
FIG. 38 is a plan view of main parts of the semiconductor device during the manufacturing process continued from FIG. 35 to FIG. 37.
Figure 39:
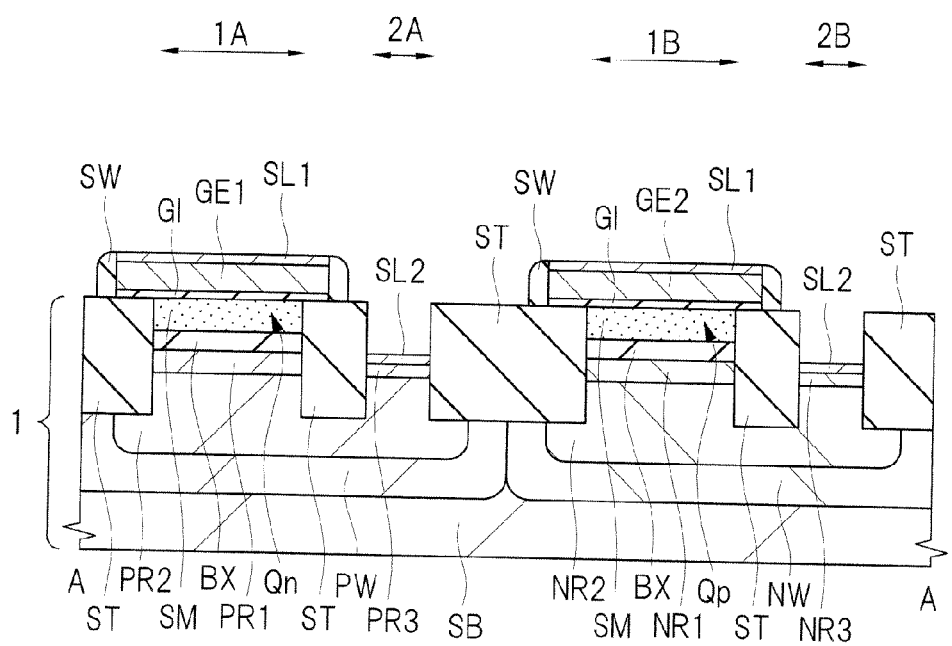
FIG. 39 is a cross-sectional view of main parts of the semiconductor device during the manufacturing process same as FIG. 38.
Figure 40:
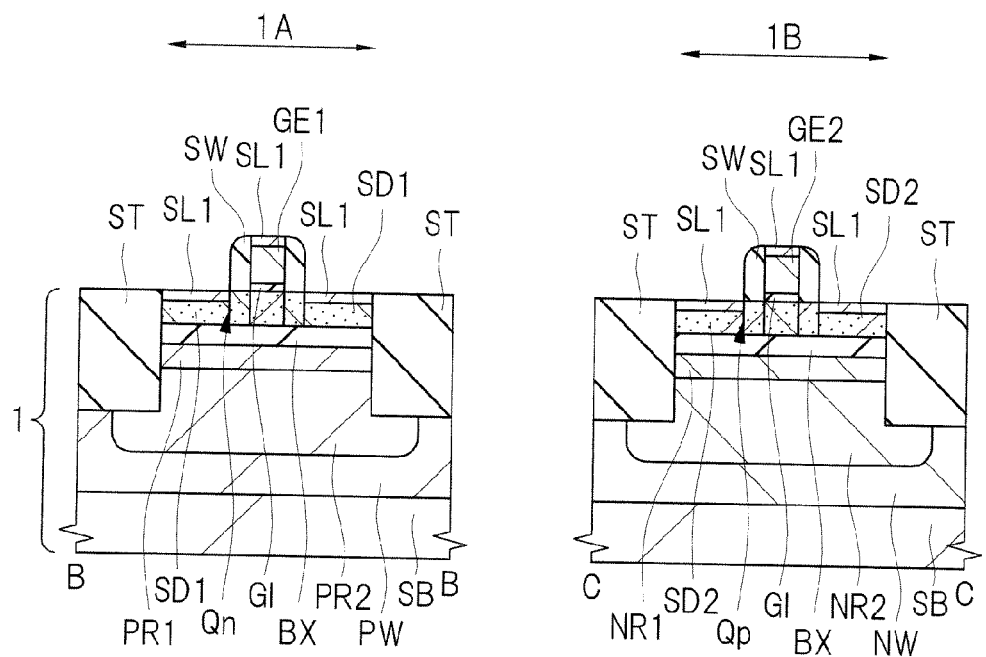
FIG. 40 is a cross-sectional view of main parts of the semiconductor device during the manufacturing process same as FIG. 38.
Figure 41:
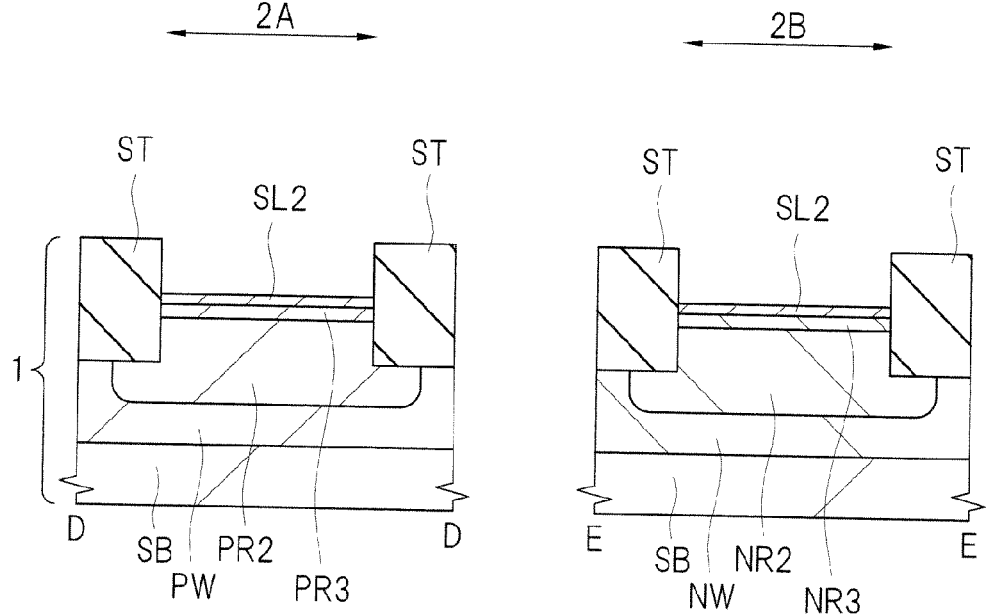
FIG. 41 is a cross-sectional view of main parts of the semiconductor device during the manufacturing process same as FIG. 38.

While FIG. 38 is a plan view, planar regions where the metal silicide layers SL1 and SL2 are formed are hatched with thin diagonal lines, and the sidewall spacer SW is hatched with bold diagonal lines. FIG. 39 roughly corresponds to the cross-sectional view along the A-A line of FIG. 38, FIG. 40 roughly corresponds to the cross-sectional view along the B-B line of FIG. 38 (at left in FIG. 40) and the cross-sectional view along the C-C line of FIG. 38 (at right in FIG. 40), and FIG. 41 roughly corresponds to the cross-sectional view along the D-D line of FIG. 38 (at left in FIG. 41) and the cross-sectional view along the E-E line of FIG. 38 (at right in FIG. 41).

Here, the case has been described in which the metal silicide layer SL is formed on the upper part of the gate electrodes GE1 and GE2. In another mode, the metal silicide layer SL1 may not be formed on the upper part of the gate electrodes GE1 and GE2. For example, the metal silicide layer SL1 is not formed on the upper part of the gate electrodes GE1 and GE2 when the gate electrodes GE1 and GE2 are formed of a metal film or a metal compound film or when the gate electrodes GE1 and GE2 are formed of a multilayered film of a conductive film and an insulating film on the conductive film.

When the semiconductor layer SM is a silicon layer and the metal film ME is a cobalt film, the metal silicide layer SL1 is a cobalt silicide layer. Also, when the semiconductor layer SM is a silicon layer and the metal film ME is a nickel film, the metal silicide layer SL1 is a nickel silicide layer. Furthermore, when the semiconductor layer SM is a silicon layer and the metal film ME is a nickel-platinum alloy film, the metal silicide layer SL1 is a nickel-platinum silicide layer. When the semiconductor substrate SB is a silicon substrate and the metal film ME is a cobalt film, the metal silicide layer SL2 is a cobalt silicide layer. Also, when the semiconductor substrate SB is a silicon substrate and the metal film ME is a nickel film, the metal silicide layer SL2 is a nickel silicide layer. Furthermore, when the semiconductor substrate SB is a silicon substrate and the metal film ME is a nickel-platinum alloy film, the metal silicide layer SL2 is a nickel-platinum silicide layer.

When the semiconductor layer SM is a silicon (Si) layer, the metal silicide layer SL1 is formed. When the semiconductor layer SM is a SiGe (silicon germanium) layer, a metal silicon germanide layer is formed in place of the metal silicide layer SL1. When the semiconductor layer SM is a Ge (germanium) layer, a metal germanide layer is formed in place of the metal silicide layer SL1.

In the power feeding region 2A, the metal silicide layer SL2 is formed on the front surface of the semiconductor substrate SB. However, since the p-type semiconductor region PR3 is formed on the upper part (surface layer part) of the semiconductor substrate SB, the metal silicide layer SL2 is formed on the front surface of the p-type semiconductor region PR3. Also, in the power feeding region 2B, the metal silicide layer SL2 is formed on the front surface of the semiconductor substrate SB. However, since the n-type semiconductor region NR3 is formed on the upper part (surface layer part) of the semiconductor substrate SB, the metal silicide layer SL2 is formed on the front surface of the n-type semiconductor region NR3. For this reason, when the metal silicide layers SL1 and SL2 are formed at step S13, the p-type semiconductor region PR3 is present under the metal silicide layer SL2 and the p-type semiconductor region PR2 is present thereunder in the power feeding region 2A. On the other hand, in the power feeding region 2B, the n-type semiconductor region NR3 is present under the metal silicide layer SL2 and the n-type semiconductor region NR2 is present thereunder.

However, when the entire p-type semiconductor region PR3 reacts with the metal film ME by the heat treatment performed after the formation of the metal film ME to form the metal silicide layer SL2, the p-type semiconductor region PR3 is not left under the metal silicide layer SL2 in the power feeding region 2A, and the p-type semiconductor region PR2 is directly present. Similarly, when the entire n-type semiconductor region NR3 reacts with the metal film ME by the heat treatment performed after the formation of the metal film ME to form the metal silicide layer SL2, the n-type semiconductor region NR3 is not left under the metal silicide layer SL2 in the power feeding region 2B, and the n-type semiconductor region NR2 is directly present.

Next, as illustrated in FIG. 42 to FIG. 45, on the main surface (entire main surface) of the SOI substrate 1, the insulating film (interlayer insulating film) L1 is formed as an interlayer insulating film (step S14 of FIG. 7). That is, the insulating film L1 is formed on the main surface of the SOI substrate 1 so as to cover the gate electrodes GE1 and GE2, the sidewall spacer SW, and the metal silicide layers SL1 and SL2. As the insulating film L1, a multilayered film of a silicon nitride film and a silicon oxide film on the silicon nitride film (a silicon oxide film thicker than the silicon nitride film), a single silicon oxide film, or the like can be used.

Figure 42:
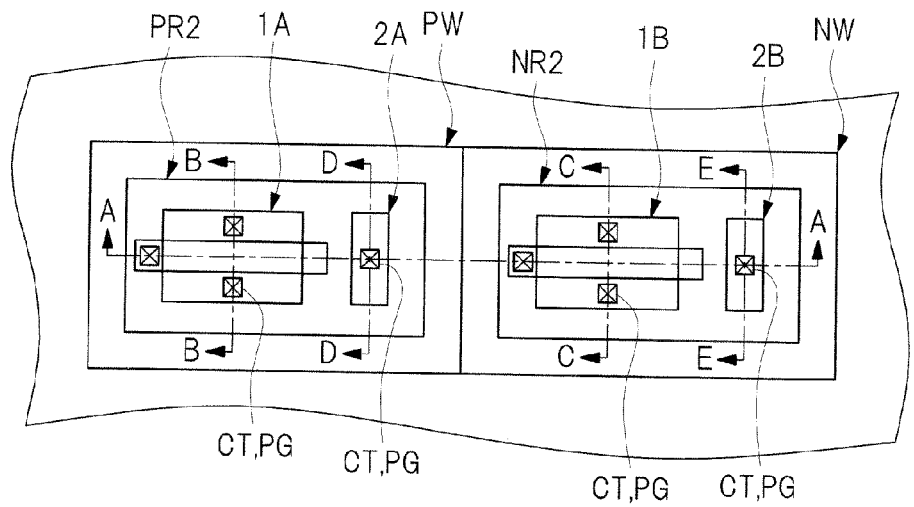
FIG. 42 is a plan view of main parts of the semiconductor device during the manufacturing process continued from FIG. 38 to FIG. 41.
Figure 43:
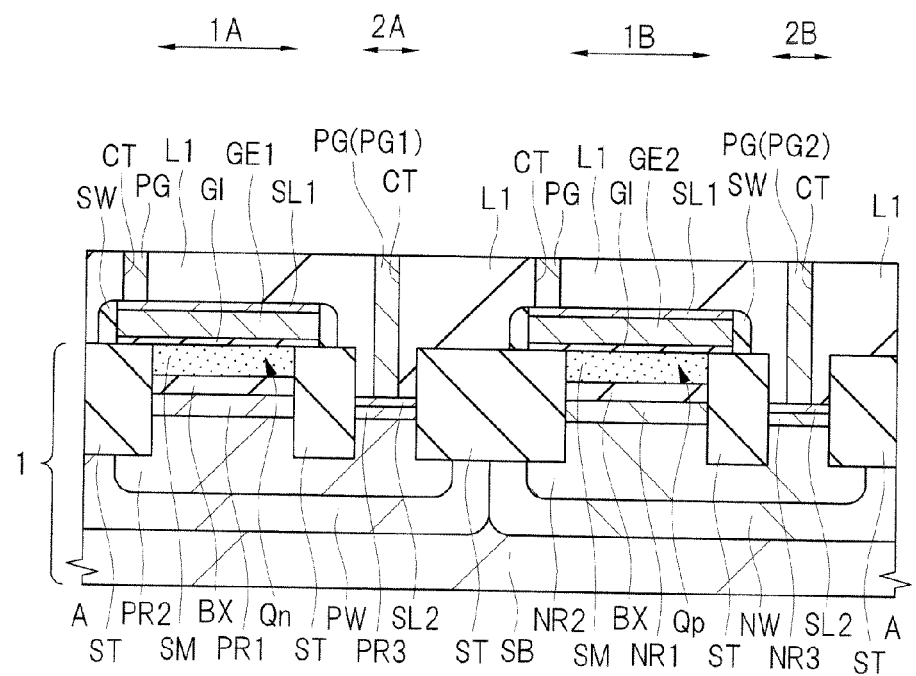
FIG. 43 is a cross-sectional view of main parts of the semiconductor device during the manufacturing process same as FIG. 42.
Figure 44:
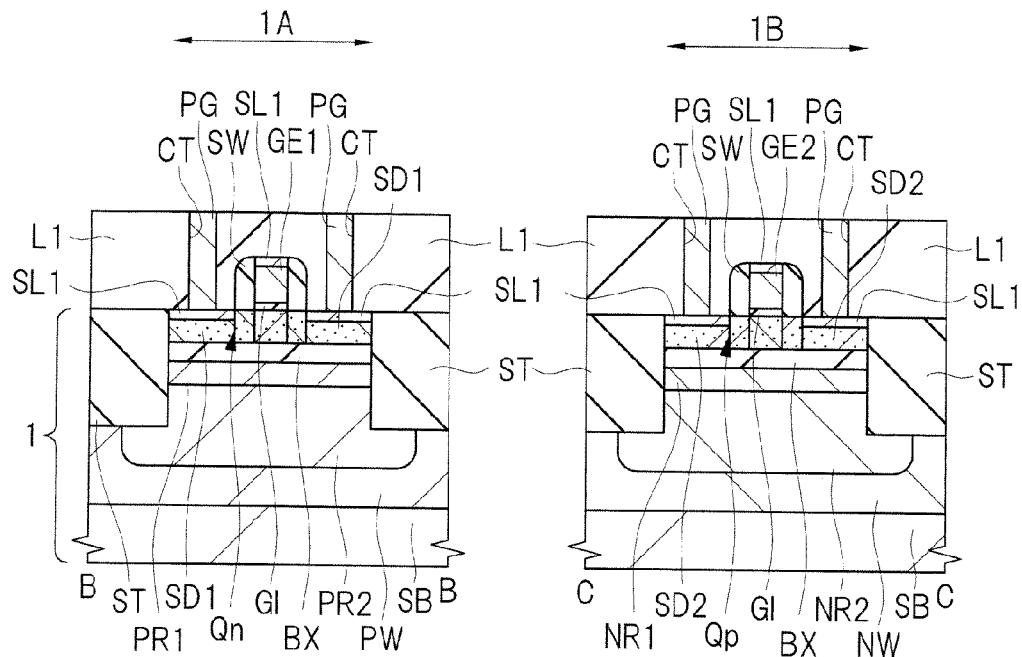
FIG. 44 is a cross-sectional view of main parts of the semiconductor device during the manufacturing process same as FIG. 42.
Figure 45:
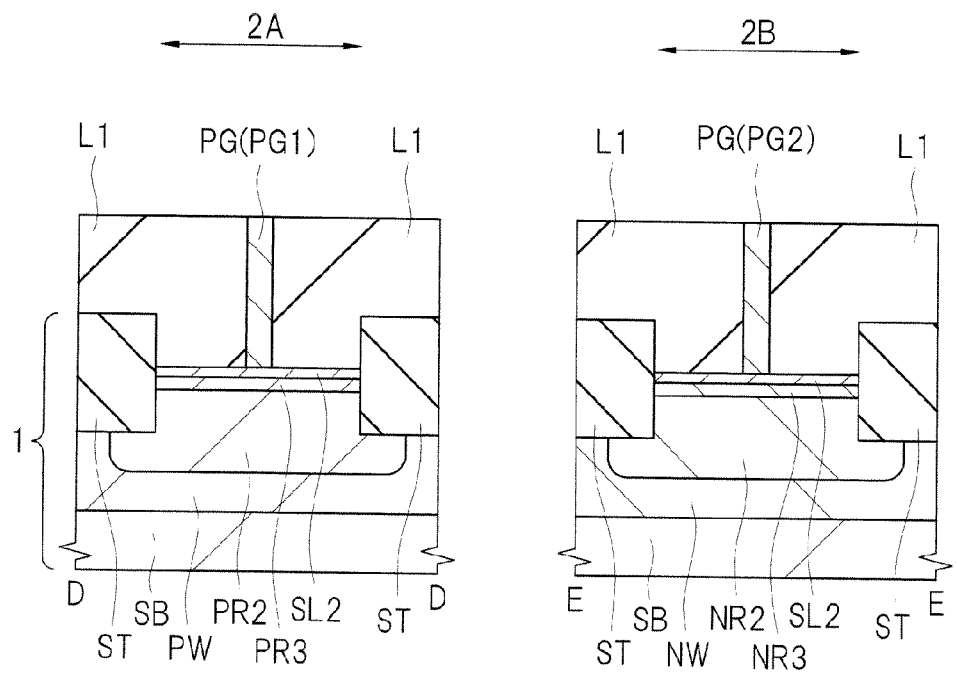
FIG. 45 is a cross-sectional view of main parts of the semiconductor device during the manufacturing process same as FIG. 42.

FIG. 42 is a plan view, FIG. 43 roughly corresponds to the cross-sectional view along the A-A line of FIG. 43, FIG. 44 roughly corresponds to the cross-sectional view along the B-B line of FIG. 42 (at left in FIG. 44) and the cross-sectional view along the C-C line of FIG. 42 (at right in FIG. 44), and FIG. 45 roughly corresponds to the cross-sectional view along the D-D line of FIG. 42 (at left in FIG. 45) and the cross-sectional view along the E-E line of FIG. 42 (at right in FIG. 45).

After the insulating film L1 is formed, the front surface (upper surface) of the insulating film L1 is polished by CMP or the like, thereby enhancing planarity of the upper surface of the insulating film L1.

Next, by using a photoresist layer (not illustrated) formed on the insulating film L1 by using photolithography as an etching mask, the insulating film L1 is subjected to dry etching, thereby forming a contact hole (opening, hole, or through hole) CT is formed in the insulating film L1 (step S15 of FIG. 7). The contact hole CT is formed so as to penetrate through the insulating film L1.

For example, the contact hole CT is formed in each of the gate electrodes GE1 and GE2, the $n^+$-type semiconductor region HR1, and the $p^+$-type semiconductor region HR2. At the bottom of the contact hole CT, the metal silicide layer SL1 is exposed. The contact hole CT is formed also in each of the power feeding regions 2A and 2B. At the bottom of the contact hole CT, the metal silicide layer SL2 is exposed.

Next, as a conductor part for connection, the conductive plug (contact plug) PG made of tungsten (W) or the like is formed in each contact hole CT (step S16 of FIG. 7).

Specifically, the plug PG can be formed as follows.

To form the plug PG first, a barrier conductive film is formed by sputtering, plasma CVD, or the like, on the insulating film L1 including the inside (bottom part and sidewall) of the contact hole CT. This barrier conductive film is formed of, for example, a titanium film, a titanium nitride film, or a multilayered film thereof. Then, a main conductive film made of a tungsten film is formed by CVD or the like on the barrier conductive film so as to fill the contact hole CT. Then, unwanted portions of the main conductive film and the barrier conductive film outside the contact hole CT (on the insulating film L1) are removed by CMP, an etch-back scheme, or the like. With this, the upper surface of the insulating film L1 is exposed and, with the barrier conductive film and the main conductive film buried in the contact hole CT of the insulating film L1 and left, the plug PG is formed. For simplification of the drawings, the barrier conductive film and the main conductive film configuring the plug PG are integrally illustrated in FIG. 43 to FIG. 45.

The plug PG buried in the contact hole CT formed on the $n^+$-type semiconductor region HR1 has its bottom part in contact with and electrically connected to the metal silicide layer SL1 on the front surface of the $n^+$-type semiconductor region HR1. For this reason, from a wiring M1, which will be described further below, to the plug PG (plug PG on the $n^+$-type semiconductor region HR1), a desired potential (source potential or drain potential) can be supplied to the metal silicide layer SL1 on the front surface of the $n^+$-type semiconductor region HR1, therefore, the $n^+$-type semiconductor region HR1 under the metal silicide layer SL1 and $n^-$-type semiconductor region EX1 electrically connected thereto.

The plug PG buried in the contact hole CT formed on the $p^+$-type semiconductor region HR2 has its bottom part in contact with and electrically connected to the metal silicide layer SL1 on the front surface of the $p^+$-type semiconductor region HR2. For this reason, from the wiring M1, which will be described further below, to the plug PG (plug PG on the $p^+$-type semiconductor region HR2), a desired potential (source potential or drain potential) can be supplied to the metal silicide layer SL1 on the front surface of the $p^+$-type semiconductor region HR2, therefore, the $p^+$-type semiconductor region HR2 under the metal silicide layer SL1 and $p^-$-type semiconductor region EX2 electrically connected thereto.

The plug PG buried in the contact hole CT formed in the gate electrode GE1 has its bottom part in contact with and electrically connected to the gate electrode GE1 (the metal silicide layer SL1 if formed on the gate electrode GE1). For this reason, from the wiring M1, which will be described further below, to the plug PG (plug PG on the gate electrode GE1), a desired potential (gate potential) can be supplied to the gate electrode GE1.

The plug PG buried in the contact hole CT formed in the gate electrode GE2 has its bottom part in contact with and electrically connected to the gate electrode GE2 (the metal silicide layer SL1 if formed on the gate electrode GE2). For this reason, from the wiring M1, which will be described further below, to the plug PG (plug PG on the gate electrode GE2), a desired potential (gate potential) can be supplied to the gate electrode GE2.

The plug PG buried in the contact hole CT formed in the power feeding region 2A (that is, the plug PG1) has its bottom part in contact with and electrically connected to the metal silicide layer SL2 formed on the front surface of the semiconductor substrate SB. For this reason, from the wiring M1, which will be described further below, to the plug PG1, a desired potential (back gate potential) can be supplied to the p-type semiconductor regions PR3, PR2, and PR1 of the semiconductor substrate SB.

The plug PG buried in the contact hole CT formed in the power feeding region 2B (that is, the plug PG2) has its bottom part in contact with and electrically connected to the metal silicide layer SL2 formed on the front surface of the semiconductor substrate SB. For this reason, from the wiring M1, which will be described further below, to the plug PG2, a desired potential (back gate potential) can be supplied to the n-type semiconductor regions NR3, NR2, and NR1 of the semiconductor substrate SB.

Next, as illustrated in FIG. 2 to FIG. 4, the insulating film L2 for wiring formation is formed on the insulating film L1 where the plug PG is buried. As the insulating film L2, a single film (single insulating film) or a multilayered film (multilayered insulating film) can be used.

Next, the wiring M1, which is a wiring on the first layer, is formed by a single damascene process. Specifically, the wiring M1 can be formed as follows, for example. First, by dry etching with a photoresist layer (not illustrated) as a mask, a wiring trench (a trench in which the wiring M1 is to be buried) is formed in a predetermined region of the insulating film L2. Then, a barrier conductive film is formed on the main surface of the SOI substrate 1 (that is, on the insulating film L2 including the bottom part and the sidewall of the wiring trench). As a barrier conductive film, for example, a titanium nitride film, a tantalum film, a tantalum nitride film, or the like can be used. Subsequently, a copper seed layer is formed on the barrier conductive film by CVD, sputtering, or the like. Furthermore, a copper plating film (main conductive film) is formed on the seed layer by using electrolytic plating or the like. With the copper plating film, the inside of the wiring trench is filled. Then, regions of the copper plating film, the seed layer, and the barrier metal film other than the wiring trench are removed by CMP to form the wiring M1 of the first layer, which is buried in the wiring trench and made of copper as a main conductive material. For simplification of the drawings, the copper plating film, the seed layer, and the barrier metal film configuring the wiring M1 are integrally illustrated in FIG. 2 to FIG. 4. The upper surface of the plug PG is in contact with the wiring M1, and is electrically connected to the wiring M1. The wiring M1 is connected to the plug PG, and is electrically connected, via the plug PG to the gate electrode GE1, the gate electrode GE2, the $n^+$-type semiconductor region HR1, the $p^+$-type semiconductor region HR2, the p-type semiconductor region PR3 (or the p-type semiconductor region PR2), the n-type semiconductor region NR3 (or the n-type semiconductor region NR2), or the like.

Then, wiring of the second layer onward are formed by a dual damascene process, but this process is not illustrated or described herein. Also, the wiring M1 and the wirings of the second layer onward are not restricted to damascene wirings, but can be formed by patterning the conductive film for wiring. For example, tungsten wirings or aluminum wirings can be used.

In the manner described above, the semiconductor device according to the present embodiment is manufactured.

<Regarding Circumstances of Studies>

By using an SOI substrate where a semiconductor layer is formed on a supporting substrate via an insulating layer, a MISFET and others are formed in the semiconductor layer of the SOI substrate, thereby manufacturing a semiconductor device. In this case, by providing a back-gate semiconductor region on the supporting substrate under the semiconductor layer where the MISFET is formed and applying a desired voltage to that semiconductor region, the threshold voltage of the MISFET can be controlled at a desired threshold voltage. As a result, the performance of the semiconductor device is improved and, for example, high-speed operation or reduction in power consumption can be achieved.

To apply a desired voltage to the back-gate semiconductor region, it is required to provide the SOI substrate with a power feeding region where the insulating layer and the semiconductor layer configuring the SOI substrate are removed and apply the desired voltage to the back-gate semiconductor region from the power feeding region via the supporting substrate. Here, it is desirable to reduce resistance (parasitic resistance) of a route from the power feeding region via the supporting substrate to the back-gate semiconductor region, in order to improve the performance of the semiconductor device.

Also, both of the n-channel-type MISFET and the p-channel-type MISFET are provided to the semiconductor layer of the SOI substrate. The semiconductor layer where the n-channel-type MISFET is formed and the semiconductor layer where the p-channel-type MISFET is formed are surrounded when seen in a plan view by a device isolation region formed on the SOI substrate, and are electrically separated from each other. Also, a back-gate semiconductor region of the n-channel-type MISFET is provided to the supporting substrate under the semiconductor layer where the n-channel-type MISFET is formed, and a back-gate semiconductor region of the p-channel-type MISFET is provided to the supporting substrate under the semiconductor layer where the p-channel-type MISFET is formed. Then, a desired voltage is applied to each of the back-gate semiconductor region of the n-channel-type MISFET and the back-gate semiconductor region of the p-channel-type MISFET from a different power feeding region via the supporting substrate. With this, the threshold voltage of the n-channel-type MISFET and the threshold voltage of the p-channel-type MISFET can be controlled at a desired threshold voltage. In this case, the conductivity type of the semiconductor region provided in the supporting substrate for the n-channel-type MISFET formed in the semiconductor layer of the SOI substrate and the conductivity type of the semiconductor region provided in the supporting substrate for the p-channel-type MISFET formed in the semiconductor layer of the SOI substrate are opposite to each other. Therefore, a pn junction plane is formed in the supporting substrate. When a pn junction plane is formed, it is desirable to reduce leak current at the pn junction plane and improve withstand voltage of the junction plane, in order to improve the performance of the semiconductor device.

For this reason, when the n-channel-type MISFET and the p-channel-type MISFET are formed in the semiconductor layer of the SOI substrate and a back gate is provided to the supporting substrate of the SOI substrate, it is extremely important to contrive a semiconductor region where the supporting substrate is fainted, in order to improve the performance of the semiconductor device.

<Regarding Study Examples>

Figure 46:
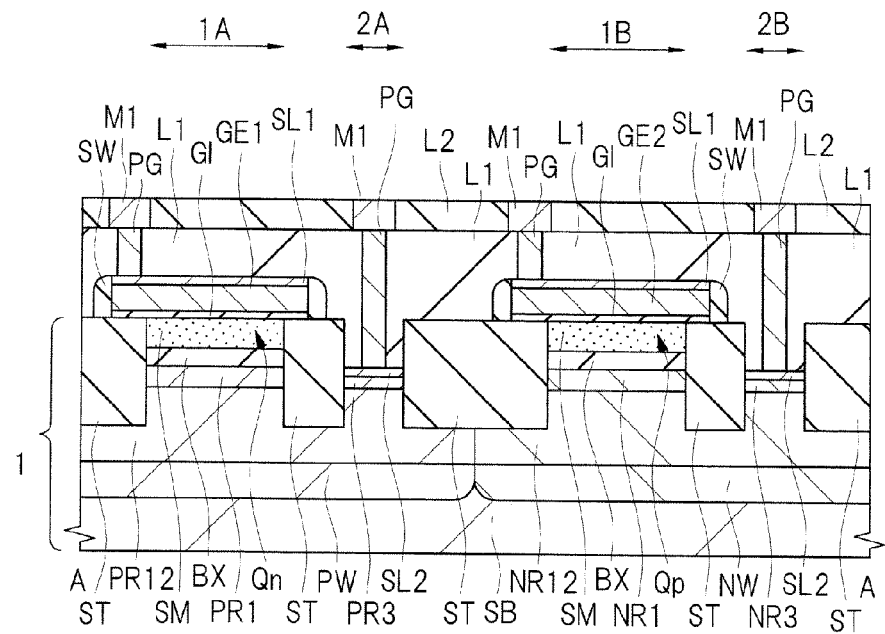
FIG. 46 is a cross-sectional view of main parts of a semiconductor device during a manufacturing process according to a first study example.
Figure 47:
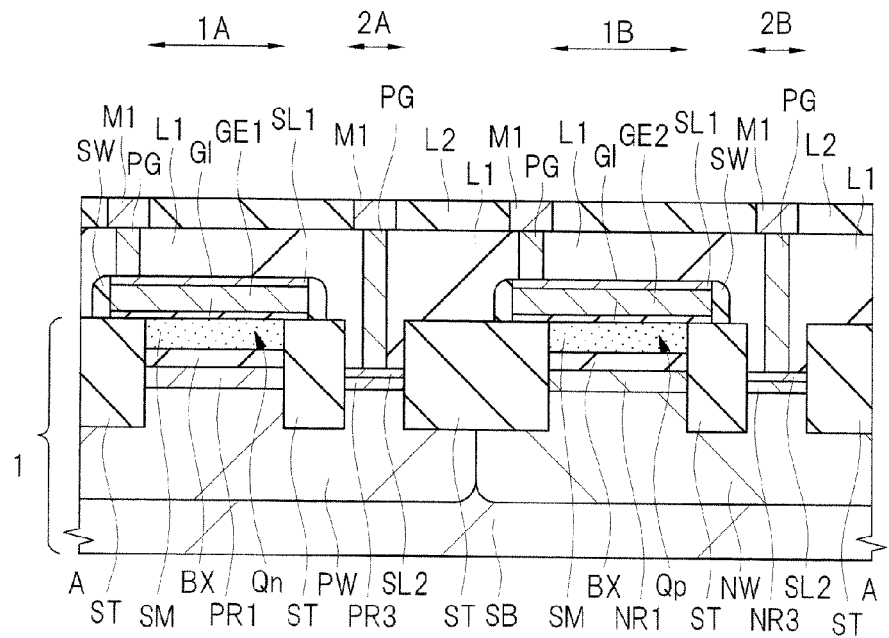
FIG. 47 is a cross-sectional view of main parts of a semiconductor device during a manufacturing process according to a second study example.
Figure 48:
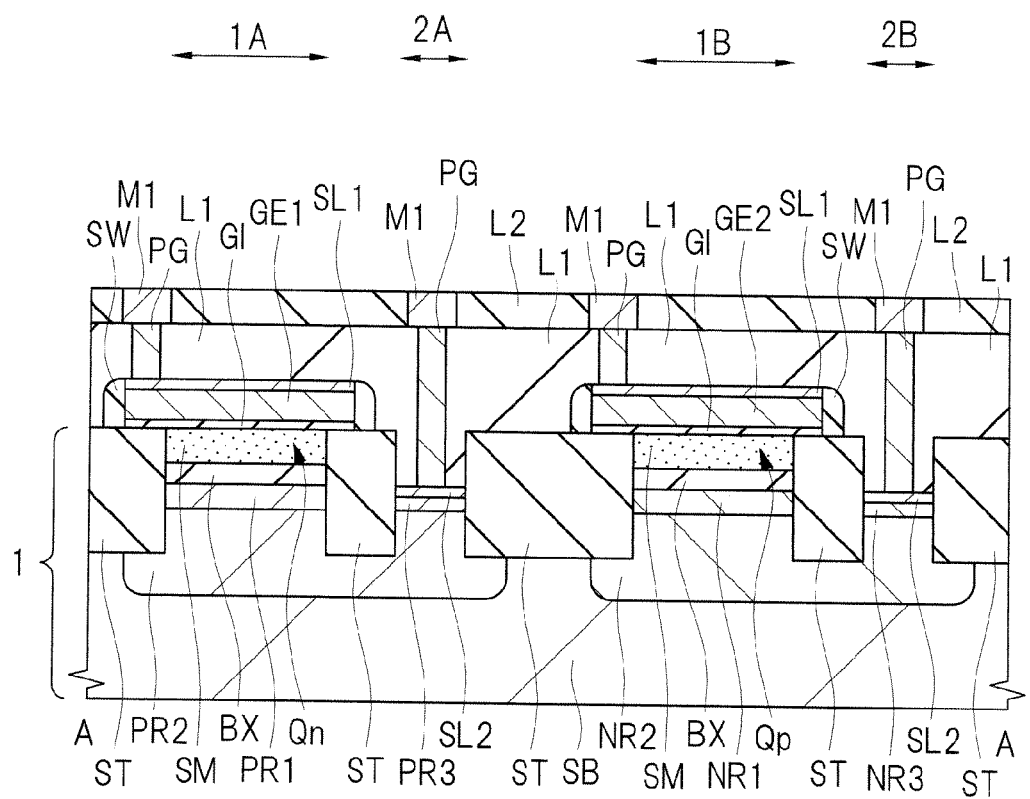
FIG. 48 is a cross-sectional view of main parts of a semiconductor device during a manufacturing process according to a third study example.

FIG. 46 is a cross-sectional view of main parts of a semiconductor device of a first study example. FIG. 47 is a cross-sectional view of main parts of a semiconductor device of a second study example. FIG. 48 is a cross-sectional view of main parts of a semiconductor device of a third study example. All of these drawings are cross-sectional views corresponding to FIG. 2.

First, the first study example of FIG. 46 is described. The first study example of FIG. 46 is different from the embodiment of FIG. 2 in that, in the first study example of FIG. 46, a p-type semiconductor region PR12 is provided in place of the p-type semiconductor region PR2 of the present embodiment and an n-type semiconductor region NR12 is provided in place of the n-type semiconductor region NR2 of the present embodiment. The impurity concentration and the depth position of the bottom surface of the p-type semiconductor region PR12 is similar to those of the n-type semiconductor region NR1 and the impurity concentration and the depth position of the bottom surface of the n-type semiconductor region NR12 is similar to those of the n-type semiconductor region NR1. However, while the p-type semiconductor region PR2 and the n-type semiconductor region NR2 are not adjacent to each other, the p-type semiconductor region PR12 and the n-type semiconductor region NR12 are adjacent to each other under the device isolation region ST in the first study example of FIG. 46.

In the first study example of FIG. 46, a voltage supplied from the plug PG in the power feeding region 2A is supplied (applied) to the p-type semiconductor region PR1 in the nMIS formation region 1A via the p-type semiconductor region PR12 extending from the power feeding region 2A to the nMIS formation region 1A. Also, a voltage supplied from the plug PG in the power feeding region 2B is supplied (applied) to the n-type semiconductor region NR1 in the pMIS formation region 1B via the n-type semiconductor region NR12 extending from the power feeding region 2B to the pMIS formation region 1B. To reduce parasitic resistance, the impurity concentration (p-type impurity concentration) of the p-type semiconductor region PR12 and the impurity concentration (n-type impurity concentration) of the n-type semiconductor region NR12 are both desirably high.

However, in the first study example of FIG. 46, the p-type semiconductor region PR12 and the n-type semiconductor region NR12 are adjacent to each other to form a pn junction plane. For this reason, if the impurity concentration (p-type impurity concentration) of the p-type semiconductor region PR12 and the impurity concentration (n-type impurity concentration) of the n-type semiconductor region NR12 are increased, junction electric field strength at the pn junction plane between the p-type semiconductor region PR12 and the n-type semiconductor region NR12 is increased, thereby easily inviting an increase in junction leak current, a decrease in junction withstand voltage, and others. This decreases reliability of the semiconductor device and, in turn, decreases the performance of the semiconductor device.

That is, when the p-type semiconductor region and the n-type semiconductor region form a pn junction plane, if the impurity concentration of the p-type semiconductor region and the impurity concentration of the n-type semiconductor region are low, the field intensity near the pn junction is relatively small, the leak current at the pn junction is low, and the withstand voltage of the pn junction is high. By contrast, when the p-type semiconductor region and the n-type semiconductor region form a pn junction plane, if one or both of the impurity concentration of the p-type semiconductor region and the impurity concentration of the n-type semiconductor region are high, the field intensity near the pn junction is relatively large, the leak current at the pn junction is increased, and the withstand voltage of the pn junction is low.

Nevertheless, if the impurity concentration of the p-type semiconductor region PR12 is decreased, resistance components (parasitic resistance) when a back gate voltage is supplied from the plug PG in the power feeding region 2A via the p-type semiconductor region PR12 to the p-type semiconductor region PR1 in the nMIS formation region 1A are increased. Similarly, if the impurity concentration of the n-type semiconductor region NR12 is decreased, resistance components (parasitic resistance) when a back gate voltage is supplied from the plug PG in the power feeding region 2B via the n-type semiconductor region NR12 to the n-type semiconductor region NR1 in the pMIS formation region 1B are increased.

Next, the second study example of FIG. 47 is described. The second study example of FIG. 47 is different from the present embodiment of FIG. 2 in that the p-type semiconductor region PR2 and the n-type semiconductor region NR2 of the present embodiment are not formed in the second study example of FIG. 47. That is, in the second study example of FIG. 47, the p-type well PW is formed in an entire region of the region where the p-type semiconductor region PR2 is formed and the region where the p-type well PW is formed in the present embodiment. Also in the second study example of FIG. 47, the n-type well NW is formed in an entire region of the region where n-type semiconductor region NR2 is formed and the region where the n-type well NW is formed in the present embodiment. In the second study example of FIG. 47, the p-type well PW and the n-type well NW are adjacent to each other under the device isolation region ST.

While the p-type well PW and the n-type well NW are adjacent to each other under the device isolation region ST in the second study example of FIG. 47, the impurity concentration (p-type impurity concentration) of the p-type well PW and the impurity concentration (n-type impurity concentration) of the n-type well NW are not so high. For this reason, in the second study example of FIG. 47, although the p-type well PW and the n-type well NW are adjacent to each other to form a pn junction plane, the impurity concentrations of the p-type well PW and the n-type well NW are not so high, and therefore, the junction electric field strength at the pn junction plane between the p-type well PW and the n-type well NW is decreased, the junction leak current is suppressed, and the junction withstand voltage can be increased.

However, in the second study example of FIG. 47, a voltage supplied from the plug PG in the power feeding region 2A is supplied (applied) to the p-type semiconductor region PR1 in the nMIS formation region 1A via the p-type well PW extending from the power feeding region 2A to the nMIS formation region 1A. Also, a voltage supplied from the plug PG in the power feeding region 2B is supplied (applied) to the n-type semiconductor region NR1 in the pMIS formation region 1B via the n-type well NW extending from the power feeding region 2B to the pMIS formation region 1B. Since the impurity concentration of the p-type well PW is not so high, resistance components (parasitic resistance) when a back gate voltage is supplied from the plug PG in the power feeding region 2A via the p-type well PW to the p-type semiconductor region PR1 in the nMIS formation region 1A are increased. Similarly, since the impurity concentration of the n-type well NW is not so high, resistance components (parasitic resistance) when a back gate voltage is supplied from the plug PG in the power feeding region 2B via the n-type well NW to the n-type semiconductor region NR1 in the pMIS formation region 1B are increased.

Nevertheless, if the impurity concentration (p-type impurity concentration) of the p-type well PW and the impurity concentration (n-type impurity concentration) of the n-type well NW are increased, the junction electric field strength at the pn junction plane between the p-type well PW and the n-type well NW is increased, thereby easily inviting an increase in junction leak current, a decrease in junction withstand voltage, and others.

Next, the third study example of FIG. 48 is described. The third study example of FIG. 48 is different from the present embodiment of FIG. 2 in that the p-type well PW and the n-type well NW in the present embodiment are not formed in the third study example of FIG. 48. In the third study example of FIG. 48, the p-type semiconductor region PR2 and the n-type semiconductor region NR2 are not adjacent to each other.

In the third study example of FIG. 48, a voltage supplied from the plug PG in the power feeding region 2A is supplied (applied) to the p-type semiconductor region PR1 in the nMIS formation region 1A via the p-type semiconductor region PR2 extending from the power feeding region 2A to the nMIS formation region 1A. Also, a voltage supplied from the plug PG in the power feeding region 2B is supplied (applied) to the n-type semiconductor region NR1 in the pMIS formation region 1B via the n-type semiconductor region NR2 extending from the power feeding region 2B to the pMIS formation region 1B. To reduce parasitic resistance, the impurity concentration (p-type impurity concentration) of the p-type semiconductor region PR2 and the impurity concentration (n-type impurity concentration) of the n-type semiconductor region NR2 are both desirably high.

However, in the third study example of FIG. 48, since the p-type well PW and the n-type well NW are not formed, the bottom surface and the side surface of the p-type semiconductor region PR2 and the bottom surface and the side surface of the n-type semiconductor region NR2 are surrounded by a substrate region of the semiconductor substrate SB. Here, the substrate region surrounding the bottom surface and the side surface of the p-type semiconductor region PR2 and the bottom surface and the side surface of the n-type semiconductor region NR2 is an n-type semiconductor substrate region with low impurity concentration or a p-type semiconductor substrate region with low impurity concentration. Whether this substrate region is of the n type or p type is determined by whether the semiconductor substrate SB of the SOI substrate 1 prepared at step S1 is of then type or p type. The conductivity type of the semiconductor substrate SB of the SOI substrate 1 prepared at step S1 is kept also in this substrate region. If the substrate region is of the p type, a pn junction is formed between this substrate region and the n-type semiconductor region NR2. If the substrate region is of the n type, a pn junction is formed between the substrate region and the p-type semiconductor region PR2. That is, in the third study example of FIG. 48, since the p-type well PW and the n-type well NW are not formed, a pn junction is formed on the bottom surface and the side surface of the p-type semiconductor region PR2 or the bottom surface and the side surface of the n-type semiconductor region NR2. For this reason, in the third study example of FIG. 48, if the impurity concentration (p-type impurity concentration) of the p-type semiconductor region PR2 and the impurity concentration (n-type impurity concentration) of the n-type semiconductor region NR2 are increased, the junction electric field strength is increased at the pn junction formed on the bottom surface and the side surface of the p-type semiconductor region PR2 or the bottom surface and the side surface of the n-type semiconductor region NR2. For this reason, an increase in junction leak current, a decrease in junction withstand voltage, and others are easily invited.

Nevertheless, if the impurity concentration of the p-type semiconductor region PR2 is decreased, resistance components (parasitic resistance) when a back gate voltage is supplied from the plug PG in the power feeding region 2A via the p-type semiconductor region PR2 to the p-type semiconductor region PR1 in the nMIS formation region 1A are increased. Similarly, if the impurity concentration of the n-type semiconductor region NR2 is decreased, resistance components (parasitic resistance) when a back gate voltage is supplied from the plug PG in the power feeding region 2B via the n-type semiconductor region NR2 to the n-type semiconductor region NR1 in the pMIS formation region 1B are increased.

<Regarding Main Features and Effects>

The semiconductor device of the present embodiment includes the semiconductor substrate SB and the semiconductor layer SM formed on the semiconductor substrate SB via the insulating layer BX, and has a first active region and a second active region each surrounded by the device isolation region ST when seen in a plan view, the device isolation region ST penetrating through the semiconductor layer SM and the insulating layer BX; a first MISFET formed in the first active region; and a second MISFET formed in the second active region. Here, the first active region corresponds to the semiconductor layer SM in the nMIS formation region 1A, the second active region corresponds to the semiconductor layer SM in the pMIS formation region 1B, the first MISFET corresponds to the n-channel-type MISFET Qn, and the second MISFET corresponds to the p-channel-type MISFET Qp.

The power feeding region 2A (first region) and the power feeding region 2B (second region) are each surrounded by the device isolation region ST when seen in a plan view, and the semiconductor layer SM and the insulating layer BX are removed therefrom.

In the semiconductor substrate SB, the p-type well PW (first semiconductor region), the p-type semiconductor region PR2 (second semiconductor region) having impurity concentration higher than that of the p-type well PW, the n-type well NW (third semiconductor region), and the n-type semiconductor region NR2 (fourth semiconductor region) having impurity concentration higher than that of the n-type well NW.

The p-type well PW is formed in the semiconductor substrate SB so as to include the nMIS formation region 1A (first active region) and the power feeding region 2A (first region) when seen in a plan view. The p-type semiconductor region PR2 is formed in the semiconductor substrate SB so as to include the nMIS formation region 1A (first active region) and the power feeding region 2A (first region) when seen in a plan view. The p-type semiconductor region PR2 is contained in the p-type well PW, and the bottom surface of the p-type semiconductor region PR2 is at a shallower level than the bottom surface of the p-type well PW, and at a deeper level than the bottom surface of a portion of the device isolation region ST interposed between the nMIS formation region 1A (first active region) and the power feeding region 2A (first region) when seen in a plan view. The p-type semiconductor region PR2 extends to also under the portion of the device isolation region ST interposed between the nMIS formation region 1A (first active region) and the power feeding region 2A (first region).

The n-type well NW is formed in the semiconductor substrate SB so as to include the pMIS formation region 1B (second active region) and the power feeding region 2B (second region) when seen in a plan view. The n-type semiconductor region NR2 is formed in the semiconductor substrate SB so as to include the pMIS formation region 1B (second active region) and the power feeding region 2B (second region) when seen in a plan view. The n-type semiconductor region NR2 is contained in the n-type well NW, and the bottom surface of the n-type semiconductor region NR2 is at a shallower level than the bottom surface of the n-type well NW, and at a deeper level than the bottom surface of a portion of the device isolation region ST interposed between the pMIS formation region 1B (second active region) and the power feeding region 2B (second region) when seen in a plan view. The n-type semiconductor region NR2 extends to also under the portion of the device isolation region ST interposed between the pMIS formation region 1B (second active region) and the power feeding region 2B (second region).

One of main features of the semiconductor device of the present embodiment is that, in the semiconductor substrate SB, the p-type semiconductor region PR2 is formed so as to include the nMIS formation region 1A (first active region) and the power feeding region 2A (first region) when seen in a plan view, and the p-type semiconductor region PR2 is formed so as to include the pMIS formation region 1B (second active region) and the power feeding region 2B (second region) when seen in a plan view. The bottom surface of the p-type semiconductor region PR2 is at a deeper level than the bottom surface of the portion of the device isolation region ST interposed between the nMIS formation region 1A and the power feeding region 2A when seen in a plan view, and the p-type semiconductor region PR2 extends to also under the portion of the device isolation region ST interposed between the nMIS formation region 1A and the power feeding region 2A. The bottom surface of the n-type semiconductor region NR2 is at a deeper level than the bottom surface of the portion of the device isolation region ST interposed between the pMIS formation region 1B and the power feeding region 2B when seen in a plan view, and the n-type semiconductor region NR2 extends to also under the portion of the device isolation region ST interposed between the pMIS formation region 1B and the power feeding region 2B.

With this, the potential (voltage) supplied from the power feeding region 2A can be applied via the p-type semiconductor region PR2 to the semiconductor substrate SB to the portion of the semiconductor substrate SB facing the semiconductor layer SM in the nMIS formation region 1A via the insulating layer BX. For this reason, the threshold voltage of the n-channel-type MISFET Qn formed in the semiconductor layer SM in the nMIS formation region 1A can be controlled at a desired threshold voltage. Also, the potential (voltage) supplied from the power feeding region 2B to the semiconductor substrate SB can be applied via the n-type semiconductor region NR2 to the portion of the semiconductor substrate SB facing the semiconductor layer SM in the pMIS formation region 1B via the insulating layer BX. For this reason, the threshold voltage of the p-channel-type MISFET Qp formed in the semiconductor layer SM in the pMIS formation region 1B can be controlled at a desired threshold voltage. Therefore, the performance of the semiconductor device can be improved. For example, high-speed operation or reduction in power consumption can be achieved.

Another one of the main features of the semiconductor device of the present embodiment is that, in the semiconductor substrate SB, the p-type semiconductor region PR2 is contained in the p-type well PW having impurity concentration lower than that of the p-type semiconductor region PR2, and the bottom surface of the p-type semiconductor region PR2 is at a shallower level than the bottom surface of the p-type well PW. In the semiconductor substrate SB, the n-type semiconductor region NR2 is contained in the n-type well NW having impurity concentration lower than that of the n-type semiconductor region NR2, and the bottom surface of the n-type semiconductor region NR2 is at a shallower level than the bottom surface of the n-type well NW.

With this, a pn junction can be prevented from being formed on the bottom surface and the side surface of the p-type semiconductor region PR2, and also a pn junction can be prevented from being formed on the bottom surface and the side surface of the n-type semiconductor region NR2. That is, since the p-type semiconductor region PR2 is contained in the p-type well PW, portions except a portion in contact with the device isolation region ST of the bottom surface and the side surface of the p-type semiconductor region PR2 are covered with the p-type well PW. Therefore, a pn junction is not formed on the bottom surface and the side surface of the p-type semiconductor region PR2. Also, since the n-type semiconductor region NR2 is contained in the n-type well NW, portions except a portion in contact with the device isolation region ST among the bottom surface and the side surface of the n-type semiconductor region NR2 are covered with the n-type well NW. Therefore, a pn junction is not formed on the bottom surface and the side surface of the n-type semiconductor region NR2.

In the semiconductor substrate SB, a pn junction is not formed on the bottom surface and the side surface of the p-type semiconductor region PR2, and a pn junction is not formed on the bottom surface and the side surface of the n-type semiconductor region NR2. When the p-type well PW and the n-type well NW are adjacent to each other, a pn junction is formed between the p-type well PW and the n-type well NW. Even if a pn junction is formed between the p-type well PW and the n-type well NW, by decreasing the impurity concentration (p-type impurity concentration) of the p-type well PW and the impurity concentration (n-type impurity concentration) of the n-type well NW, the junction electric field strength at the pn junction plane between the p-type well PW and the n-type well NW is decreased, the junction leak current is suppressed, and the junction withstand voltage can be increased. Therefore, the impurity concentrations of the p-type well PW and the n-type well NW are desirably decreased to some extent.

Also, the bottom surface of the p-type well PW and the bottom surface of the n-type well NW are in contact with the substrate region of the semiconductor substrate SB. The substrate region is an n-type semiconductor substrate region with low impurity concentration or a p-type semiconductor substrate region with low impurity concentration. For this reason, a pn junction plane is formed on the bottom surface of the p-type well PW or the n-type well NW. However, if the impurity concentration (p-type impurity concentration) of the p-type well PW and the impurity concentration (n-type impurity concentration) of the n-type well NW are decreased, the junction electric field strength at the pn junction formed on the bottom surface of the p-type well PW or the bottom surface of the n-type well NW is decreased, the junction leak current is suppressed, and the junction voltage can be increased. Also from this viewpoint, the impurity concentrations of the p-type well PW and the n-type well NW are desirably decreased to some extent.

On the other hand, the potential (voltage) supplied from the power feeding region 2A to the semiconductor substrate SB is supplied (applied) via the p-type semiconductor region PR2 continuously extending from the power feeding region 2A over the nMIS formation region 1A to the portion of the semiconductor substrate SB facing the semiconductor layer SM in the nMIS formation region 1A via the insulating layer BX. Also, the potential (voltage) supplied from the power feeding region 2B to the semiconductor substrate SB is supplied (applied) via the n-type semiconductor region NR2 continuously extending from the power feeding region 2B over the pMIS formation region 1B to the portion of the semiconductor substrate SB facing the semiconductor layer SM in the pMIS formation region 1B via the insulating layer BX. For this reason, to reduce parasitic resistance, the impurity concentration (p-type impurity concentration) of the p-type semiconductor region PR2 and the impurity concentration (n-type impurity concentration) of the n-type semiconductor region NR2 are both desirably high.

Therefore, in the present embodiment, the impurity concentration (p-type impurity concentration) of the p-type semiconductor region PR2 is set higher than that (p-type impurity concentration) of the p-type well PW, and the impurity concentration (n-type impurity concentration) of the n-type semiconductor region NR2 is set lower than the impurity concentration (n-type impurity concentration) of the n-type well NW. With this, the potential (voltage) supplied from the power feeding region 2A to the semiconductor substrate SB is transferred to the p-type semiconductor region PR2 having impurity concentration higher than that of the p-type well PW, and resistance components (parasitic resistance) can be reduced. Also, the potential (voltage) supplied from the power feeding region 2B to the semiconductor substrate SB is transferred to the n-type semiconductor region NR2 having impurity concentration higher than that of the n-type well NW, and resistance components (parasitic resistance) can be reduced. For this reason, the performance of the semiconductor device can be improved. Furthermore, a pn junction is not formed on the bottom surface and the side surface of the p-type semiconductor region PR2 having impurity concentration higher than that of the p-type well PW, and a pn junction is not formed on the bottom surface and the side surface of the n-type semiconductor region NR2 having impurity concentration higher than that of the n-type well NW. A pn junction is formed on the bottom surface or the side surface of the p-type well PW having impurity concentration lower than that of the p-type semiconductor region PR2 or the bottom surface or the side surface of the n-type well NW having impurity concentration lower than that of the n-type semiconductor region NR2. With this, the junction electric field strength at the pn junction is decreased, the junction leak current is suppressed, and the junction withstand voltage can be increased. For this reason, reliability of the semiconductor device can be improved and, in turn, the performance of the semiconductor device can be improved.

Also, in the present embodiment, the p-type semiconductor region PR1 (fifth semiconductor region) having impurity concentration higher than that of the p-type semiconductor region PR2 is formed in the semiconductor substrate SB so as to face the semiconductor layer SM (first active region) in the nMIS formation region 1A via the insulating layer BX. The p-type semiconductor region PR1 is formed so as to be shallower than the bottom surface of the device isolation region ST and the bottom surface of the p-type semiconductor region PR2, and the bottom surface of the p-type semiconductor region PR1 is adjacent to the p-type semiconductor region PR2. Also, the n-type semiconductor region NR1 (sixth semiconductor region) having impurity concentration higher than that of the n-type semiconductor region NR2 is formed in the semiconductor substrate SB so as to face the semiconductor layer SM (second active region) in the pMIS formation region IB via the insulating layer BX. The n-type semiconductor region NR1 is formed so as to be shallower than the bottom surface of the device isolation region ST and the bottom surface of the n-type semiconductor region NR2, and the bottom surface of the n-type semiconductor region NR1 is adjacent to the n-type semiconductor region NR2.

While formation of the p-type semiconductor region PR1 and the n-type semiconductor region NR1 can be omitted, it is more preferable to form these regions. If the p-type semiconductor region PR1 and the n-type semiconductor region NR1 are not formed, the region where the p-type semiconductor region PR1 is supposed to be formed becomes the p-type semiconductor region PR2, and the region where the n-type semiconductor region NR1 is supposed to be formed becomes the n-type semiconductor region NR2.

The reason why the p-type semiconductor region PR1 and the n-type semiconductor region NR1 are preferably formed is as follows.

That is, in the semiconductor substrate SB, by applying a voltage (back gate voltage) to a region facing the semiconductor layer SM (first active region) in the nMIS formation region 1A via the insulating layer BX, the threshold voltage of the n-channel-type MISFET Qn can be controlled. Here, in the semiconductor substrate SB, if the impurity concentration of the region facing the semiconductor layer SM (second active region) in the nMIS formation region 1A via the insulating layer BX is higher, the threshold voltage of the n-channel-type MISFET Qn can be greatly fluctuated even with a small back gate voltage. Similarly, in the semiconductor substrate SB, if the impurity concentration of the region facing the semiconductor layer SM (second active region) in the pMIS formation region 1B via the insulating layer BX is higher, the threshold voltage of the p-channel-type MISFET Qp can be greatly fluctuated even with a small back gate voltage. Therefore, in the semiconductor substrate SB, the p-type semiconductor region PR1 having impurity concentration higher than that of the p-type semiconductor region PR2 is provided in the region facing the semiconductor layer SM (first active region) in the nMIS formation region 1A via the insulating layer BX, thereby greatly fluctuating the threshold voltage of the n-channel-type MISFET Qn even with a small back gate voltage. Furthermore, in the semiconductor substrate SB, the n-type semiconductor region NR1 having impurity concentration higher than that of the n-type semiconductor region NR2 is provided in the region facing the semiconductor layer SM (second active region) in the pMIS formation region 1B via the insulating layer BX, thereby greatly fluctuating the threshold voltage of the p-channel-type MISFET Qp even with a small back gate voltage. With this, the fluctuation width of the threshold voltages of the n-channel-type MISFET Qn and the p-channel-type MISFET Qp by the back gate electrode can be enlarged. Therefore, the performance of the semiconductor device can be further improved.

Also, the p-type semiconductor region PR1 is a $p^+$-type semiconductor region with high concentration, and the n-type semiconductor region NR1 is an $n^+$-type semiconductor region with high concentration. The p-type semiconductor region PR1 is formed in the semiconductor substrate in the nMIS formation region 1A so as to be adjacent to the insulating layer BX. However, at ion implantation for forming the p-type semiconductor region PR1 (ion implantation at step S6), ion implantation in the semiconductor layer SM in the n-type semiconductor region NR1 is desirably prevented as much as possible. This is to prevent impurities from being implanted with high concentration in the semiconductor layer SM in the nMIS formation region 1A. For this reason, instead of setting impurity concentration of the thick p-type semiconductor region PR2 as equivalent to the impurity concentration of the p-type semiconductor region PR1 without forming the p-type semiconductor region PR1, the p-type semiconductor region PR1 having impurity concentration higher than that of the p-type semiconductor region PR2 is preferably formed separately from the p-type semiconductor region PR2. With this, at ion implantation for forming high impurity-concentration region in the semiconductor substrate SB in the nMIS forming region 1A, impurities with high concentration can be easily prevented from being implanted to the semiconductor layer SM in the nMIS formation region 1A. Simultaneously; instead of setting impurity concentration of the thick n-type semiconductor region NR2 as equivalent to the impurity concentration of the n-type semiconductor region NR1 without forming the n-type semiconductor region NR1, the n-type semiconductor region NR1 having impurity concentration higher than that of the n-type semiconductor region NR2 is preferably formed separately from the n-type semiconductor region NR2. With this, at ion implantation for forming high impurity-concentration region in the semiconductor substrate SB in the pMIS forming region 1B, impurities with high concentration can be easily prevented from being implanted to the semiconductor layer SM in the pMIS formation region 1B.

Furthermore, while the p-type well PW and the n-type well NW are adjacent to each other under the device isolation region ST in the present embodiment, the p-type semiconductor region PR2 is not adjacent to any of the n-type well NW and the n-type semiconductor region NR2, and the n-type semiconductor region NR2 is not adjacent to any of the p-type well PW and the p-type semiconductor region PR2. For this reason, even when the layout is such that the p-type well PW and the n-type well NW are adjacent to each other, the p-type semiconductor region PR2 can be prevented from forming a pn junction, and the n-type semiconductor region NR2 can be prevented from forming a pn junction. For this reason, the withstand voltage of the pn junction in the semiconductor substrate SB is improved. Also, since the p-type well PW and the n-type well NW do not have to be separated from each other, the planar dimension of the semiconductor device can be reduced.

Still further, in the present embodiment, the conductive plug PG1 (first plug) is disposed on the semiconductor substrate SB in the power feeding region 2A, and a voltage for controlling the threshold voltage of the n-channel-type MISFET Qn (first MISFET) can be supplied from the plug PG1 to the p-type semiconductor region PR1 via the p-type semiconductor region PR2. Also, the conductive plug PG2 (second plug) is disposed on the semiconductor substrate SB in the power feeding region 2B, and a voltage for controlling the threshold voltage of the p-channel-type MISFET Qp (second MISFET) can be supplied from the plug PG2 to the n-type semiconductor region NR1 via the n-type semiconductor region NR2. With this, the threshold voltage of the n-channel-type MISFET Qn and the threshold voltage of the p-channel-type MISFET Qp can be easily and appropriately controlled.

Still further, in the first embodiment, the p-type semiconductor region PR2 and the p-type semiconductor region PR1a (PR1 and PR3) are preferably formed by using the same mask layer (here, the photoresist pattern RP3). Also, the n-type semiconductor region NR2 and the n-type semiconductor region NR1a (NR1 and NR3) are preferably formed by using the same mask layer (here, the photoresist pattern RP4). With this, the number of process of manufacturing processes can be reduced, and the manufacturing cost of the semiconductor device can also be reduced. Furthermore, the number of photomasks required for use in exposure of the photoresist layer can be reduced. Also from this viewpoint, the manufacturing cost of the semiconductor device can be reduced.

Normally, a plurality of MISFETS with different threshold voltages are generally mounted in a mixed manner on the SOI substrate. Therefore, ion implantation for threshold adjustment (corresponding to ion implantation at step S6 and ion implantation at step S8) is performed as many as the number of threshold voltages by forming a photoresist pattern again as an ion implantation blocking mask. For this reason, the number of photomasks required for use in exposing the photoresist layer is not increased, compared with conventional technologies.

Second Embodiment

In a second embodiment, another scheme for manufacturing the semiconductor device according to the first embodiment is described. The structure of the semiconductor device according to the second embodiment is basically similar to the semiconductor device of the first embodiment, and therefore is not described herein. A semiconductor device manufacturing process is described with reference to the drawings.

Also, in the second embodiment, a p-type well PW forming process and an n-type well NW forming process are different from those of the first embodiment, and other manufacturing processes are basically identical to those of the first embodiment. Therefore, in the second embodiment, the difference from the first embodiment is mainly described, and the same processes are not repeatedly described herein.

FIG. 49 to FIG. 52 and FIG. 54 to FIG. 65 are plan views or cross-sectional views of main parts during a semiconductor device manufacturing process of the second embodiment. FIG. 53 is a descriptive diagram of angled ion implantation.

Among FIG. 49 to FIG. 52 and FIG. 54 to FIG. 65, FIG. 49, FIG. 51, FIG. 54, FIG. 56, FIG. 58, FIG. 60, FIG. 62, and FIG. 64 are plan views of a region corresponding to FIG. 1, and the members are partially hatched for easy understanding. Also, among FIG. 49 to FIG. 52 and FIG. 54 to FIG. 65, FIG. 50, FIG. 52, FIG. 55, FIG. 57, FIG. 59, FIG. 61, FIG. 63, and FIG. 65 are cross-sectional views of a region corresponding to FIG. 2, and roughly correspond to cross-sectional views along an A-A line of the corresponding plan views.

Until the device isolation region ST is formed at step S2 to obtain the structure of FIG. 9 and FIG. 10, the manufacturing process of the second embodiment is similar to the manufacturing process of the first embodiment, and therefore is not repeatedly described herein.

Figure 49:
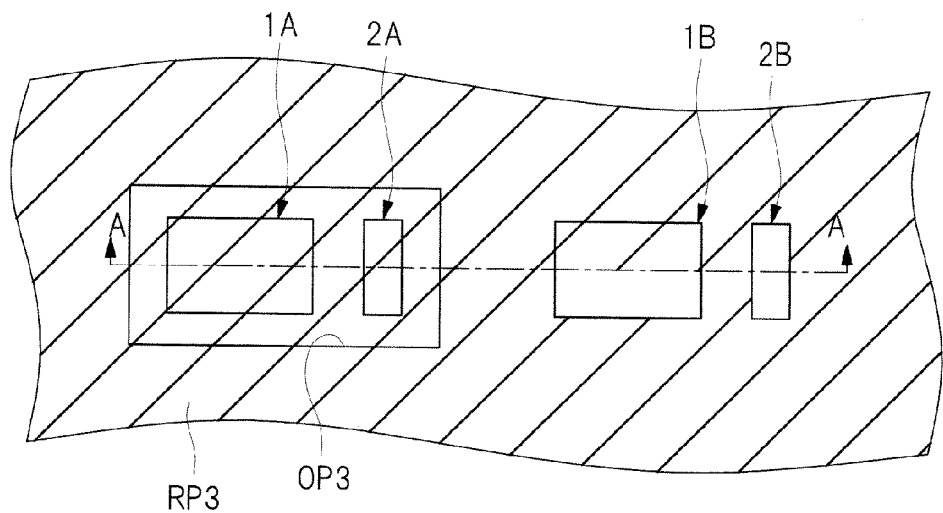
FIG. 49 is a plan view of main parts in a manufacturing process of a semiconductor device according to a second embodiment.
Figure 50:
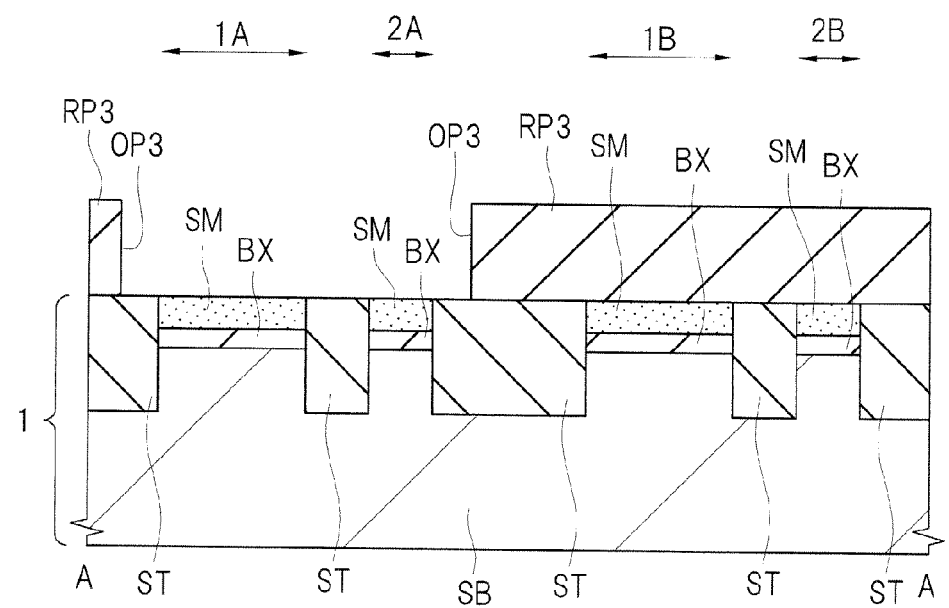
FIG. 50 is a cross-sectional view of main parts of the semiconductor device in the manufacturing process same as FIG. 49.

In the second embodiment, after the device isolation region ST is formed at step S2 to obtain the structure of FIG. 9 and FIG. 10, as illustrated in FIG. 49 and FIG. 50, the photoresist pattern RP3 is formed as a mask layer on the main surface of the SOI substrate 1 by using photolithography.

While FIG. 49 is a plan view, the photoresist pattern RP3 is hatched with bold diagonal lines. FIG. 50 roughly corresponds to the cross-sectional view along the A-A line of FIG. 49.

The photoresist pattern RP3 for use in the second embodiment is similar to the photoresist pattern RP3 used in the first embodiment. Thus, the photoresist pattern RP3 for use in the second embodiment has the opening OP3 as described in the first embodiment.

Figure 51:
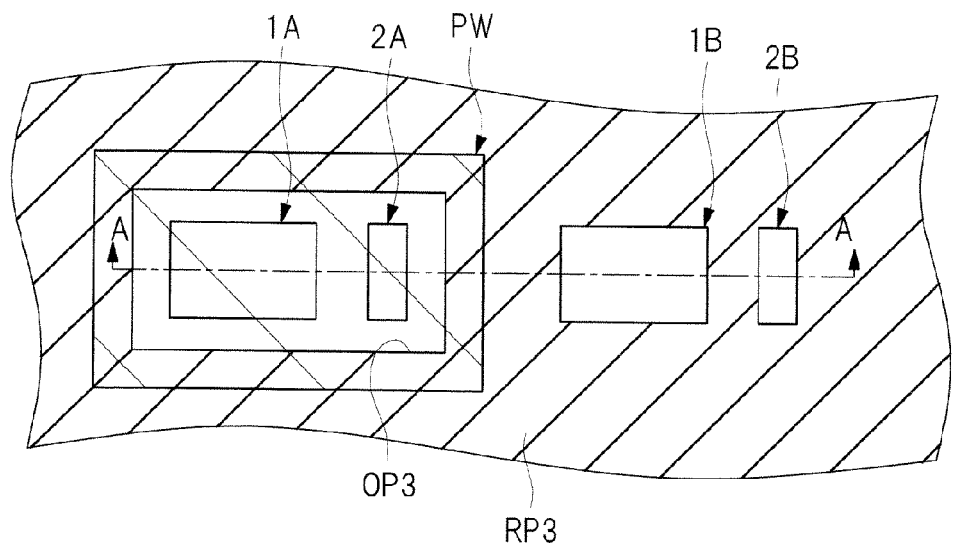
FIG. 51 is a plan view of main parts of the semiconductor device during the manufacturing process continued from FIG. 49 to FIG. 50.
Figure 52:
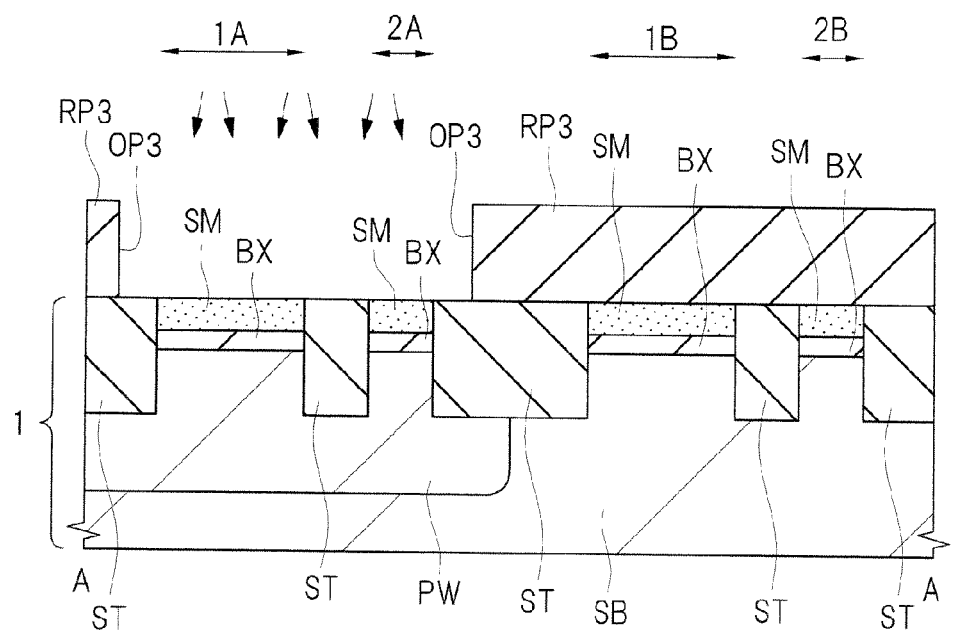
FIG. 52 is a cross-sectional view of main parts of the semiconductor device in the manufacturing process same as FIG. 51.
Figure 53:
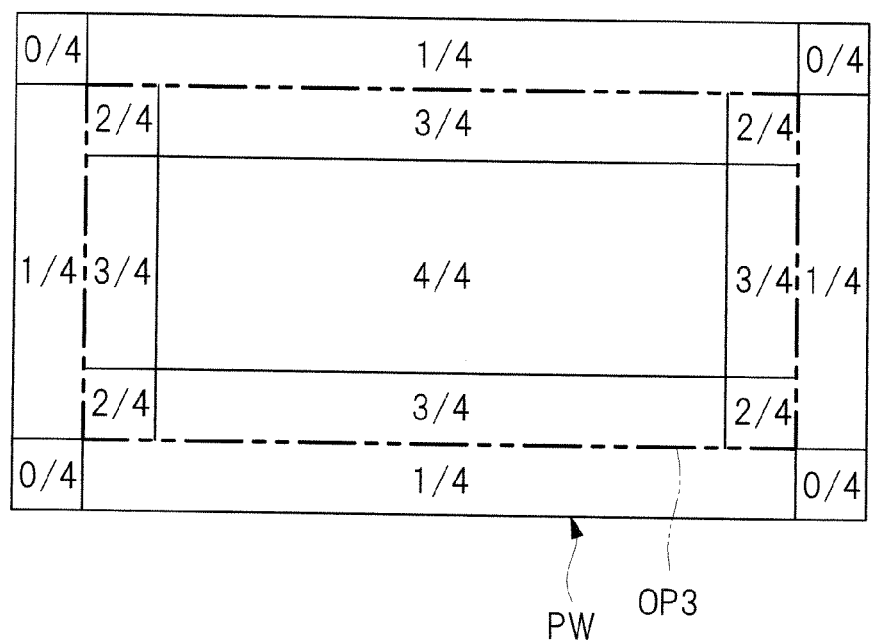
FIG. 53 is a descriptive diagram of angled ion implantation.

Next, as illustrated in FIG. 51 and FIG. 52, by using the photoresist pattern RP3 as a mask (ion implantation blocking mask), p-type impurities (for example, boron) are ion-implanted in the semiconductor substrate SB of the SOI substrate 1, thereby forming the p-type well PW in the semiconductor substrate SB. However, in the second embodiment, angled ion implantation is used for ion implantation for forming the p-type well PW.

While FIG. 51 is a plan view, the photoresist pattern RP3 is hatched with bold diagonal lines, and a planar region where the p-type well PW is formed is hatched with thin diagonal lines. FIG. 52 roughly corresponds to the cross-sectional view along the A-A line of FIG. 51. In FIG. 52, angled ion implantation is schematically illustrated with arrows.

The p-type well PW forming process in the second embodiment is different from the p-type well PW forming process in the first embodiment in that the photoresist pattern RP3 is used as an ion implantation mask in place of the photoresist pattern RP1 and that angled ion implantation is used in place of vertical ion implantation. Other than those described above, the p-type well PW forming process in the second embodiment is basically similar to the p-type well PW forming process in the first embodiment.

In the second embodiment, since angled ion implantation is used to form the p-type well PW, the p-type well PW is not formed so as to be aligned with the opening OP3 of the photoresist pattern RP3, but is formed so as to have a planar dimension (planar area) larger than the opening OP3. The depth (depth position of the bottom surface) of the p-type well PW in the second embodiment is similar to that of the first embodiment.

Here, angled ion implantation is such that ion implantation is performed so that impurity ions are implanted from a direction tilted from the normal line of the substrate (the normal line of the main surface of the substrate) into the main surface of the substrate. For this reason, the incident angle of the impurity ions with respect to the main surface of the substrate is smaller than 90 degrees. On the other hand, in normal ion implantation, that is, vertical ion implantation, ion implantation is performed so that impurity ions are implanted from the direction of the normal to the substrate (the normal line of the main surface of the substrate) into the main surface of the substrate. For this reason, in normal ion implantation, that is, vertical ion implantation, the incident angle of the impurity ions with respect to the main surface of the substrate is approximately 90 degrees. In the second embodiment, the main surface of the substrate herein corresponds to the main surface of the SOI substrate 1 (or the main surface of the semiconductor substrate SB).

In the second embodiment, an ion implanting process for forming the p-type well PW can be carried out by, for example, performing angled ion implantation with the SOI substrate 1 stopped every time the SOI substrate 1 is rotated by 90 degrees (four times in total) or performing angled ion implantation with the SOI substrate 1 rotated. This applies to an ion implanting process for forming the n-type well NW, which will be described further below.

FIG. 53 is a plan view schematically illustrating a dose amount distribution in the p-type well PW formed when the angled ion implanting process for forming the p-type well PW is carried out by performing angled ion implantation every tune the SOI substrate 1 is rotated by 90 degrees (four times in total) with the SOI substrate 1 stopped. In FIG. 53, the position of the opening OP3 of the photoresist pattern RP3 is indicated by a two-dot chain line. Numerals in FIG. 53 each indicate a degree of the dose amount implanted out of a total doze amount at four-time ion implantation. In the formed p-type well PW, a peripheral part when seen in a plan view has impurity concentration lower than that of an inner side. For this reason, an effect can be obtained such that, if the p-type well PW and the n-type well NW are each formed by angled ion implantation, when the p-type well PW and the n-type well NW are adjacent to each other, the withstand voltage of the pn junction formed between the p-type well PW and the n-type well NW can be more improved.

Figure 54:
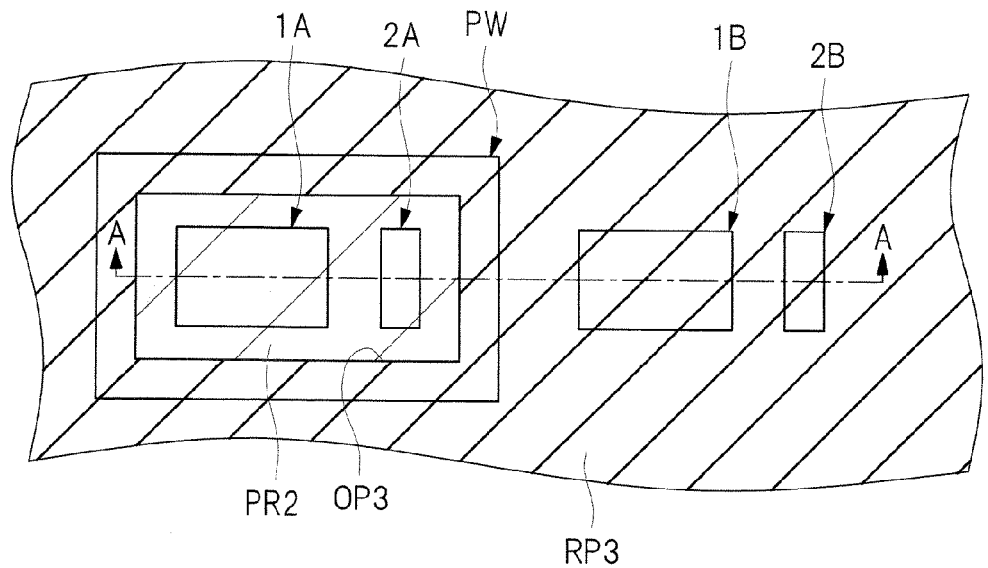
FIG. 54 is a plan view of main parts of the semiconductor device during the manufacturing process continued from FIG. 51 to FIG. 52.
Figure 55:
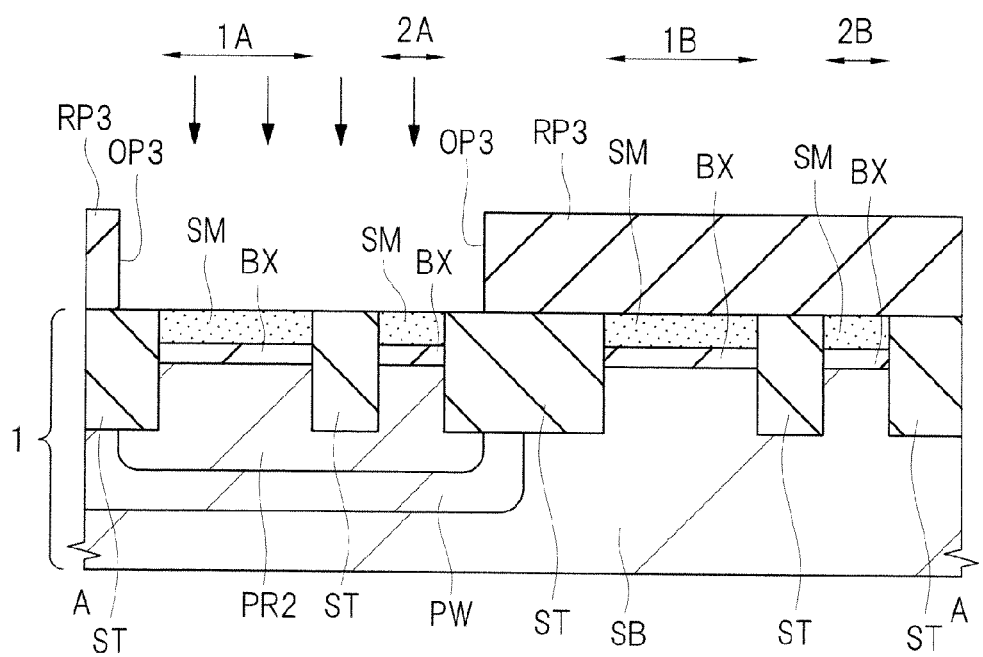
FIG. 55 is a cross-sectional view of main parts of the semiconductor device in the manufacturing process same as FIG. 54.

Next, as illustrated in FIG. 54 and FIG. 55, by using the photoresist pattern RP3 as a mask (ion implantation blocking mask), p-type impurities (for example, boron) are ion-implanted in the semiconductor substrate SB of the SOI substrate 1, thereby forming the p-type semiconductor region PR2.

However, vertical ion implantation is used for ion implantation for forming the p-type semiconductor region PR2. With this, the p-type semiconductor region PR2 is formed so as to be aligned with the opening OP3 of the photoresist pattern RP3.

The p-type semiconductor region PR2 forming process of the second embodiment is similar to that of the first embodiment. Thus, the range where the p-type semiconductor region PR2 is formed in the second embodiment is similar to that of the first embodiment, including the depth (depth position of the bottom surface).

While FIG. 54 is a plan view, the photoresist pattern RP3 is hatched with bold diagonal lines, and a planar region where the p-type semiconductor region PR2 is formed is hatched with thin diagonal lines. FIG. 55 roughly corresponds to the cross-sectional view along the A-A line of FIG. 54. In FIG. 55, vertical ion implantation is schematically illustrated with arrows.

In the second embodiment, by using the same photoresist pattern RP3 as a mask, the p-type well PW is formed by angled ion implantation and the p-type semiconductor region PR2 is formed by vertical ion implantation. With this, the p-type semiconductor region PR2 is formed so as to be contained in the p-type well PW. Therefore, the p-type semiconductor region PR2 has impurity concentration higher than that of the p-type well PW, is contained in the p-type well PW, and is formed so as to be shallower than the p-type semiconductor region PR2. The bottom surface and the side surface of the p-type semiconductor region PR2 is in contact with the p-type well PW, except a portion in contact with the device isolation region ST (that is, surrounded by the p-type well PW). As with the first embodiment, also in the second embodiment, the p-type semiconductor region PR2 and the p-type well PW both include the nMIS formation region 1A and the power feeding region 2A when seen in a plan view.

Figure 56:
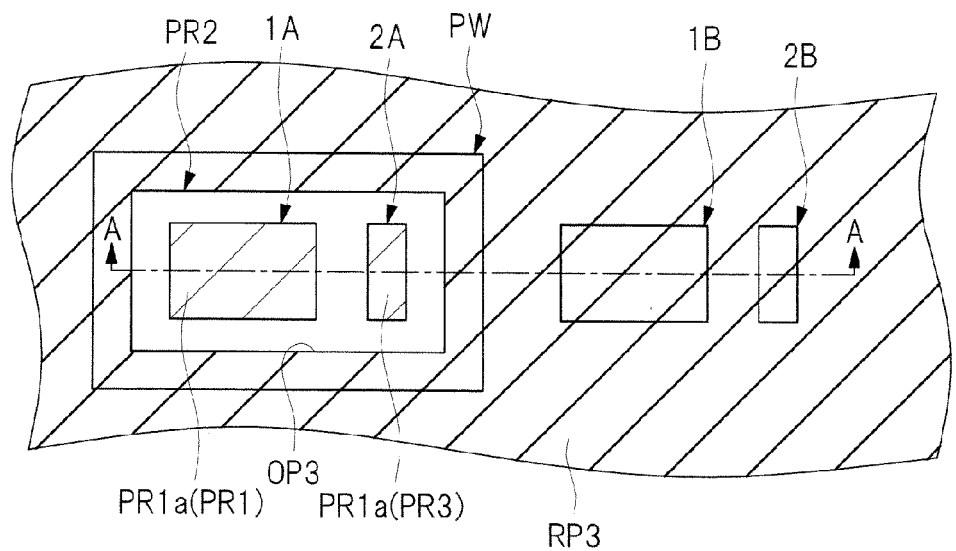
FIG. 56 is a plan view of main parts of the semiconductor device during the manufacturing process continued from FIG. 54 to FIG. 55.
Figure 57:
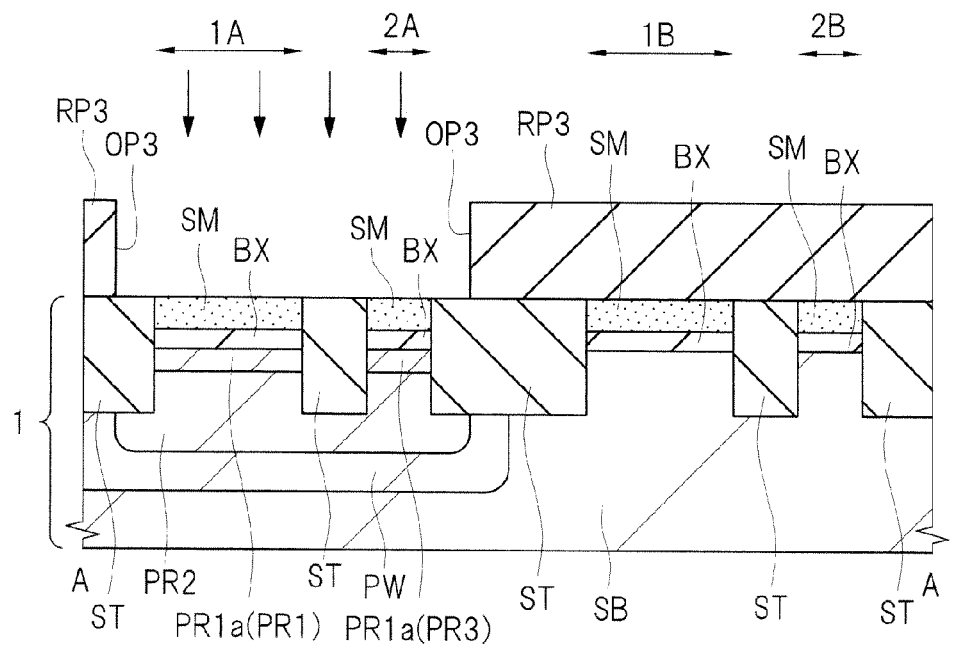
FIG. 57 is a cross-sectional view of main parts of the semiconductor device in the manufacturing process same as FIG. 56.

Next, as illustrated in FIG. 56 and FIG. 57, by using the photoresist pattern RP3 as a mask (ion implantation blocking mask), p-type impurities (for example, boron) are ion-implanted in the semiconductor substrate SB of the SOI substrate 1, thereby forming the p-type semiconductor region PR1a. However, vertical ion implantation is used for ion implantation for forming the p-type semiconductor region PR1a. Then, the photoresist pattern RP3 is removed.

The p-type semiconductor region PR1a forming process of the second embodiment is similar to that of the first embodiment. Thus, the range where the p-type semiconductor region PR1a is formed in the second embodiment is similar to that of the first embodiment, including the depth (depth position of the bottom surface). The p-type semiconductor region PR1 a formed in the semiconductor substrate SB in the nMIS formation region 1A is the p-type semiconductor region PR1, and the p-type semiconductor region PR1a formed in the semiconductor substrate SB in the power feeding region 2A is the p-type semiconductor region PR3.

While FIG. 56 is a plan view, the photoresist pattern RP3 is hatched with bold diagonal lines, and a planar region where the p-type semiconductor region PR2 is formed is hatched with thin diagonal lines. FIG. 57 roughly corresponds to the cross-sectional view along the A-A line of FIG. 56. In FIG. 57, vertical ion implantation is schematically illustrated with arrows.

Figure 58:
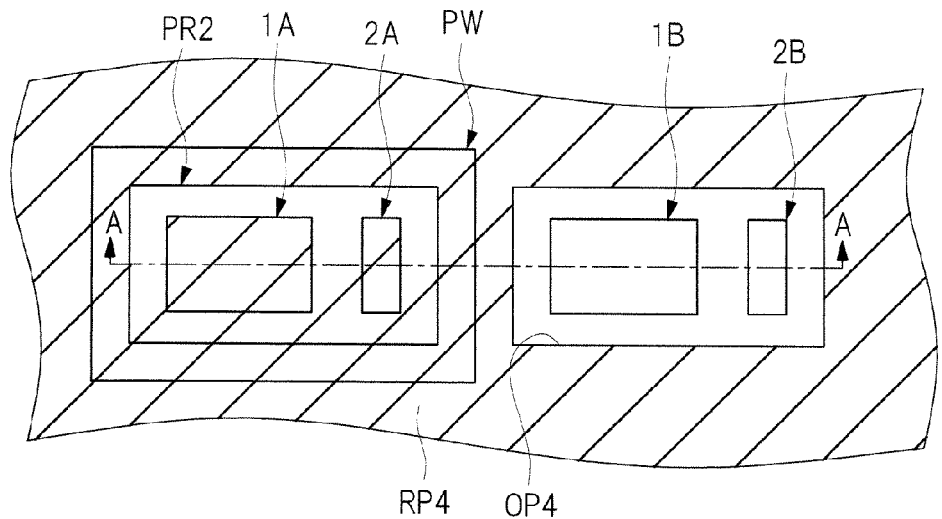
FIG. 58 is a plan view of main parts of the semiconductor device during the manufacturing process continued from FIG. 56 to FIG. 57.
Figure 59:
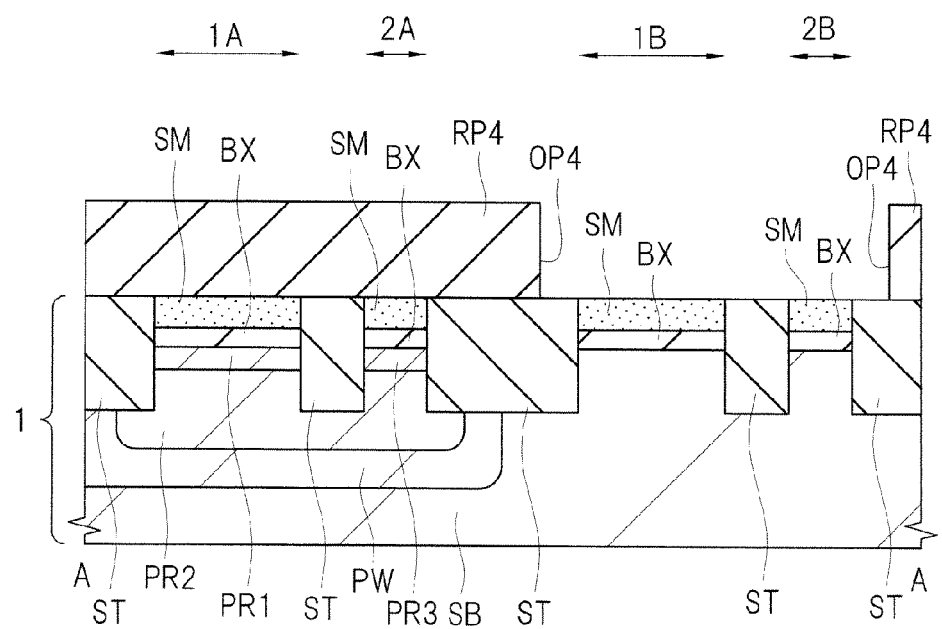
FIG. 59 is a cross-sectional view of main parts of the semiconductor device in the manufacturing process same as FIG. 58.

Next, as illustrated in FIG. 58 and FIG. 59, the photoresist pattern RP4 is formed on the main surface of the SOI substrate 1 as a mask layer by using photolithography.

While FIG. 58 is a plan view, the photoresist pattern RP4 is hatched with bold diagonal lines. FIG. 59 roughly corresponds to the cross-sectional view along the A-A line of FIG. 58.

The photoresist pattern RP4 for use in the second embodiment is similar to the photoresist pattern RP4 used in the first embodiment. Thus, the photoresist pattern RP4 for use in the second embodiment has the opening OP4 as described in the first embodiment.

Figure 60:
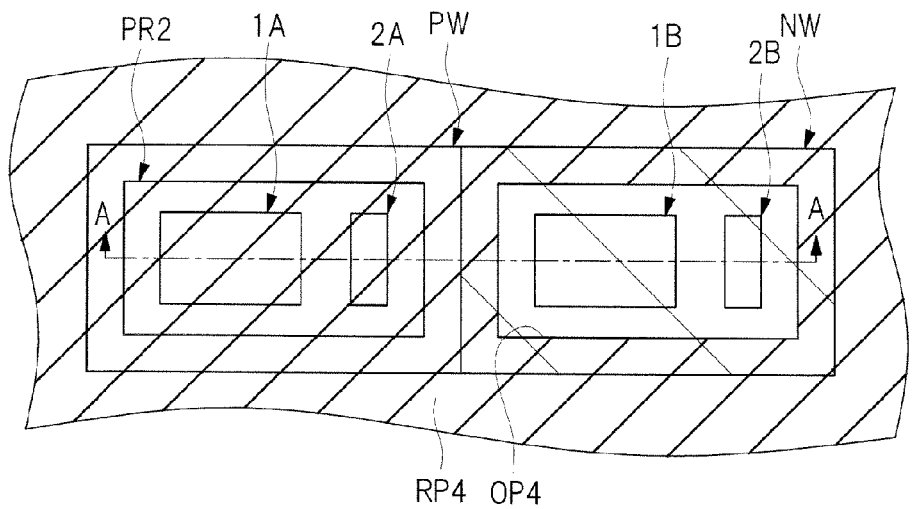
FIG. 60 is a plan view of main parts of the semiconductor device during the manufacturing process continued from FIG. 58 to FIG. 59.
Figure 61:
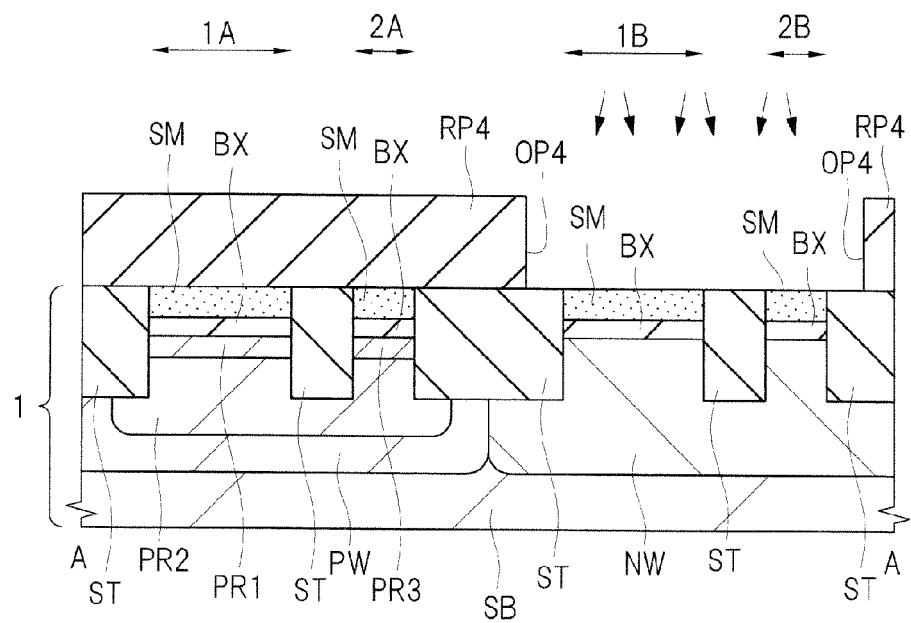
FIG. 61 is a cross-sectional view of main parts of the semiconductor device in the manufacturing process same as FIG. 60.

Next, as illustrated in FIG. 60 and FIG. 61, by using the photoresist pattern RP4 as a mask (ion implantation blocking mask), n-type impurities (for example, phosphorous or arsenic) are ion-implanted in the semiconductor substrate SB of the SOI substrate 1, thereby forming the n-type well NW in the semiconductor substrate SB. However, in the second embodiment, angled ion implantation is used for ion implantation for forming the p-type well PW.

While FIG. 60 is a plan view, the photoresist pattern RP4 is hatched with bold diagonal lines, and a planar region where the n-type well NW is formed is hatched with thin diagonal lines. FIG. 61 roughly corresponds to the cross-sectional view along the A-A line of FIG. 60. In FIG. 61, angled ion implantation is schematically illustrated with arrows.

The n-type well NW forming process in the second embodiment is different from the n-type well NW forming process in the first embodiment in that the photoresist pattern RP4 is used as an ion implantation mask in place of the photoresist pattern RP2 and that angled ion implantation is used in place of vertical ion implantation. Other than those described above, the n-type well NW forming process in the second embodiment is basically similar to the n-type well NW forming process in the first embodiment.

In the second embodiment, since angled ion implantation is used to form the n-type well NW, the n-type well NW is not formed so as to be aligned with the opening OP4 of the photoresist pattern RP4, but is formed so as to have a planar dimension (planar area) larger than the opening OP4. The depth (depth position of the bottom surface) of the n-type well NW in the second embodiment is similar to that of the first embodiment.

Figure 62:
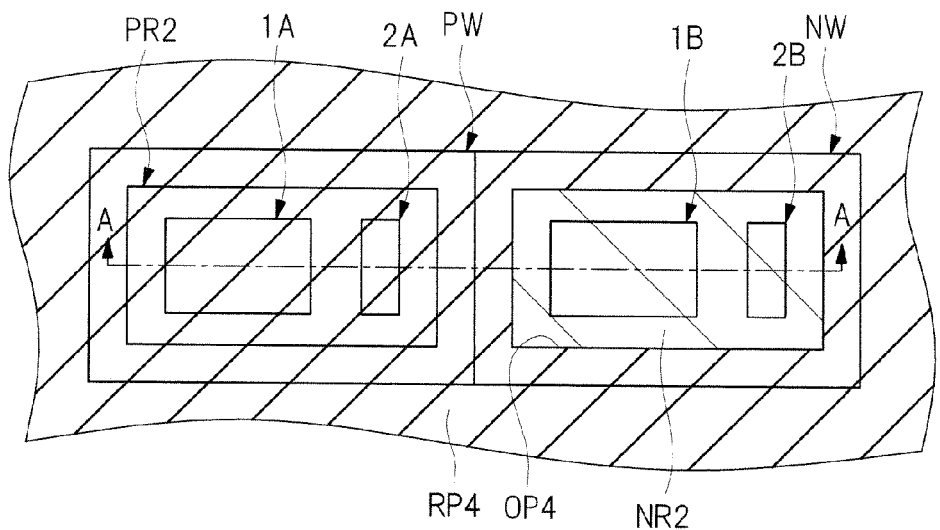
FIG. 62 is a plan view of main parts of the semiconductor device during the manufacturing process continued from FIG. 60 to FIG. 61.
Figure 63:
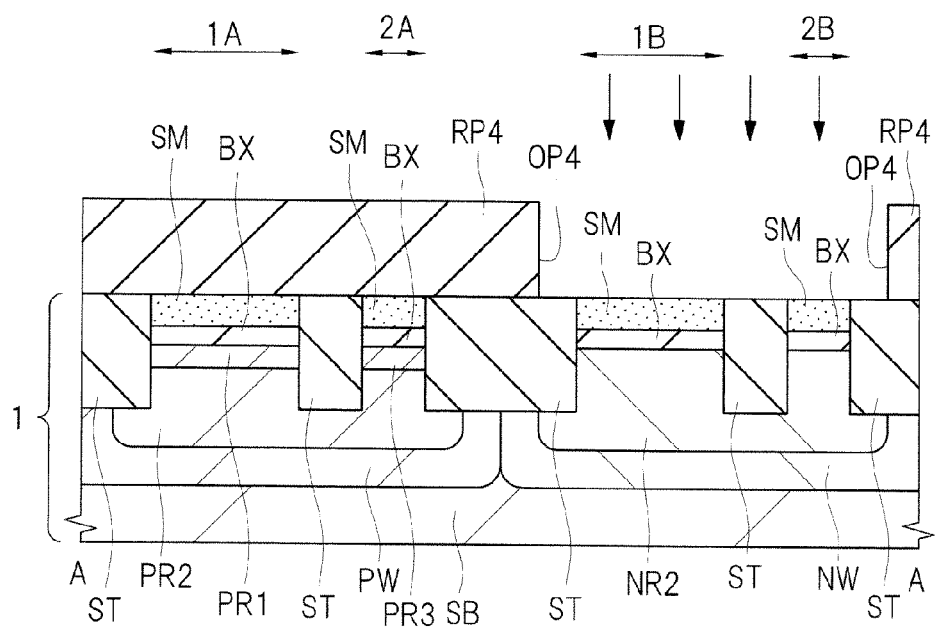
FIG. 63 is a cross-sectional view of main parts of the semiconductor device in the manufacturing process same as FIG. 62.

Next, as illustrated in FIG. 62 and FIG. 63, by using the photoresist pattern RP4 as a mask (ion implantation blocking mask), n-type impurities (for example, phosphorous or arsenic) are ion-implanted in the semiconductor substrate SB of the SOI substrate 1, thereby forming the n-type semiconductor region NR2.

However, vertical ion implantation is used for ion implantation for forming the n-type semiconductor region NR2, with this, the n-type semiconductor region NR2 is formed so as to be aligned with the opening OP4 of the photoresist pattern RP4.

The n-type semiconductor region NR2 forming process of the second embodiment is similar to that of the first embodiment. Thus, the range where the n-type semiconductor region NR2 is formed in the second embodiment is similar to that of the first embodiment, including the depth (depth position of the bottom surface).

While FIG. 62 is a plan view, the photoresist pattern RP4 is hatched with bold diagonal lines, and a planar region where the n-type semiconductor region NR2 is formed is hatched with thin diagonal lines. FIG. 63 roughly corresponds to the cross-sectional view along the A-A line of FIG. 62. In FIG. 63, vertical ion implantation is schematically illustrated with arrows.

In the second embodiment, by using the same photoresist pattern RP4 as a mask, the n-type well NW is formed by angled ion implantation and the n-type semiconductor region NR2 is formed by vertical ion implantation. With this, the n-type semiconductor region NR2 is formed so as to be contained in the n-type well NW. Therefore, the n-type semiconductor region NR2 has impurity concentration higher than that of the n-type well NW, is contained in the n-type well NW, and is formed so as to be shallower than the n-type semiconductor region NR2. The bottom surface and the side surface of the n-type semiconductor region NR2 is in contact with the n-type well NW, except a portion in contact with the device isolation region ST (that is, surrounded by the n-type well NW). As with the first embodiment, also in the second embodiment, the n-type semiconductor region NR2 and the n-type well NW both include the pMIS formation region 1B and the power feeding region 2B when seen in a plan view.

Figure 64:
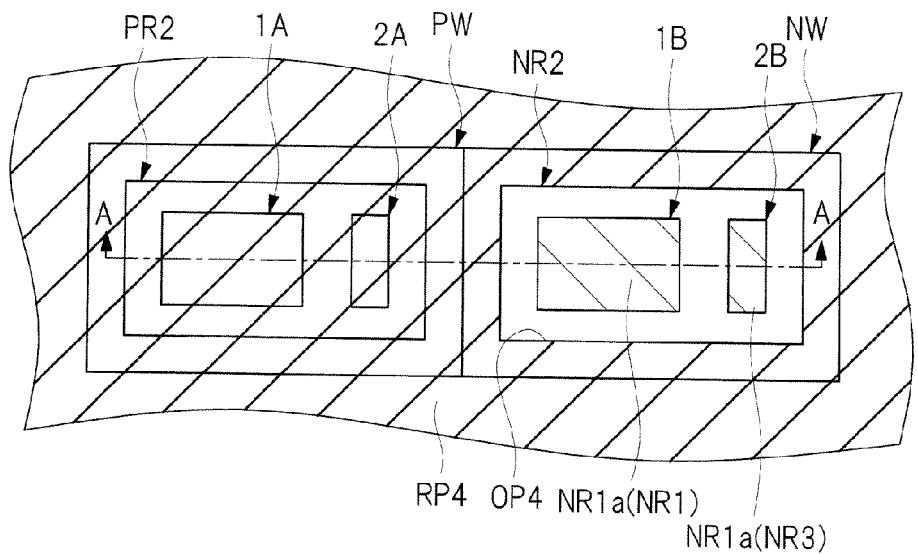
FIG. 64 is a plan view of main parts of the semiconductor device during the manufacturing process continued from FIG. 62 to FIG. 63.
Figure 65:
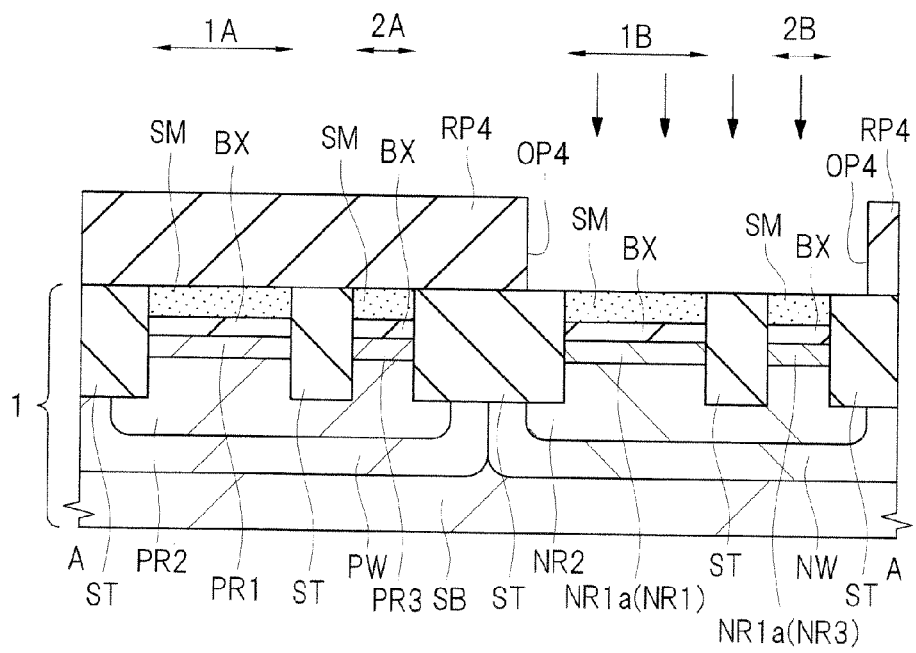
FIG. 65 is a cross-sectional view of main parts of the semiconductor device in the manufacturing process same as FIG. 64.

Next, as illustrated in FIG. 64 and FIG. 65, by using the photoresist pattern RP4 as a mask (ion implantation blocking mask), n-type impurities (for example, phosphorous or arsenic) are ion-implanted in the semiconductor substrate SB of the SOI substrate 1, thereby forming the n-type semiconductor region NR1a. However, vertical ion implantation is used for ion implantation for forming the n-type semiconductor region NR1a. Then, the photoresist pattern RP4 is removed.

The n-type semiconductor region NR1a forming process of the second embodiment is similar to that of the first embodiment. Thus, the range where the n-type semiconductor region NR1a is formed in the second embodiment is similar to that of the first embodiment, including the depth (depth position of the bottom surface). The n-type semiconductor region NR1a formed in the semiconductor substrate SB in the pMIS formation region 1B is the n-type semiconductor region NR1, and the n-type semiconductor region NR1a formed in the semiconductor substrate SB in the power feeding region 2B is the n-type semiconductor region NR3.

While FIG. 64 is a plan view, the photoresist pattern RP4 is hatched with bold diagonal lines, and a planar region where the n-type semiconductor region NR1a is formed is hatched with thin diagonal lines. FIG. 65 roughly corresponds to the cross-sectional view along the A-A line of FIG. 64. In FIG. 65, vertical ion implantation is schematically illustrated with arrows.

Here, the case has been described in which the p-type well PW, the p-type semiconductor region PR2, and the p-type semiconductor region PR1a are formed first and then the n-type well NW, the n-type semiconductor region NR2, and the n-type semiconductor region NR1 are formed. In another mode, the p-type well PW, the p-type semiconductor region PR2, the p-type semiconductor region PR1a may be formed after the n-type well NW, the n-type semiconductor region NR2, and the n-type semiconductor region NR1 is formed.

The subsequent processes in the second embodiment are similar to those in the first embodiment. That is, steps S9 to S16 are performed in a manner similar to that of the first embodiment. As described in the first embodiment, also in the second embodiment, after the device isolation region ST is formed at step S2, step S9 may be performed, and then the p-type well PW, the n-type well NW, the p-type semiconductor region PR2, the p-type semiconductor region PR1a, the n-type semiconductor region NR2, and the n-type semiconductor region NR1a may be formed by ion implantation.

Also in the second embodiment, effects approximately similar to those of the first embodiment can be obtained.

In the second embodiment, the following effects can be further achieved. That is, in the second embodiment, angled ion implantation is adopted for ion implantation for forming the p-type well PW and ion implantation for forming the n-type well NW. For this reason, the p-type well PW and the p-type semiconductor region PR2 contained in the p-type well PW can be formed by using the same mask layer (here, the photoresist pattern RP3). Also, the n-type well NW and the n-type semiconductor region NR2 contained in the n-type well NW can be formed by using the same mask layer (here, the photoresist pattern RP4). With this, the number of manufacturing process can be reduced, and the manufacturing cost of the semiconductor device can be reduced. Furthermore, the number of photomasks required for use in exposing the photoresist layer can be reduced. Also in this point, the manufacturing cost of the semiconductor device can be reduced.

Furthermore, in the first and second embodiments, the p-type semiconductor region PR2 and the p-type semiconductor region PR1a (PR1 and PR3) are preferably formed by using the same mask layer (here, photoresist pattern RP3). Also, the n-type semiconductor region NR2 and the n-type semiconductor region NR1a (NR1 and NR3) are preferably formed by using the same mask layer (here, photoresist pattern RP4). With this, the number of manufacturing processes can be reduced, and the manufacturing cost of the semiconductor device can be reduced. Furthermore, the number of photomasks required for use in exposing the photoresist layer can be reduced. Also in this point, the manufacturing cost of the semiconductor device can be reduced.

Therefore, in the second embodiment, the p-type well PW, the p-type semiconductor region PR2, and the p-type semiconductor region PR1a (PR1 and PR3) can be formed by using the same mask layer (here, photoresist pattern RP3). Also, the n-type well NW, the n-type semiconductor region NR2, and the n-type semiconductor region NR1a (NR1 and NR3) can be formed by using the same mask layer (here, photoresist pattern RP4). With this, the number of manufacturing processes can be reduced, and the manufacturing cost of the semiconductor device can be reduced.

Third Embodiment

Figure 66:
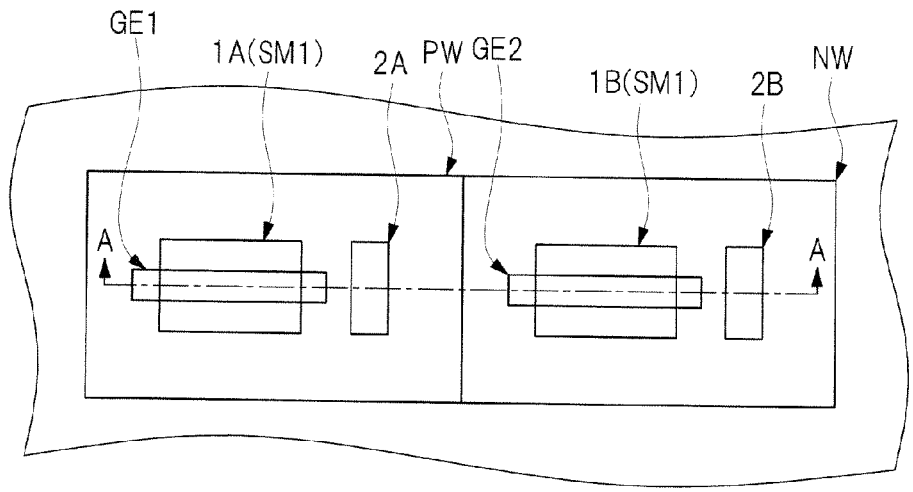
FIG. 66 is a plan view of main parts of a semiconductor device in a manufacturing process of a third embodiment.
Figure 67:
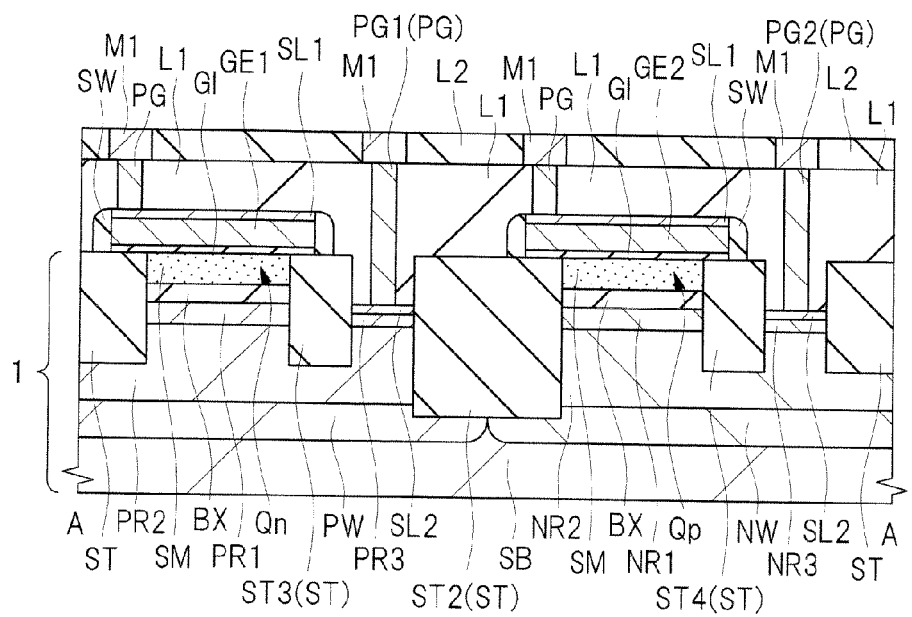
FIG. 67 is a cross-sectional view of main parts of the semiconductor device in the manufacturing process of the third embodiment.

FIG. 66 is a plan view of main parts of a semiconductor device of the third embodiment, and corresponds to FIG. 1 of the first embodiment. FIG. 67 is a cross-sectional view of the semiconductor device of the third embodiment, and corresponds to FIG. 2 of the first embodiment. FIG. 67 roughly corresponds to the cross-sectional view along the A-A line of FIG. 66.

The semiconductor device according to the third embodiment illustrated in FIG. 66 and FIG. 67 is different from that of the first embodiment in that the portion of the device isolation region ST interposed between the p-type semiconductor region PR2 and the n-type semiconductor region NR2 (that is, the device isolation region ST2) is made deeply. Other than that, the semiconductor device of the third embodiment is basically identical to the semiconductor device of the first embodiment. Therefore, in the third embodiment, the difference from the first embodiment is mainly described, and the same portions are not repeatedly described herein.

Here, in the device isolation region ST, the portion of the device isolation region ST with a deep depth (depth position of the bottom surface) is provided with a reference character ST2 and is referred to as the device isolation region ST2 or deep device isolation region ST2. The depth (depth position of the bottom surface) of the deep device isolation region ST2 is deeper than the depth (depth position of the bottom surface) of the deep device isolation region ST other than the deep device isolation region ST2.

Also, the portion of the device isolation region ST interposed between the nMIS formation region 1A and the power feeding region 2A when seen in a plan view is provided with a reference character ST3 and is referred to as the device isolation region ST3. Furthermore, the portion of the device isolation region ST interposed between the pMIS formation region 1B and the power feeding region 2B when seen in a plan view is provided with a reference character ST4 and is referred to as the device isolation region ST4. The device isolation region ST3 and the device isolation region ST4 are not the deep device isolation region ST2, and the depth (depth position of the bottom surface) of the device isolation region ST3 and the depth (depth position of the bottom surface) of the device isolation region ST4 are shallower than the depth (depth position of the bottom surface) of the deep device isolation region ST2. On the other hand, the portion of the device isolation region ST interposed between the p-type semiconductor region PR2 and the n-type semiconductor region NR2 is configured of the deep device isolation region ST2.

Figure 68:
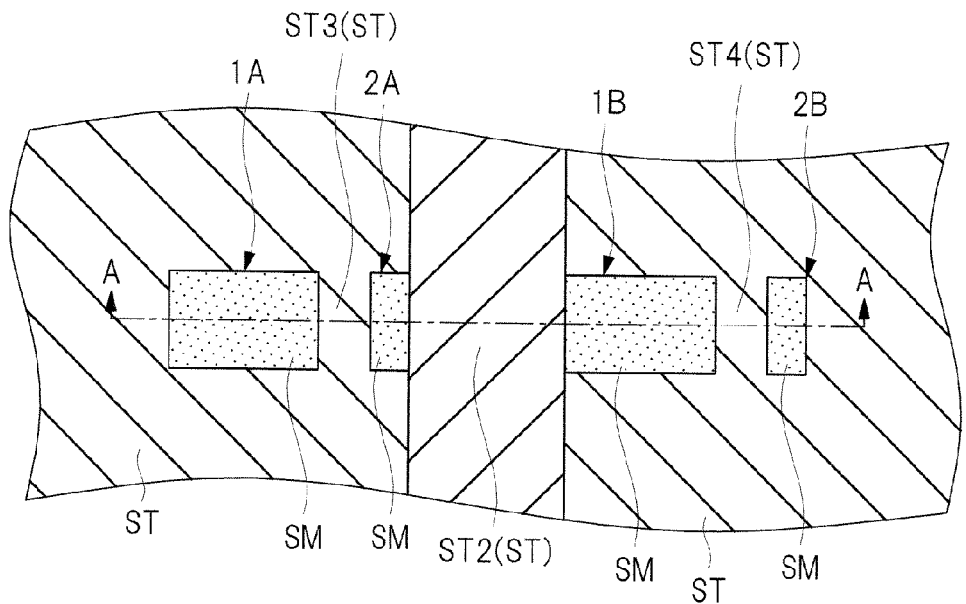
FIG. 68 is a plan view of main parts of the semiconductor device in the manufacture process of the third embodiment.

In FIG. 68, which will be described further below, a formation region of the deep device isolation region ST2 is illustrated. With reference to FIG. 66 to FIG. 68, the portion of the device isolation region ST interposed between the p-type semiconductor region PR2 and the n-type semiconductor region NR2 is configured of the deep device isolation region ST2.

For this reason, in the third embodiment, the portion of the device isolation region ST interposed between the p-type semiconductor region PR2 and the n-type semiconductor region NR2 is the deep device isolation region ST2, and the bottom surface of the deep device isolation region ST is at a deeper level than the bottom surface of the device isolation region ST3 and at a deeper level than the bottom surface of the device isolation region ST4. In addition, the bottom surface of the p-type semiconductor region PR2 is at a deeper level than the bottom surface of the device isolation region ST3 but is at a shallower level than the bottom surface of the deep device isolation region ST2. The bottom surface of the n-type semiconductor region NR2 is at a deeper level than the bottom surface of the device isolation region ST4 but is at a shallower level than the deep device isolation region ST2. Therefore, the p-type semiconductor region PR2 extends to also under the device isolation region ST3 but is not formed under the device isolation region ST2, and the n-type semiconductor region NR2 extends to also under the device isolation region ST4 but is not formed under the device isolation region ST2.

In the third embodiment, the p-type well PW and the n-type well NW are adjacent to each other under the deep device isolation region ST2 interposed between the p-type semiconductor region PR2 and the n-type semiconductor region NR2. However, the p-type semiconductor region PR2 having impurity concentration higher than that of the p-type well PW and the n-type semiconductor region NR2 having impurity concentration higher than the n-type well NW are formed so as to be shallower than the deep device isolation region 512. Therefore, between the p-type semiconductor region PR2 and the n-type semiconductor region NR2, the deep device isolation region ST2 is interposed, thereby making the p-type semiconductor region PR2 and the n-type semiconductor region NR2 not in contact with each other. That is, the p-type semiconductor region PR2 and the n-type semiconductor region NR2 are separated by the portion of the device isolation region ST interposed between the p-type semiconductor region PR2 and the n-type semiconductor region NR2. For this reason, the p-type semiconductor region PR2 is not in contact with any of the n-type well NW and the n-type semiconductor region NR2, and the n-type semiconductor region NR2 is not in contact with any of the p-type well PW and the p-type semiconductor region PR2. With this, even if a pn junction is formed between the p-type well PW with low impurity concentration and the n-type well NW with low impurity concentration, a pn junction is not formed between the p-type semiconductor region PR2 with higher impurity concentration and the n-type semiconductor region NR2 with higher impurity concentration Therefore, the withstand voltage of the pn junction formed in the semiconductor substrate SB can be improved, and the leak current of the pn junction can be suppressed. Therefore, reliability of the semiconductor device can be improved and, in turn, the performance the semiconductor device can be improved.

Also in the third embodiment, as with the first embodiment, the p-type well PW is formed in the semiconductor substrate SB so as to include the nMIS formation region 1A and the power feeding region 2A when seen in a plan view, and the p-type semiconductor region PR2 having impurity concentration higher than that of the p-type well PW is formed in the semiconductor substrate SB so as to include the pMIS formation region 1A and the power feeding region 2A when seen in a plan view. Furthermore, the n-type well NW is formed in the semiconductor substrate SB so as to include the pMIS formation region 1B and the power feeding region 2B when seen in a plan view, and the n-type semiconductor region NR2 having impurity concentration higher than that of the n-type well NW is formed in the semiconductor substrate SB so as to include the pMIS formation region 1B and the power feeding region 2B when seen in a plan view The p-type well PW extends to under the p-type semiconductor region PR2, and the bottom surface of the p-type semiconductor region PR2 is at a shallower level than the bottom surface of the p-type well PW. The n-type well NW extends to under the n-type semiconductor region NR2, and the bottom surface of the n-type semiconductor region NR2 is at a shallower level than the bottom surface of the n-type well NW. The bottom surface of the p-type semiconductor region PR2 is at a deeper level than the bottom surface of the device isolation region ST3, which is the portion interposed between the nMIS formation region 1A and the power feeding region 2A when seen in a plan view, and the p-type semiconductor region PR2 extends to also under the device isolation region ST3, which is the portion interposed between the nMIS formation region 1A and the power feeding region 2A when seen in a plan view. The bottom surface of the n-type semiconductor region NR2 is at a deeper level than the bottom surface of the device isolation region ST4, which is the portion interposed between the pMIS formation region 1B and the power feeding region 2B when seen in a plan view, and the n-type semiconductor region NR2 extends to also under the device isolation region ST4, which is the portion interposed between the pMIS formation region 1B and the power feeding region 2B when seen in a plan view.

With this, also in the third embodiment, as with the first embodiment, the potential (voltage) supplied from the power feeding region 2A to the semiconductor substrate SB can be applied via the p-type semiconductor region PR2 having impurity concentration higher than that of the p-type well PW to the portion of the semiconductor substrate SB facing the semiconductor layer SM in the nMIS formation region 1A via the insulating layer BX. For this reason, the threshold voltage of the n-channel-type MISFET Qn formed in the semiconductor layer SM in the nMIS formation region 1A can be controlled at a desired threshold voltage, and parasitic resistance can be reduced. Also, the potential (voltage) supplied from the power feeding region 2B to the semiconductor substrate SB can be applied via the n-type semiconductor region NR2 having impurity concentration higher than that of the n-type well NW to the portion of the semiconductor substrate SB facing the semiconductor layer SM in the pMIS formation region 1B via the insulating layer BX. For this reason, the threshold voltage of the p-channel-type MISFET Qp formed in the semiconductor layer SM in the pMIS formation region 1B can be controlled at a desired threshold voltage, and parasitic resistance can be reduced. Therefore, the performance of the semiconductor device can be improved.

Next, a semiconductor device manufacturing process of the third embodiment is described.

FIG. 68 to FIG. 81 are a plan view and cross-sectional views of main parts during a semiconductor manufacturing process of the present embodiment. Among FIG. 68 to FIG. 81, FIG. 68 is a plan view of a region corresponding to FIG. 66, and FIG. 69 to FIG. 81 are cross-sectional views of a region corresponding to FIG. 67.

As with the first embodiment, also in the third embodiment, the SOI substrate 1 is prepared at step S1. Then, as illustrated in FIG. 68 and FIG. 69, the device isolation region ST is formed in the SOI substrate 1.

While FIG. 68 is a plan view, the device isolation region ST is hatched with bold diagonal lines, and the semiconductor layer SM is hatched with dots. In FIG. 68, the deep device isolation region ST2 is illustrated, with the direction of hatching opposite to the other device isolation region ST. FIG. 69 roughly corresponds to the cross-sectional view along the A-A line of FIG. 68.

Figure 69:
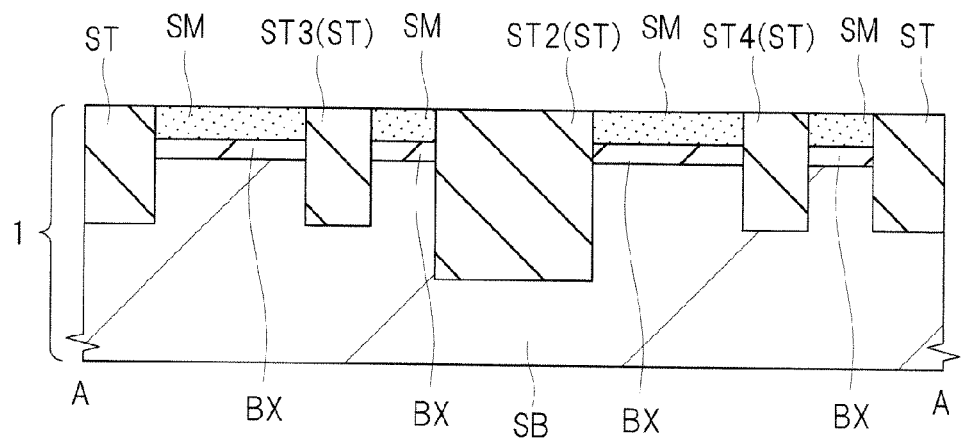
FIG. 69 is a cross-sectional view of main parts of the semiconductor device in the manufacturing process same as FIG. 68.

As illustrated in FIG. 68 and FIG. 69, part of the device isolation region ST in the device isolation region ST formed in the SOT substrate 1 is the device isolation region ST2 deeper than the other portions of the device isolation region ST.

Here, an example of a device isolation region ST forming process in the third embodiment (that is, a process of obtaining the structure illustrated in FIG. 68 and FIG. 69) is described with reference to FIG. 70 to FIG. 77. In the third embodiment, the device isolation region ST forming process can be performed as follows, for example.

Figure 70:
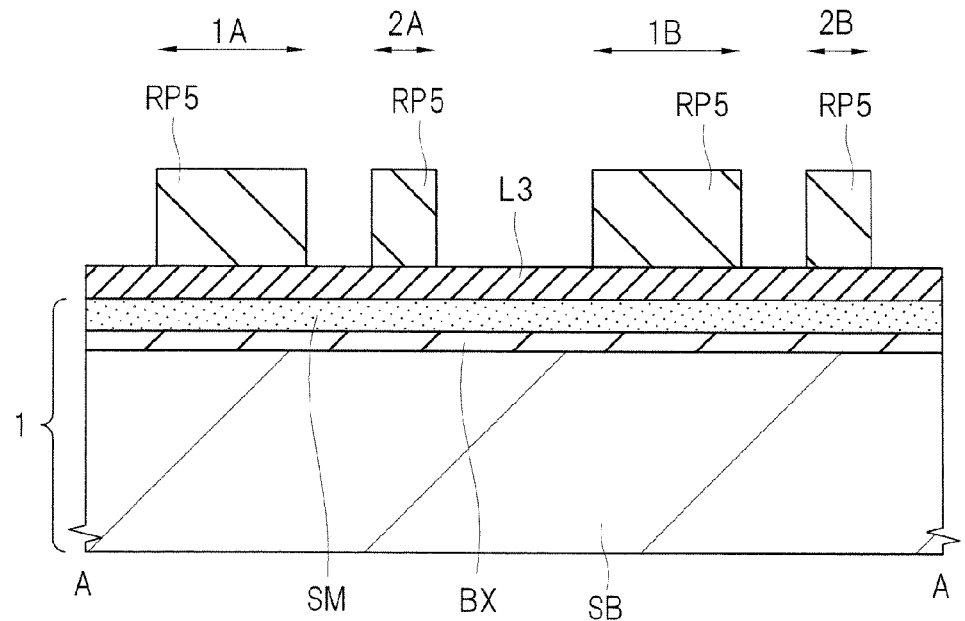
FIG. 70 is a plan view of main parts of the semiconductor device during the manufacturing process continued from FIG. 68 to FIG. 69.

First, as illustrated in FIG. 70, a hard-mask insulating layer L3 is formed on the main surface of the SOI substrate 1, that is, the semiconductor layer SM. The insulating layer L3 is formed of a silicon nitride film or the like. Then, by using photolithography, the photoresist pattern RP5 is formed on the insulating film L3. The photoresist pattern RP5 opens (exposes) a region where the device isolation region ST is scheduled to be formed, and covers a region where the device isolation region ST is not formed.

Figure 71:
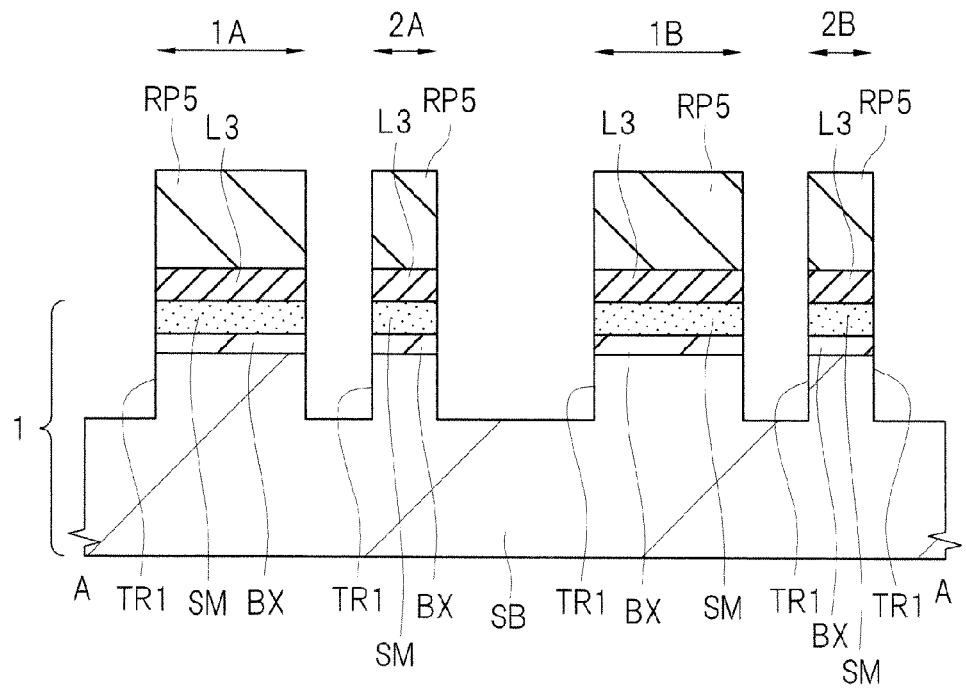
FIG. 71 is a cross-sectional view of main parts of the semiconductor device in the manufacturing process continued from FIG. 70.

Next, as illustrated in FIG. 71, by using the photoresist pattern RP5 as an etching mask, the insulating film L3, the semiconductor layer SM, the insulating layer BX, and the semiconductor substrate SB are subjected to etching (preferably, dry etching), thereby forming a trench TR1 for device isolation. The trench TR1 penetrates through the insulating film L3, the semiconductor layer SM, the insulating layer BX, and the bottom part of the trench TR1 reaches the semiconductor substrate SB. That is, since the bottom part of the trench TR1 is positioned at some point of the depth of the semiconductor substrate SB. For this reason, the semiconductor substrate SB is exposed from the bottom part of the trench TR1.

Figure 72:
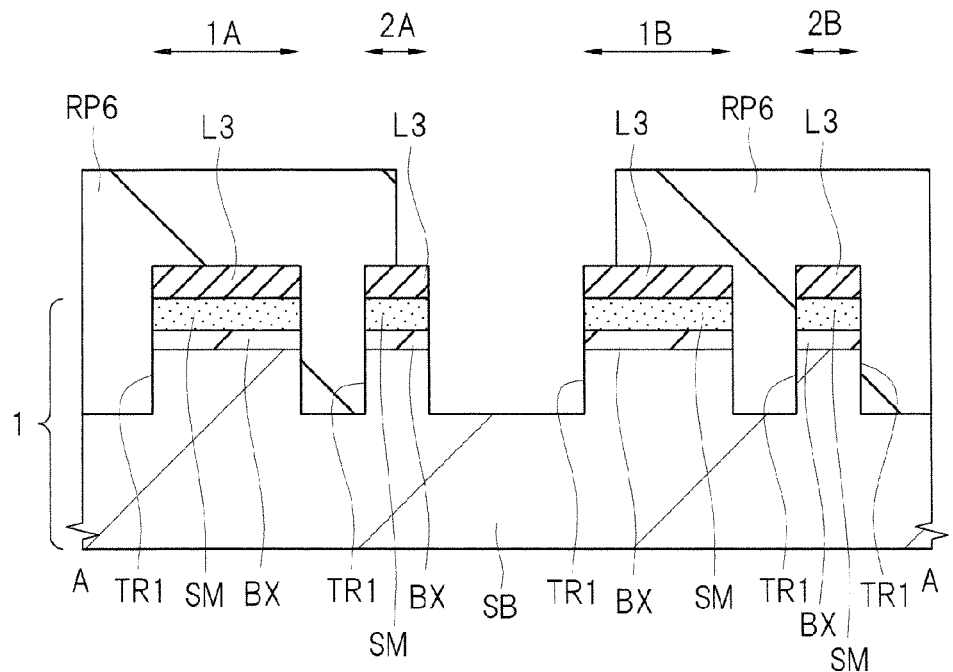
FIG. 72 is a cross-sectional view of main parts of the semiconductor device in the manufacturing process continued from FIG. 71.

Next, after the photoresist pattern RP5 is removed, a photoresist pattern RP6 is formed on the main surface of the SOI substrate 1 by using photolithography, as illustrated in FIG. 72. The photoresist pattern RP6 opens (exposes) a region where the deep device isolation region ST2 is scheduled to be formed, and covers a region where the deep device isolation region ST2 is not formed. For this reason, the trench TR1 in the region where the deep device isolation region ST2 is scheduled to be formed is not covered with the photoresist pattern RP6 but is exposed. On the other hand, the trench TR1 in the region where the deep device isolation region ST2 is not formed is covered with the photoresist pattern RP6.

Here, the deep device isolation region ST2 formation scheduled region, the opening of the photoresist pattern RP6 is preferably formed so as to be slightly larger than the opening of the photoresist pattern RP5 (that is, slightly larger than the trench TR1 where the deep device isolation region ST2 is scheduled to be formed). With this, the sidewall of the opening of the photoresist pattern RP5 can be disposed on the insulating film L3. The reason for this is that even if the position of the opening of the photoresist pattern RP6 is somewhat shifted due to misalignment in lithography, the end of the insulating film L3 as a hard mask can function as an open end of an etching mask, and therefore misalignment is solved when formation of a trench TR2, which will be described further below, is completed. With this, misalignment in lithography at the time of forming the photoresist pattern RP6 can be permitted to some extent. For this reason, for formation of the photoresist pattern RP6, a photolithography process with accuracy lower than that of a photolithography at the time of forming the photoresist pattern RP5 can be used, it is not required to form a layer that is difficult for etching, such as BARC (antireflective film), and the occurrence of trouble due to residual BARC can be prevented. Also, since the photoresist pattern RP6 may have accuracy lower than that of the photoresist pattern RP5, the manufacturing cost can be advantageously reduced.

Figure 73:
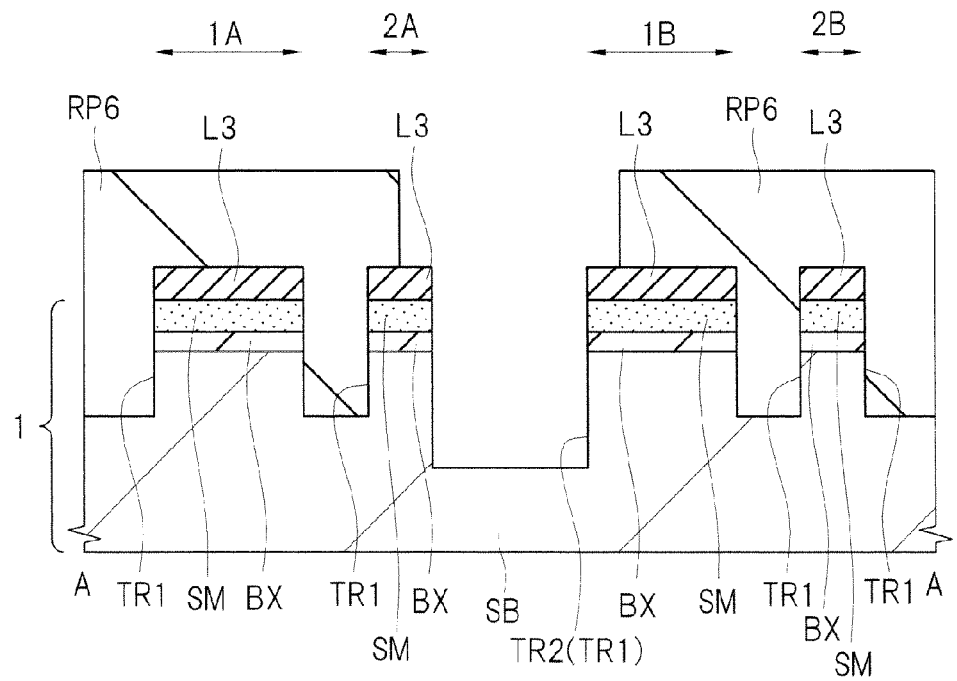
FIG. 73 is a cross-sectional view of main parts of the semiconductor device in the manufacturing process continued from FIG. 72.

Next, as illustrated in FIG. 73, the semiconductor substrate SB on the bottom part of the trench TR1 exposed from the photoresist pattern RP6 is etched to make the depth of the trench TR deeper. With this, the trench TR exposed from the photoresist pattern RP6 becomes a deep TR2. Here, the trench TR1 covered with the photoresist pattern RP6 is not etched, the depth is not changed. For this reason, the depth of the trench TR2 is deeper than the depth of the trench TR1 covered with the photoresist pattern RP6.

Figure 74:
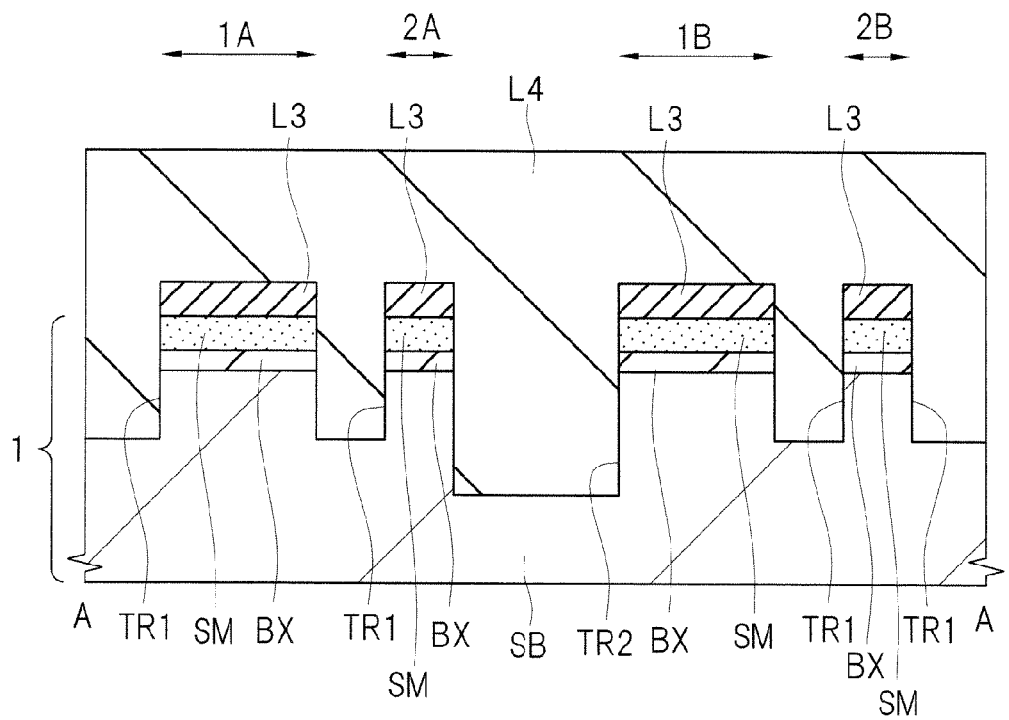
FIG. 74 is a cross-sectional view of main arts of the semiconductor device in the manufacturing process continued from FIG. 73.

Next, after the photoresist pattern RP6 is removed, an insulating film L4 for the device isolation region ST is formed on the main surface of the SOI substrate 1 so as to fill the trenches TR1 and TR2, as illustrated in FIG. 74. The insulating film L4 is formed of a silicon oxide film or the like, and can be formed by using CDV or the like. Before the insulating film L4 is formed, a thin thermal oxide film can be formed on the side surfaces and the bottom surfaces of the trenches TR1 and TR2.

Figure 75:
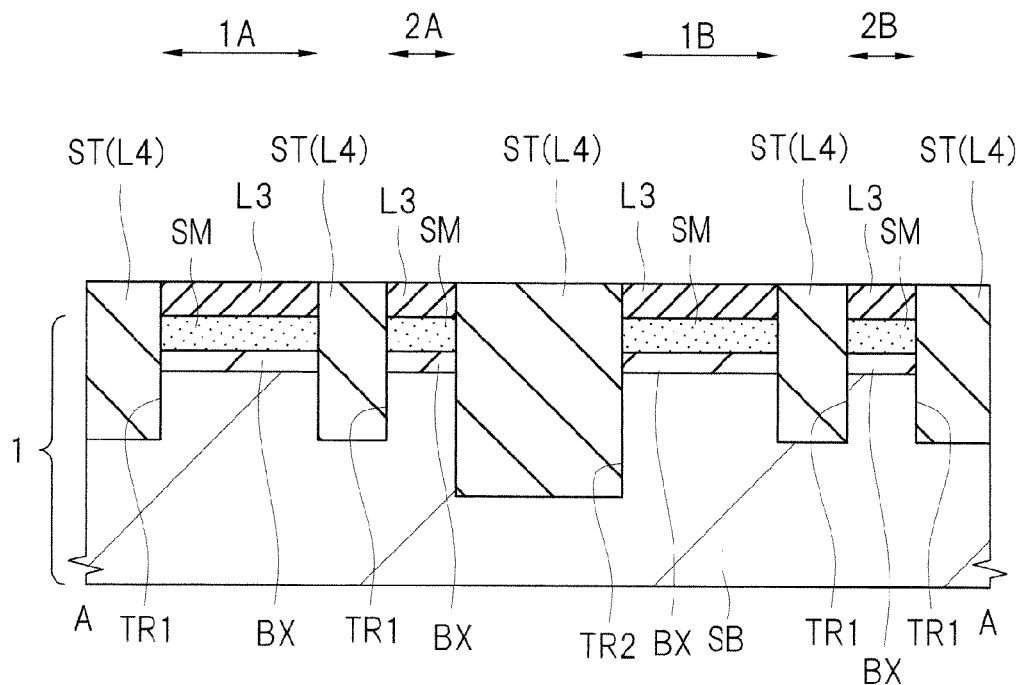
FIG. 75 is a cross-sectional view of main parts of the semiconductor device in the manufacturing process continued from FIG. 74.

Next, as illustrated in FIG. 75, the insulating film L4 outside the trenches TR1 and TR2 are removed by using CMP or the like to bury the insulating layer L4 in the trenches TR1 and TR2. Here, the CMP process is performed until the front surface of the insulating film L3 is exposed. However, in practice, the insulating film L3 is somewhat polished, and therefore the thickness of the insulating film L3 becomes thinner.

Figure 76:
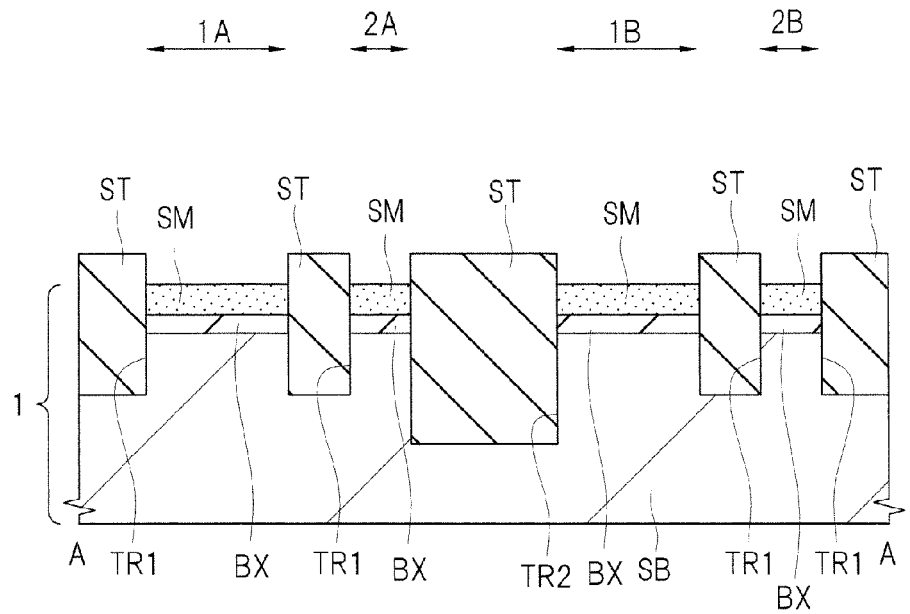
FIG. 76 is a cross-sectional view of main parts of the semiconductor device in the manufacturing process continued from FIG. 75.

Next, as illustrated in FIG. 76, the insulating film L3 is removed. The insulating film L3 can be removed by wet etching or the like. When the insulating film L3 is a silicon nitride film, the insulating film L3 can be removed by using heat phosphoric acid solution or the like.

Figure 77:
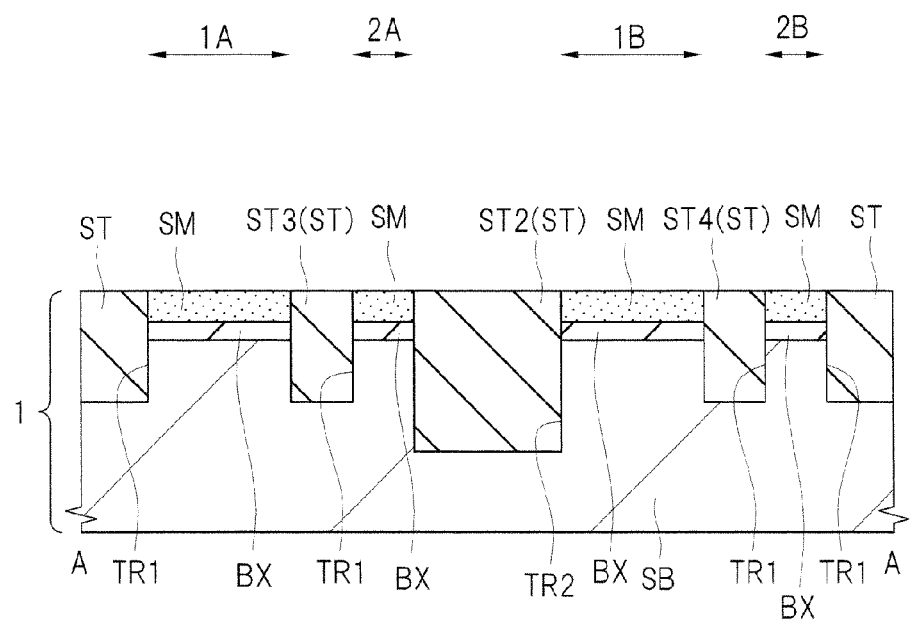
FIG. 77 is a cross-sectional view of main parts of the semiconductor device in the manufacturing process continued from FIG. 76.
Figure 78:
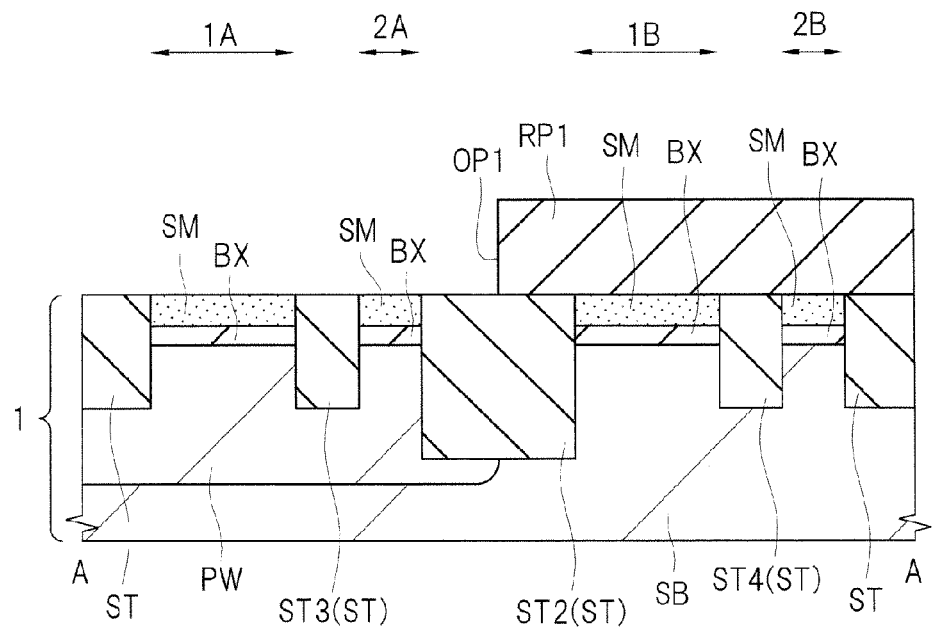
FIG. 78 is a cross-sectional view of main parts of the semiconductor device in the manufacturing process continued from FIG. 68 and FIG. 69.

Next, as illustrated in FIG. 77 (FIG. 77 corresponds to FIG. 69), to decrease the difference in height between the upper surface of the semiconductor layer SM and the upper surface of the device isolation region ST, the exposed surface of the device isolation region ST is etched as required to decrease the height (height position of the upper surface) of the device isolation region ST. This can be performed by, for example, wet etching using hydrofluoric acid.

Here, the process of removing the insulating film L3 corresponding to FIG. 76 and the process of reducing the height of the device isolation region ST corresponding to FIG. 77 may be performed in this order or in a reversed order. In a wet process in the process of removing the insulating film L3 and the process of decreasing the height of the device isolation region ST, the front surface of the SOI substrate 1 and the insulating layer BX adjacent to the device isolation region ST are prevented from having roughness, damage, or inconvenient shape.

In this manner, the device isolation region ST as illustrated in FIG. 68 and FIG. 69 can be formed. Since the deep device isolation region ST2 is buried in the deep trench TR2, the depth of the deep device isolation region ST2 is deeper than the depth of the device isolation region ST buried in the trench TR1.

After the device isolation region ST is formed in the above-described manner, the photoresist pattern RP1 is formed on the main surface of the SOI substrate 1 as a mask layer by using photolithography.

The photoresist pattern RP1 for use in the third embodiment is similar to the photoresist pattern RP1 used in the first embodiment. Thus, the photoresist pattern RP1 for use in the third embodiment has the opening OP1 as described in the first embodiment.

Next, by using the photoresist pattern RP1 as a mask (ion implantation blocking mask), p-type impurities (for example, boron) are ion-implanted in the semiconductor substrate SB of the SOI substrate 1, thereby forming the p-type well PW in the semiconductor substrate SB. The p-type well PW is formed so as to be aligned with the opening OP1 of the photoresist pattern RP1.

The p-type well PW forming process of the third embodiment is similar to that of the first embodiment. Thus, the range where the p-type well PW is formed in the third embodiment is similar to that of the first embodiment, including the depth (depth position of the bottom surface). However, in the third embodiment, the deep device isolation region ST2 is formed. The depth (depth position of the bottom surface) of the p-type well PW can be made deeper than the bottom surface of the deep device isolation region ST2.

Figure 79:
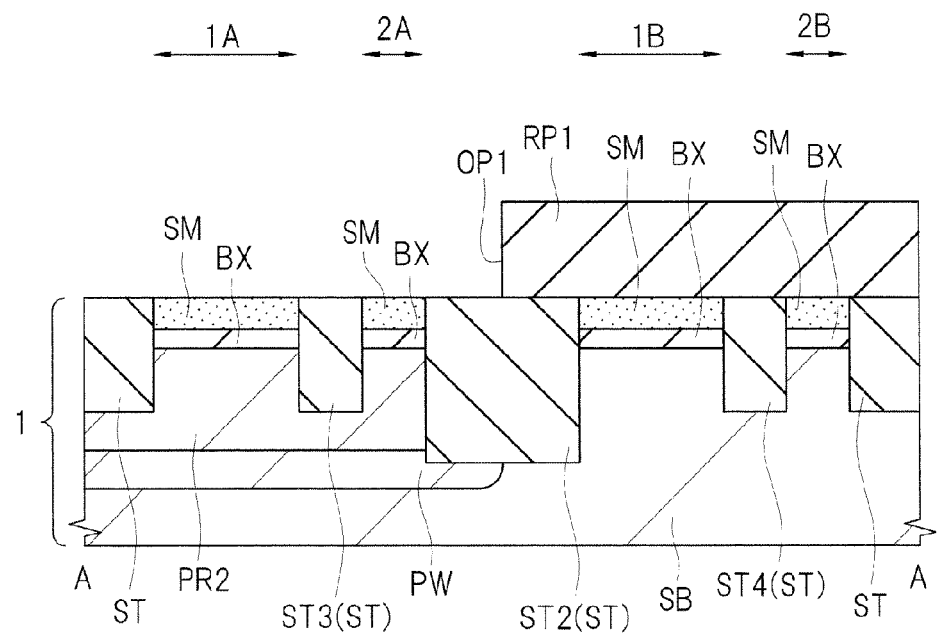
FIG. 79 is a cross-sectional view of main parts of the semiconductor device in the manufacturing process continued from FIG. 78.

Next, as illustrated in FIG. 79, by using the photoresist pattern RP1 as a mask (ion implantation blocking mask), p-type impurities (for example, boron) are ion-implanted in the semiconductor substrate SB of the SOI substrate 1, thereby forming the p-type semiconductor region PR2. Since the p-type semiconductor region PR2 is formed by using the photoresist pattern RP1 used for forming the p-type well PW, as with the p-type well PW, the p-type semiconductor region PR2 is formed in the semiconductor substrate SB so as to include the nMIS formation region 1A and the power feeding region 2A when seen in a plan view. When the p-type well PW and the p-type semiconductor region PR2 are formed, the p-type well PW extends to under the p-type semiconductor region PR2.

However, in the third embodiment, the p-type semiconductor region PR2 is formed so as to be shallower than the deep device isolation region ST2 buried in the trench TR2 and formed so as to be deeper than the device isolation region ST buried in the trench TR1. That is, the p-type semiconductor region PR2 is formed so as to be shallower than the device isolation region ST2 and formed so as to be deeper than the device isolation region ST3. By forming the p-type semiconductor region PR2 deeper than the device isolation region ST3, the bottom surface of the p-type semiconductor region PR2 is at a deeper level than the bottom surface of the device isolation region ST3, which is the portion interposed between the nMIS formation region 1A and the power feeding region 2A when seen in a plan view. The p-type semiconductor region PR2 extends to also under the device isolation region ST3. Furthermore, by forming the p-type semiconductor region PR2 shallower than the device isolation region ST2, the p-type semiconductor region PR2 is not formed under the device isolation region ST2.

Figure 80:
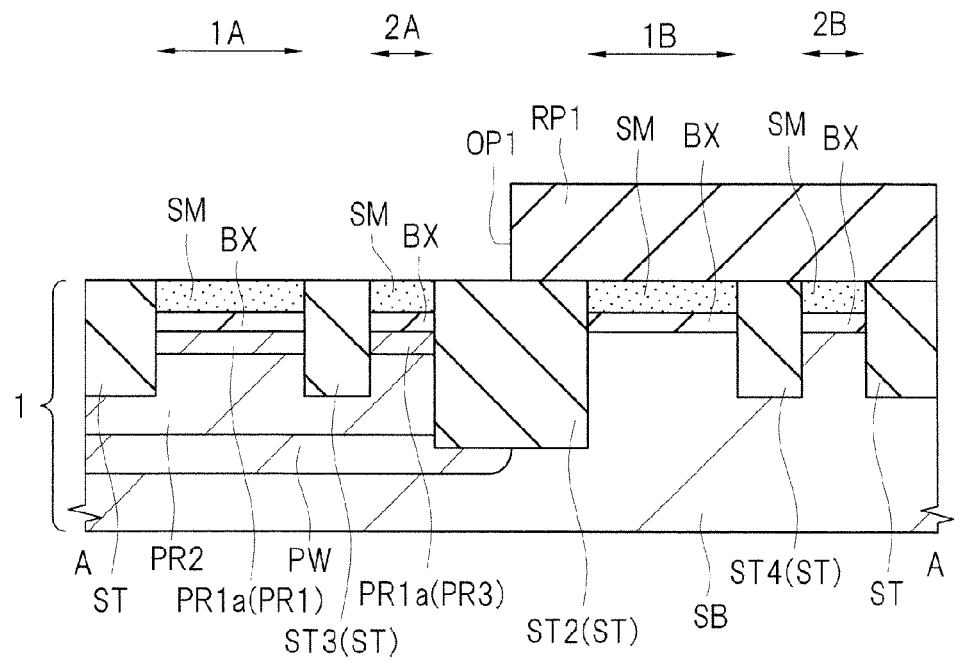
FIG. 80 is a cross-sectional view of main parts of the semiconductor device in the manufacturing process continued from FIG. 79.

Next, as illustrated in FIG. 80, by using the photoresist pattern RP1 as a mask (ion implantation blocking mask), p-type impurities (for example, boron) are ion-implanted in the semiconductor substrate SB of the SOI substrate 1, thereby forming the p-type semiconductor region PR1a. Then, the photoresist pattern RP1 is removed.

The p-type semiconductor region PR1a forming process of the third embodiment is similar to that of the first embodiment, except for using not the photoresist pattern RP3 but the photoresist pattern RP1. The p-type semiconductor region PR1*a* is formed so as to be shallower than the device isolation region ST buried in the trench TR1. That is, the p-type semiconductor region PR1*a* is formed so as to be shallower than the device isolation region ST3. For this reason, the range where the p-type semiconductor region PR1*a* is formed in the third embodiment is similar to that of the first embodiment, including the depth (depth position of the bottom surface). The p-type semiconductor region PR1*a* formed on the semiconductor substrate SB in the nMIS formation region 1A is the p-type semiconductor region PR1, and the p-type semiconductor region PR1*a* formed on the semiconductor substrate SB in the power feeding region 2A is the p-type semiconductor region PR3.

Figure 81:
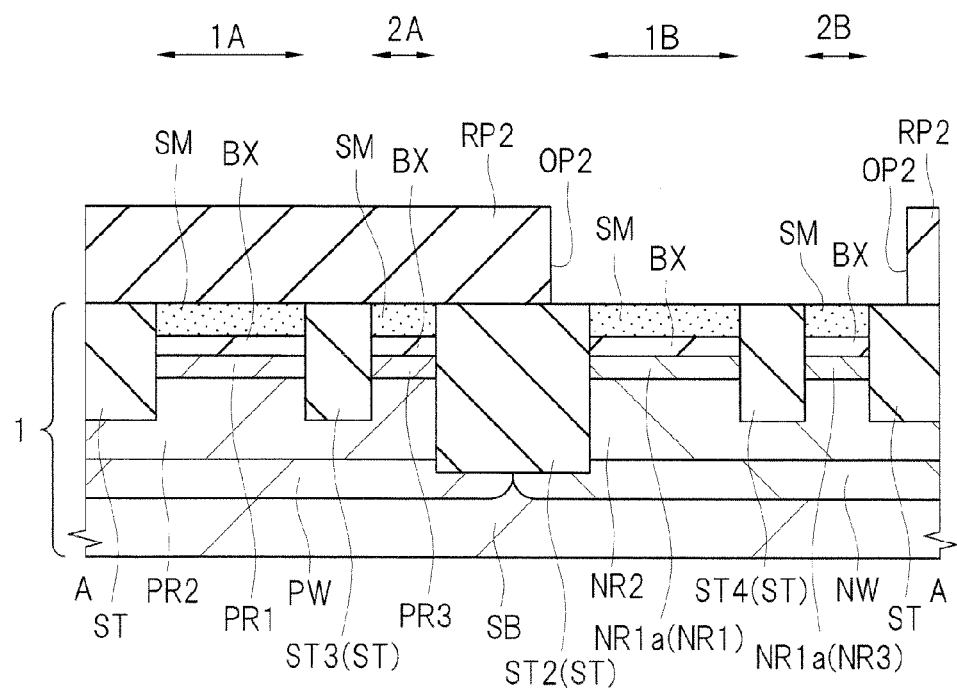
FIG. 81 is a cross-sectional view of main parts of the semiconductor device in the manufacturing process continued from FIG. 80.

Next, as illustrated in FIG. 81, the photoresist pattern RP2 is formed on the main surface of the SOI substrate 1 as a mask layer by using photolithography.

The photoresist pattern RP2 for use in the third embodiment is similar to the photoresist pattern RP2 used in the first embodiment. Thus, the photoresist pattern RP2 for use in the third embodiment has the opening OP2 as described in the first embodiment.

Next, by using the photoresist pattern RP2 as a mask (ion implantation blocking mask), n-type impurities (for example, phosphorous or arsenic) are ion-implanted in the semiconductor substrate SB of the SOI substrate 1, thereby forming the n-type well NW in the semiconductor substrate SB. The n-type well NW is formed so as to be aligned with the opening OP2 of the photoresist pattern RP2. Then, by using the photoresist pattern RP2 as a mask (ion implantation blocking mask), n-type impurities (for example, phosphorous or arsenic) are ion-implanted in the semiconductor substrate SB of the SOI substrate 1, thereby forming the n-type semiconductor region NR2. Then, by using the photoresist pattern RP2 as a mask (ion implantation blocking mask), n-type impurities (for example, phosphorous or arsenic) are ion-implanted in the semiconductor substrate SB of the SOI substrate 1, thereby forming the n-type semiconductor region NR1*a*. With this, the structure illustrated in FIG. 81 is obtained. Then, the photoresist pattern RP2 is removed.

The n-type well NW forming process of the third embodiment is similar to that of the first embodiment. Thus, the range where the n-type well NW is formed in the third embodiment is similar to that of the first embodiment, including the depth (depth position of the bottom surface). However, in the third embodiment, the deep device isolation region ST2 is formed. The depth (depth position of the bottom surface) of the n-type well NW can be made deeper than the bottom surface of the deep device isolation region ST2.

Also, the n-type semiconductor region NR2 is formed by using the photoresist pattern RP2 used for forming the n-type well NW, as with the n-type well NW, the n-type semiconductor region NR2 is also formed in the semiconductor substrate SB so as to include the pMIS formation region 1B and the power feeding region 2B when seen in a plan view. When the n-type well NW and the n-type semiconductor region NR2 are formed, the n-type well NW extends to under the n-type semiconductor region NR2.

However, in the third embodiment, the n-type semiconductor region NR2 is formed so as to be shallower than the deep device isolation region ST2 buried in the trench TR2 and deeper than the device isolation region ST buried in the trench TR1. That is, the n-type semiconductor region NR2 is formed so as to be shallower than the device isolation region ST2 and deeper than the device isolation region ST4. By forming the n-type semiconductor region NR2 so as to be deeper than the device isolation region ST4, the bottom surface of the n-type semiconductor region NR2 is at a deeper level than the bottom surface of the device isolation region ST4, which is the portion interposed between the pMIS formation region 1B and the power feeding region 2B when seen in a plan view. The n-type semiconductor region NR2 extends to also under the device isolation region ST4. Furthermore, by forming the n-type semiconductor region NR2 so as to be shallower than the device isolation region ST2, the n-type semiconductor region NR2 is not formed under the device isolation region ST2.

The n-type semiconductor region NR1*a* formation process in the third embodiment is similar to that of the first embodiment except that the photoresist pattern RP2 is used in place of the photoresist pattern RP4. The n-type semiconductor region NR1*a* is formed so as to be shallower than the device isolation region ST buried in the trench TR1. That is, the n-type semiconductor region NR1*a* is formed so as to be shallower than the device isolation region ST4. For this reason, the range where n-type semiconductor region NR1*a* is formed in the third embodiment is similar to that of the first embodiment, including the depth (depth position of the bottom surface). The n-type semiconductor region NR1*a* formed in the semiconductor substrate SB of in the pMIS formation region 1B is the n-type semiconductor region NR1, and the n-type semiconductor region NR1*a* formed in the semiconductor substrate SB in the power feeding region 2B is the n-type semiconductor region NR3.

Here, the case has been described in which the p-type well PW, the p-type semiconductor region PR2, and the p-type semiconductor region PR1*a* are formed first and then the n-type well NW, the n-type semiconductor region NR2, and the n-type semiconductor region NR1*a* are formed. In another mode, the p-type well PW, the p-type semiconductor region PR2, the p-type semiconductor region PR1*a* may be formed after the n-type well NW, the n-type semiconductor region NR2, and the n-type semiconductor region NR1*a* is formed.

The subsequent processes in the third embodiment are similar to those in the first embodiment. That is, steps S9 to S16 are performed in a manner similar to that of the first embodiment. As described in the first embodiment, also in the third embodiment, after the device isolation region ST is formed at step S2, step S9 may be performed, and then the p-type well PW, the n-type well NW the p-type semiconductor region PR2, the p-type semiconductor region PR1*a*, the n-type semiconductor region NR2, and the n-type semiconductor region NR1*a* may be formed by ion implantation.

In the third embodiment, the device isolation region ST2 deeper than the p-type semiconductor region PR2 and the n-type semiconductor region NR2 is disposed between the p-type semiconductor region PR2 and the n-type semiconductor region NR2. Therefore, even if the p-type well PW and the n-type well NW are adjacent to each other between and under the p-type semiconductor region PR2 and the n-type semiconductor region NR2, the p-type semiconductor region PR2 and the n-type semiconductor region NR2 are prevented from being in contact with each other. For this reason, even if the impurity concentrations of the p-type semiconductor region PR2 and the n-type semiconductor region NR2 are increased, a pn junction is not formed between the p-type semiconductor region PR2 and the n-type semiconductor region NR2. Therefore, a pn junction with low withstand voltage, such as a pn junction between the p-type semiconductor region PR2 and the n-type semiconductor region NR2, can be prevented from being formed. For this reason, reliability of the semiconductor device can be improved and, in turn, the performance of the semiconductor device can be improved.

Furthermore, in the third embodiment, the p-type well PW, the p-type semiconductor region PR2, and the p-type semiconductor region PR1a (PR1 and PR3) can be formed by using the same mask layer (here, the photoresist pattern RP1). Also, the n-type well NW, the n-type semiconductor region NR2, and the n-type semiconductor region NR1a (NR1 and NR3) can be formed by using the same mask layer (here, the photoresist pattern RP2). With this, the number of processes in photolithography associated with ion implantation can be reduced. Furthermore, the number of photomasks required for use in exposing the photoresist layer can be reduced.

On the other hand, in the first and second embodiments, since the depth of the device isolation region ST can be made approximately uniform, the process of forming the device isolation region ST can be simplified, and the number of processes and time required for forming the device isolation region ST can be reduced.

Figure 82:
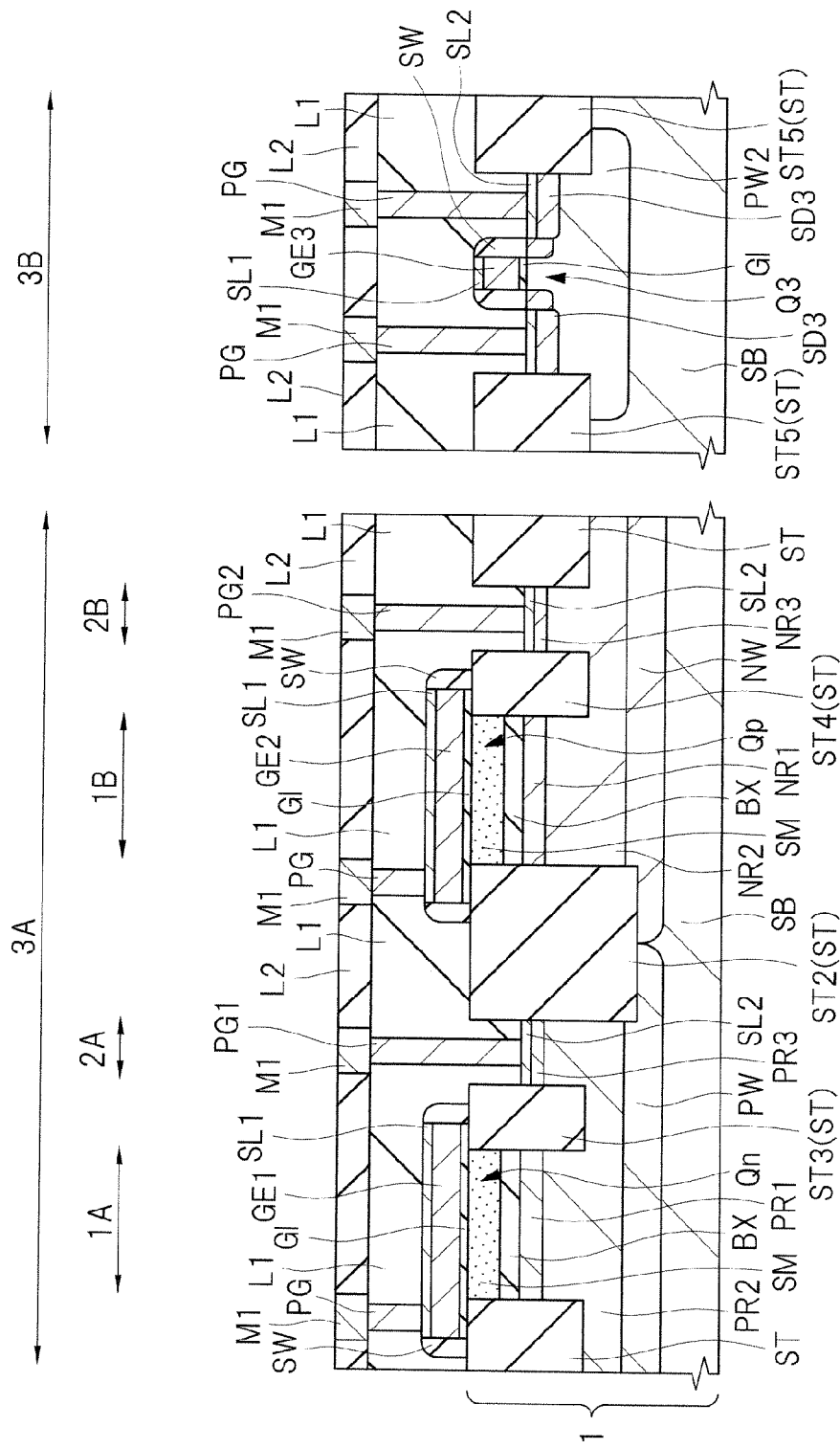
FIG. 82 is a cross-sectional view of another aspect of the semiconductor device of FIG. 67.

FIG. 82 is a cross-sectional view of main parts of another mode of the semiconductor device of the third embodiment, illustrating the case in which, in the SOI substrate 1, a semiconductor element such as a MISFET (in FIG. 82, a MISFET Q3) is formed on the semiconductor substrate SB in a region with the semiconductor layer SM and the insulating layer BX removed therefrom (a bulk region 3B).

As illustrated in FIG. 82, the SOI substrate 1 has an SOI region 3A and a bulk region 3B. The SOI region 3A is a region where a semiconductor element such as a MISFET is formed in the semiconductor layer SM of the SOI substrate 1. The bulk region 3B is a region where the semiconductor layer SM and the insulating layer BX of the SOI substrate 1 are removed and a semiconductor element such as a MISFET is formed in the semiconductor substrate SB of the SOI substrate 1. The semiconductor substrate SB in the SOI region 3A and the semiconductor substrate SB in the bulk region 3B are the same semiconductor substrate.

The SOI region 3A includes the nMIS formation region 1A, the pMIS formation region 1B, and the power feeding regions 2A and 2B. In the power feeding regions 2A and 2B, the semiconductor layer SM and the insulating layer BX are removed. In a region where a semiconductor element is formed, here, in each of the nMIS formation region 1A and the pMIS formation region 1B, the semiconductor layer SM is left, and a MISFET is formed in that semiconductor layer. The structure of the SOI region 3A illustrated in FIG. 82 is similar to the structure of FIG. 67, and therefore is not repeatedly described herein.

In the bulk region 3B, the semiconductor layer SM and the insulating layer BX are removed. Removing the semiconductor layer SM and the insulating layer BX from the bulk region 3B can be performed in the process of removing the semiconductor layer SM and the insulating layer BX from each of the power feeding regions 2A and 2B (corresponding to step S9). In the semiconductor substrate SB in the bulk region 3B, a device isolation region ST5 is buried. In the device isolation region ST formed in the SOI substrate 1, the device isolation region ST5 is the device isolation region ST left as being buried in the semiconductor substrate SB in the bulk region 3B after the semiconductor layer SM and the insulating layer BX in the bulk region 3B are removed.

In an active region (region surrounded by the device isolation region ST3 for partitioning) of the semiconductor substrate SB in the bulk region 3B, a semiconductor element such as a MISFET is formed. In FIG. 82, by way of example, the MISFET Q3 is formed. That is, a well region PW2 is formed in the semiconductor substrate Sb in the bulk region 3B, and a gate electrode GE3 of the MISFET Q3 is formed on the well region PW2 via the gate insulating film GI. In the well region PW2, a source-drain region SD3 of the MISFET Q3 is formed. The source-drain region SD3 has an LDD structure. On the sidewall of the gate electrode GE3, the sidewall spacer SW is formed. On a portion of the upper surface of the source-drain region SD3 not covered with the sidewall spacer SW, the metal silicide layer SL2 is formed. When the MISFET Q3 is an n-channel-type MISFET, the well region PW2 is a p-type well, and the source-drain region SD3 is an n-type semiconductor region. When the MISFET Q3 is a p-channel-type MISFET, the well region PW2 is an n-type well, and the source-drain region SD3 is a p-type semiconductor region. When a MISFET (here, MISFETs Qn and Qp) is formed in the SOI region 3A, the MISFET Q3 can be formed in the bulk region 3B. In the bulk region 3B, the insulating film L1 is formed so as to cover the gate electrode GE3, the plug PG is buried in the insulating film L1, and the insulating film L2 and the wiring M1 buried in the insulating film L2 are formed on the insulating film L1 where the plug PG is buried.

In the third embodiment, part of the device isolation region ST provided in the SOI region 3A is the deep device isolation region ST2 as described above. On the other hand, in the bulk region 3B, the deep device isolation region ST2 is not provided. That is, the device isolation region ST5 provided in the bulk region 3B is configured of not the device isolation region ST2 buried in the trench TR2 but the device isolation region ST buried in the trench TR1.

For this reason, in the third embodiment, also as illustrated in FIG. 82, the depth (depth position of the bottom surface) of the portion of the device isolation region ST interposed between the p-type semiconductor region PR2 and the n-type semiconductor region NR2, that is, the device isolation region ST2, is deeper than the depth (depth position of the bottom surface) of the device isolation region ST5 provided in the bulk region 3B. In addition, the depth (depth position of the bottom surface) of the device isolation region ST3, which is the portion interposed between the nMIS formation region 1A and the power feeding region 2A when seen in a plan view, and the depth (depth position of the bottom surface) of the device isolation region ST4, which is the portion interposed between the pMIS formation region 1B and the power feeding region 2B when seen in a plan view, are approximately equal to the depth (depth position of the bottom surface) of the device isolation region ST5 provided in the bulk region 3B.

On the other hand, also in the first and second embodiments, the SOI region 3A and the bulk region 3B can be provided in the SOI substrate 1. In this case, the SOI region 3A has a structure similar to that described in the first and second embodiments (the structure of FIG. 2), and the bulk region 3B has a structure similar to that described in the third embodiment (the structure of the bulk region 3B of FIG. 82). In the first and second embodiments, the depth (depth position of the bottom surface) of the device isolation region ST is approximately uniform. Therefore, the depth (depth position of the bottom surface) of the device isolation region ST provided in the SOI region 3A and the depth (depth position of the bottom surface) of the device isolation region ST5 provided in the bulk region 3B are approximately equal to each other.

In the foregoing, the invention made by the inventors of the present invention has been concretely described based on the embodiments. However, it is needless to say that the present invention is not limited to the foregoing embodiments and various modifications and alterations can be made within the scope of the present invention.

What is claimed is:

1. A semiconductor device comprising:
a semiconductor substrate;
a first active region and a second active region formed of a semiconductor layer formed on the semiconductor substrate via an insulating layer, the first active region and the second active region each being surrounded when seen in a plan view by a device isolation region penetrating through the semiconductor layer and the insulating layer;
a first MISFET formed in the first active region;
a second MISFET formed in the second active region;
a first region and a second region each surrounded when seen in a plan view by the device isolation region and having the semiconductor layer and the insulating layer removed therefrom;
a first semiconductor region of a first conductivity type formed in the semiconductor substrate so as to include the first active region and the first region when seen in a plan view;
a second semiconductor region of the first conductivity type formed in the semiconductor substrate so as to include the first active region and the first region when seen in a plan view and having impurity concentration higher than that of the first semiconductor region;
a third semiconductor region of a second conductivity type that is different from the first conductivity type formed in the semiconductor substrate so as to include the second active region and the second region when seen in a plan view; and
a fourth semiconductor region of the second conductivity type formed in the semiconductor substrate so as to include the second active region and the second region when seen in a plan view and having impurity concentration higher than that of the third semiconductor region,
wherein the second semiconductor region is contained in the first semiconductor region,
the second semiconductor region has a bottom surface at a shallower level than a bottom surface of the first semiconductor region and at a deeper level than a bottom surface of a portion of the device isolation region interposed between the first active region and the first region when seen in a plan view,
the second semiconductor region extends to also under the portion of the device isolation region interposed between the first active region and the first region when seen in a plan view,
the fourth semiconductor region is contained in the third semiconductor region,
the fourth semiconductor region has a bottom surface at a shallower level than a bottom surface of the third semiconductor region and at a deeper level than a bottom surface of a portion of the device isolation region interposed between the second active region and the second region when seen in a plan view, and
the fourth semiconductor region extends to also under the portion of the device isolation region interposed between the second active region and the second region when seen in a plan view.

2. The semiconductor device according to claim 1,
wherein the first semiconductor region and the third semiconductor region are adjacent to each other under the device isolation region,
the second semiconductor region is not in contact with any of the third semiconductor region and the fourth semiconductor region, and
the fourth semiconductor region is not in contact with any of the first semiconductor region and the second semiconductor region.

3. The semiconductor device according to claim 2, further comprising:
a fifth semiconductor region of the first conductivity type formed in the semiconductor substrate so as to face the first active region via the insulating layer and formed so as to be at a shallower level than the bottom surface of the device isolation region and the bottom surface of the second semiconductor region; and
a sixth semiconductor region of the second conductivity type formed in the semiconductor substrate so as to face the second active region via the insulating layer and formed so as to be at a shallower level than the bottom surface of the device isolation region and the bottom surface of the fourth semiconductor region,
wherein the fifth semiconductor region has impurity concentration higher than that of the second semiconductor region,
the fifth semiconductor region has a bottom surface being adjacent to the second semiconductor region,
the sixth semiconductor region has impurity concentration higher than that of the fourth semiconductor region, and
the sixth semiconductor region has a bottom surface being adjacent to the fourth semiconductor region.

4. The semiconductor device according to claim 3,
wherein the first MISFET has a first gate electrode fouled on the first active region via a first gate insulating film, and
the second MISFET has a second gate electrode formed on the second active region via a second gate insulating film.

5. The semiconductor device according to claim 4,
wherein a first plug that is conductive is disposed on the semiconductor substrate in the first region, and
a second plug that is conductive is disposed on the semiconductor substrate in the second region.

6. The semiconductor device according to claim 5,
wherein a voltage for controlling a threshold voltage of the first MISFET is supplied from the first plug via the second semiconductor region to the fifth semiconductor region, and
a voltage for controlling a threshold voltage of the second MISFET is supplied from the second plug via the fourth semiconductor region to the sixth semiconductor region.

7. The semiconductor device according to claim 1,
wherein the bottom surface of the first semiconductor region is at a deeper level than the bottom surface of the device isolation region, and
the bottom surface of the third semiconductor region is at a deeper level than the bottom surface of the device isolation region.

8. The semiconductor device according to claim 1,
wherein the first MISFET is an n-channel-type MISFET,
the second MISFET is a p-channel-type MISFET,
the first conductivity type is p-type, and
the second conductivity type is n-type.

9. The semiconductor device according to claim 1,
wherein the second semiconductor region and the fourth semiconductor region are separated from each other by a portion of the device isolation region interposed between the second semiconductor region and the fourth semiconductor region, and
the portion of the device isolation region interposed between the second semiconductor region and the fourth semiconductor region has a bottom surface at a deeper level than the bottom surface of the second semiconductor region and the bottom surface of the fourth semiconductor region, at a deeper level than the bottom surface of the portion of the device isolation region interposed between the first active region and the first region in the plan view, and at a deeper level than the bottom surface of the portion of the device isolation region interposed between the second active region and the second region in the plan view.

10. A semiconductor device comprising:
a semiconductor substrate;
a first active region and a second active region formed of a semiconductor layer formed on the semiconductor substrate via an insulating layer, the first active region and the second active region each being surrounded when seen in a plan view by a device isolation region penetrating through the semiconductor layer and the insulating layer;
a first MISFET formed in the first active region;
a second MISFET formed in the second active region;
a first region and a second region each surrounded when seen in a plan view by the device isolation region and having the semiconductor layer and the insulating layer removed therefrom;
a first semiconductor region of a first conductivity type formed in the semiconductor substrate so as to include the first active region and the first region when seen in a plan view;
a second semiconductor region of the first conductivity type formed in the semiconductor substrate so as to include the first active region and the first region when seen in a plan view and having impurity concentration higher than that of the first semiconductor region;
a third semiconductor region of a second conductivity type that is different from the first conductivity type formed in the semiconductor substrate so as to include the second active region and the second region when seen in a plan view; and
a fourth semiconductor region of the second conductivity type formed in the semiconductor substrate so as to include the second active region and the second region when seen in a plan view and having impurity concentration higher than that of the third semiconductor region,
wherein the first semiconductor region extends to under the second semiconductor region,
the second semiconductor region has a bottom surface at a shallower level than a bottom surface of the first semiconductor region and at a deeper level than a bottom surface of a portion of the device isolation region interposed between the first active region and the first region when seen in a plan view,
the second semiconductor region extends to also under the portion of the device isolation region interposed between the first active region and the first region when seen in a plan view,
the third semiconductor region extends to under the fourth semiconductor region,
the fourth semiconductor region has a bottom surface at a shallower level than a bottom surface of the third semiconductor region and at a deeper level than a bottom surface of a portion of the device isolation region interposed between the second active region and the second region when seen in a plan view,
the fourth semiconductor region extends to also under the portion of the device isolation region interposed between the second active region and the second region when seen in a plan view,
the second semiconductor region and the fourth semiconductor region are separated from each other by a portion of the device isolation region interposed between the second semiconductor region and the fourth semiconductor region, and
the portion of the device isolation region interposed between the second semiconductor region and the fourth semiconductor region has a bottom surface at a deeper level than the bottom surface of the second semiconductor region and the bottom surface of the fourth semiconductor region, at a deeper level than the bottom surface of the portion of the device isolation region interposed between the first active region and the first region when seen in a plan view, and at a deeper level than the bottom surface of the portion of the device isolation region interposed between the second active region and the second region when seen in a plan view.

11. The semiconductor device according to claim 10,
wherein the first semiconductor region and the third semiconductor region are adjacent to each other under the device isolation region,
the second semiconductor region is not in contact with any of the third semiconductor region and the fourth semiconductor region, and
the fourth semiconductor region is not in contact with any of the first semiconductor region and the second semiconductor region.

12. A semiconductor device manufacturing method comprising the steps of:
(a) preparing a substrate, the substrate including a semiconductor substrate that has a first region, a second region, a third region, and a fourth region on a main surface of the semiconductor substrate, an insulating layer formed on the main surface of the semiconductor substrate, and a semiconductor layer formed on the insulating layer;
(b) forming, on the substrate, a device isolation region penetrating through the semiconductor layer and the insulating layer so that the first region, the second region, the third region, and the fourth region are each surrounded by the device isolation region when seen in a plan view;
(c) after the step (b), forming a first semiconductor region of a first conductivity type in the semiconductor substrate so as to include the first region and the third region when seen in a plan view;
(d) after the step (b), forming a second semiconductor region of the first conductivity type in the semiconductor substrate so as to include the first region and the third region when seen in a plan view;
(e) after the step (b), forming a third semiconductor region of a second conductivity type that is opposite to the first conductivity type in the semiconductor substrate so as to include the second region and the fourth region when seen in a plan view;
(f) after the step (b), forming a fourth semiconductor region of the second conductivity type in the semiconductor substrate so as to include the second region and the fourth region when seen in a plan view;
(g) after the step (b), removing the semiconductor layer and the insulating layer on the semiconductor substrate in the first region and the second region; and (h) after the steps (b), (c), (d), (e), (f), and (g), forming a first MISFET in the semiconductor layer that is remaining via the insulating layer on the semiconductor substrate in the third region and forming a second MISFET in the semiconductor layer that is remaining via the insulating layer on the semiconductor substrate in the fourth region, wherein the second semiconductor region has impurity concentration higher than that of the first semiconductor region, is contained in the first semiconductor region, and is shallower than the first semiconductor region, the fourth semiconductor region has impurity concentration higher than impurity concentration of the third semiconductor region, is contained in the third semiconductor region, and is shallower than the third semiconductor region, the second semiconductor region has a bottom surface at a deeper level than a bottom surface of a portion of the device isolation region interposed between the first region and the third region when seen in a plan view, the second semiconductor region extends to also under a portion of the device isolation region interposed between the first region and the third region when seen in a plan view, the fourth semiconductor region has a bottom surface at a deeper level than a bottom surface of a portion of the device isolation region interposed between the second region and the fourth region when seen in a plan view, and the fourth semiconductor region extends to also under a portion of the device isolation region interposed between the second region and the fourth region when seen in a plan view.

13. The semiconductor device manufacturing method according to claim 12,
wherein the first semiconductor region and the third semiconductor region are adjacent to each other under the device isolation region.

14. The semiconductor device manufacturing method according to claim 13, further comprising:
(i) after the step (b) and before the step (g), forming a fifth semiconductor region of the first conductivity type in the semiconductor substrate in the third region; and
(j) after the step (b) and before the step (g), forming a sixth semiconductor region of the second conductivity type in the semiconductor substrate in the fourth region,
wherein the fifth semiconductor region has impurity concentration higher than that of the second semiconductor region, and is formed at a shallower level than the bottom surface of the device isolation region and the bottom surface of the second semiconductor region, and
the sixth semiconductor region has impurity concentration higher than that of the fourth semiconductor region, and is formed at a shallower level than the bottom surface of the device isolation region and the bottom surface of the fourth semiconductor region.

15. The semiconductor device manufacturing method according to claim 14,
wherein, in the step (c), the first semiconductor region is formed by ion implantation,
in the step (d), the second semiconductor region is formed by ion implantation,
in the step (e), the third semiconductor region is formed by ion implantation,
in the step (f), the fourth semiconductor region is formed by ion implantation,
in the step (i), the fifth semiconductor region is formed by ion implantation,
in the step (j), the sixth semiconductor region is formed by ion implantation,
in the step (d) and the step (i), a first common mask layer formed on the substrate is used as an ion implantation blocking mask, and
in the step (f) and the step (j), a second common mask layer formed on the substrate is used as an ion implantation blocking mask.

16. The semiconductor device manufacturing method according to claim 14, wherein
in the step (c), the first semiconductor region is formed by ion implantation,
in the step (d), the second semiconductor region is formed by ion implantation,
in the step (e), the third semiconductor region is formed by ion implantation,
in the step (f), the fourth semiconductor region is formed by ion implantation,
in the step (i), the fifth semiconductor region is formed by ion implantation,
in the step (j), the sixth semiconductor region is formed by ion implantation, and,
in the step (c) and the step (e), angled ion implantation is used.

17. The semiconductor device manufacturing method according to claim 16,
wherein in the steps (c), the step (d), and the step (i), a first common mask layer on the substrate is used as an ion implantation blocking mask, and,
in the step (e), the step (f), and the step (j), a second common mask layer on the substrate is used as an ion implantation blocking mask.

18. The semiconductor device manufacturing method according to claim 12,
wherein the first MISFET is an n-channel-type MISFET,
the second MISFET is a p-channel-type MISFET,
the first conductivity type is a p-type, and
the second conductivity type is an n-type.

19. The semiconductor device manufacturing method according to claim 12, wherein the second semiconductor region and the fourth semiconductor region are separated from each other by a portion of the device isolation region interposed between the second semiconductor region and the fourth semiconductor region, and
the portion of the device isolation region interposed between the second semiconductor region and the fourth semiconductor region has a bottom surface at a deeper level than the bottom surface of the second semiconductor region and the bottom surface of the fourth semiconductor region, at a deeper level than the bottom surface of the portion of the device isolation region interposed between the first region and the third region in the plan view, and a deeper level than the bottom surface of the portion of the device isolation region interposed between the second region and the fourth region in the plan view.

* * * * *